US008993211B2

(12) United States Patent
Iwato

(10) Patent No.: US 8,993,211 B2
(45) Date of Patent: Mar. 31, 2015

(54) ACTINIC RAY-SENSITIVE OR RADIATION-SENSITIVE RESIN COMPOSITION, AND ACTINIC RAY-SENSITIVE OR RADIATION-SENSITIVE FILM AND PATTERN FORMING METHOD USING THE SAME

(75) Inventor: Kaoru Iwato, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/539,882

(22) Filed: Jul. 2, 2012

(65) Prior Publication Data
US 2013/0020684 A1    Jan. 24, 2013

(30) Foreign Application Priority Data
Jul. 20, 2011  (JP) .................. 2011-159325

(51) Int. Cl.
G03F 7/00      (2006.01)
G03F 7/004     (2006.01)
G03F 7/039     (2006.01)
G03F 7/11      (2006.01)
G03F 7/20      (2006.01)
G03F 7/075     (2006.01)

(52) U.S. Cl.
CPC ............ *G03F 7/0045* (2013.01); *G03F 7/0046* (2013.01); *G03F 7/0397* (2013.01); *G03F 7/11* (2013.01); *G03F 7/2041* (2013.01); *G03F 7/0758* (2013.01)
USPC ........................................ 430/270.1; 430/322

(58) Field of Classification Search
None
See application file for complete search history.

(56) References Cited

U.S. PATENT DOCUMENTS

| | | | |
|---|---|---|---|
| 2001/0023050 A1* | 9/2001 | Numata et al. ............. | 430/270.1 |
| 2002/0102491 A1* | 8/2002 | Kodama et al. ............. | 430/270.1 |
| 2004/0038148 A1* | 2/2004 | Ohta et al. .................. | 430/270.1 |
| 2009/0286937 A1 | 11/2009 | Kamabuchi et al. | |
| 2010/0099036 A1* | 4/2010 | Kawamura et al. .............. | 430/30 |
| 2011/0091809 A1* | 4/2011 | Saegusa et al. ............ | 430/270.1 |
| 2011/0217654 A1* | 9/2011 | Yamato et al. ............. | 430/270.1 |

FOREIGN PATENT DOCUMENTS

| | | | |
|---|---|---|---|
| JP | 2009235118 A | * | 10/2009 |
| JP | 2009-301020 A | | 12/2009 |
| JP | 2010039145 A | * | 2/2010 |
| JP | 2010039146 A | | 2/2010 |
| JP | 2010-138330 A | | 6/2010 |
| JP | 2010-224066 A | | 10/2010 |
| JP | 2011116742 A | * | 6/2011 |

(Continued)

OTHER PUBLICATIONS

Machine translation WO 2009/078335. Jun. 25, 2009.*
Machine translation JP 2010-039145. Feb. 18, 2010.*
Machine translation JP 2011-116742. Jun. 16, 2011.*
Machine translation JP 2009-235118. Oct. 15, 2009.*

(Continued)

*Primary Examiner* — Cynthia H Kelly
*Assistant Examiner* — Alyssa L Cepluch
(74) *Attorney, Agent, or Firm* — Sughrue Mion, PLLC

(57) ABSTRACT

The actinic ray-sensitive or radiation-sensitive resin composition according to the present invention includes a resin (A) which contains at least one type of repeating unit which is represented by the general formula (PG1), at least one type of repeating unit which is selected from the repeating units which are represented by the general formula (PG2) and the general formula (PG3), and at least one type of repeating unit which includes a lactone structure, a compound (B) which is a compound which is represented by the general formula (B1) and where the molecular weight of an anion moiety is 200 or less, and a solvent (C).

19 Claims, No Drawings

(56) References Cited

FOREIGN PATENT DOCUMENTS

| WO | WO 2009078335 A1 | * | 6/2009 |
| WO | WO 2010067898 A2 | * | 6/2010 |
| WO | WO 2011125686 A1 | * | 10/2011 |

OTHER PUBLICATIONS

Machine translation WO 2011/125686. Oct. 13, 2011.*
Notice of Reasons for Rejection, dated May 14, 2013, issued in corresponding JP Application No. 2011-159325, 9 pages in English and Japanese.

* cited by examiner

ACTINIC RAY-SENSITIVE OR RADIATION-SENSITIVE RESIN COMPOSITION, AND ACTINIC RAY-SENSITIVE OR RADIATION-SENSITIVE FILM AND PATTERN FORMING METHOD USING THE SAME

BACKGROUND OF THE INVENTION

1. Field of the Invention

The present invention relates to an actinic ray-sensitive or radiation-sensitive resin composition and a manufacturing method for this composition, and an actinic ray-sensitive or radiation-sensitive film and a pattern forming method each using the same. More specifically, the present invention relates to a composition which is able to be applied to processes such as a manufacturing process of a semiconductor such as an IC, a manufacturing process of a circuit substrate such as a liquid crystal or thermal head and photo fabrication lithography processes other than these, a manufacturing method for this composition, and film and pattern forming methods each using the same.

2. Description of the Related Art

Since the development of a resist for KrF excimer lasers (248 nm), a pattern forming method which uses chemical amplification has been used in order to compensate for a reduction in sensitivity due to light absorption of a resist composition. The resist composition of a chemical amplification type typically includes a resin where the solubility with regard to an alkali developing solution by decomposing using the action of an acid is increased and a compound which generates an acid by decomposing due to actinic rays or radiation. Various inventions have been attempted with regard to the resin and the compound in order to respond to increasing microminiaturization in semiconductor elements and the like.

For a further increase in the microminiaturization of semiconductor elements, there has been progress in the shortening of the wavelength of the exposure light source and increasing of the numerical aperture (increasing NA) of projection lenses, and currently, an exposure device is being developed with an ArF excimer laser with a 193 nm wavelength as a light source. As a technique for further increasing the resolving power, a method has been proposed where a liquid (referred to below as an "immersion liquid") with a high refractive index is filled in between a projection lens and a sample (that is, an immersion exposure method) has been proposed.

In order to achieve this, a resist, which is used in a chemical amplification mechanism, for an ArF excimer laser is becoming mainstream, and according to this, various resist compositions which are appropriate for lithography processes which use ArF excimer lasers are being developed (for example, refer to JP2010-138330A, JP2010-224066A, and JP2009-301020A).

However, from the point of view of the total performance as a resist, the search for appropriate combinations of resins, acid generators, basic compounds, additives, solvents, and the like which are used is extremely difficult and there is scope for further improvement.

SUMMARY OF THE INVENTION

For example, as in a case where a pattern is formed as for implantation which accompanies ion injection and the like, further improvement is desired in a higher generation with regard to the performance of the pattern profile, the depth of focus (DOF), and the like in a case where a high reflection substrate is used as it is without a reflection prevention film. Here, depth of focus is the permissible range of focal deviation during exposure.

The present invention has an object of providing an actinic ray-sensitive or radiation-sensitive resin composition which is an actinic ray-sensitive or radiation-sensitive resin composition with superior pattern profile and depth of focus (DOF latitude), is particularly superior in terms of performance in a case of pattern forming using a high reflection substrate as it is without a reflection prevention film, and is appropriate for implantation, and further providing an actinic ray-sensitive or radiation-sensitive film and a pattern forming method each using the same.

The present invention is as described below in one aspect.

[1] An actinic ray-sensitive or radiation-sensitive resin composition including a resin (A) which contains at least one type of repeating unit represented by the general formula (PG1), at least one type of repeating unit selected from the repeating units which are represented by the general formula (PG2) and the general formula (PG3), and at least one type of repeating unit including a lactone structure, a compound (B) represented by the general formula (B1) and wherein the molecular weight of an anion moiety is 200 or less, and a solvent (C).

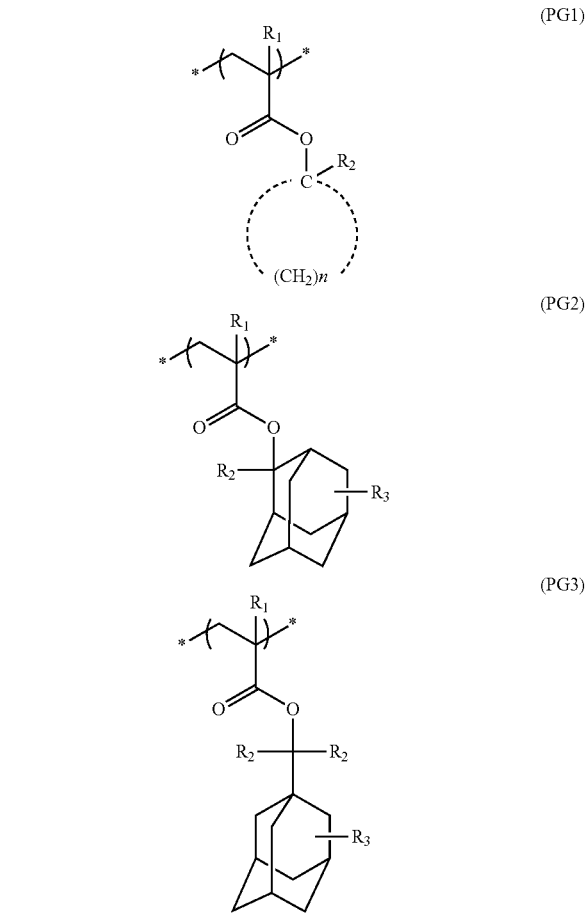

In the general formula (PG1), $R_1$ represents a hydrogen atom or an alkyl group which may have a substituent, $R_2$ represents an alkyl group, and n represents an integer of 4 to 7.

In the general formula (PG2), $R_1$ represents a hydrogen atom or an alkyl group which may have a substituent, $R_2$ represents an alkyl group or a cycloalkyl group, and $R_3$ represents a hydrogen atom or an alkyl group which may have a substituent.

In the general formula (PG3), $R_1$ represents a hydrogen atom or an alkyl group which may have a substituent, $R_2$ each independently represent an alkyl group or a cycloalkyl group, and $R_3$ represents a hydrogen atom or an alkyl group which may have a substituent.

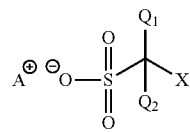

(B1)

In the general formula, $A^+$ represents a sulfonium cation or an iodonium cation.

$Q_1$ and $Q_2$ each independently represent a fluorine atom or $CF_3$.

X represents a substituent which includes at least one carbon atom, and does not contain a fluorine atom or contains two or less fluorine atoms.

[2] The composition described in [1] which further contains a nitrogen-containing compound with the molecular weight of 250 or less.

[3] The composition described in [1] or [2] where the molecular weight of the anion moiety of the compound (B) is 180 or less.

[4] The composition described in any one of [1] to [3] where the compound (B) is represented by the general formula (B2).

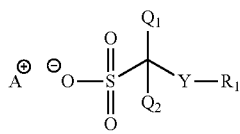

(B2)

In the general formula, $A^+$ represents a sulfonium cation or an iodonium cation.

$Q_1$ and $Q_2$ each independently represent a fluorine atom or $CF_3$.

Y represents an alkylene group which may have a substituent with a fluorine atom, an ether bond, an ester bond, an amide bond, or a combination of two or more thereof.

$R_1$ represents a hydrogen atom or an alkyl group which may have a substituent.

[5] The composition described in any one of [1] to [4] where the total solid concentration in the composition is 6 mass % or more.

[6] The composition described in [1] where n in the general formula (PG1) is 4.

[7] The composition described in [1] where n in the general formula (PG2) is 5.

[8] The composition described in [1] where the repeating unit including the lactone structure, which is contained in the resin (A), is represented by the general formula (III).

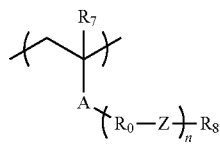

(III)

In general formula (III), A represents an ester bond (a group represented by —COO—) or an amide bond (a group represented by —CONH—)

$R_0$ represents an alkylene group, a cycloalkylene group, or a combination thereof. In a case of a plurality thereof, $R_0$ each independently represent an alkylene group, a cycloalkylene group, or a combination thereof.

Z represents an ether bond, an ester bond, an amide bond, a urethane bond, or a urea bond. In a case of a plurality thereof, Z each independently represent an ether bond, an ester bond, an amide bond, a urethane bond, or a urea bond.

$R_8$ represents a monovalent organic group with a lactone structure.

n represents an integer of 1 to 5 which is the number of repeating structures represented by —$R_0$—Z—.

$R_7$ represents a hydrogen atom, a halogen atom, or an alkyl group.

[9] The composition described in [1] which further contains a low-molecular-weight compound which has a structure represented by the general formula (A), has a group which is desorbed due to the action of an acid, and where the basicity increases due to the desorption.

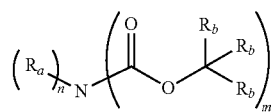

(A)

In the general formula (A), Ra represents a hydrogen atom, an alkyl group, a cycloalkyl group, an aryl group, or an aralkyl group. In a case of a plurality thereof, Ra each independently represent a hydrogen atom, an alkyl group, a cycloalkyl group, an aryl group, or an aralkyl group.

Rb each independently represent a hydrogen atom, an alkyl group, a cycloalkyl group, an aryl group, an aralkyl group, or an alkoxyalkyl group. Here, in —C(Rb)(Rb)(Rb), when one or more Rb are hydrogen atoms, at least one of the remaining Rb is a cyclopropyl group, a 1-alkoxyalkyl group, or an aryl group.

n represents an integer of 0 to 2, m represents an integer of 1 to 3, and n+m=3.

[10] The composition described in [1] where two or more types of the compound (B) are included.

[11] The composition described in [1] which further contains an acid generator other than the compound (B).

[12] The composition described in [1] which further contains a hydrophobic resin having at least any of a fluorine atom and a silicon atom with 0.01 to 10 mass % (in terms of solid content conversion).

[13] The composition described in [12] where the hydrophobic resin has an acid group.

[14] The composition described in [12] where the hydrophobic resin has at least one selected from a group consisting of a group with a lactone structure, an acid anhydride group, and an acid imide group.

[15] The composition described in [12] where the hydrophobic resin has a group which can be decomposed due to the action of an acid.

[16] An actinic ray-sensitive or radiation-sensitive film which is formed using the composition described in any one of [1] to [15].

[17] A pattern forming method including forming a film using the composition described in any one of [1] to [15], exposing the film, and developing the exposed film.

[18] The pattern forming method described in [17] where the exposing is immersion exposure.

[19] A semiconductor device manufacturing method which includes the forming method described in [17].

[20] A semiconductor device which is manufactured according to the manufacturing method described in [19].

DESCRIPTION OF THE PREFERRED EMBODIMENTS

Hereinafter, embodiments of the present invention will be described.

Here, in a group or an atomic group where substituted or unsubstituted is not specified, both a group or an atomic group which do not have a substituent and a group or an atomic group which do have a substituent are included. For example, "an alkyl group" where substituted or unsubstituted is not specified includes not only an alkyl group which has no substituent (unsubstituted alkyl group) but also an alkyl group which has a substituent (substituted alkyl group).

In addition, here, "actinic rays" or "radiation" has the meaning of, for example, a bright line spectrum of a mercury lamp, far ultraviolet rays which are typified by an excimer laser, extreme-ultraviolet rays (EUV light), X-rays, an electron beam (EB), or the like. "Light" has the meaning of actinic rays or radiation. "Exposure" includes not only light irradiation by a mercury lamp, far ultraviolet rays, X-rays, EUV light or the like but the meaning of drawing using a particle beam such as an electron beam or an ion beam.

The actinic ray-sensitive or radiation-sensitive resin composition of the present invention contains (A) a resin which is decomposed due to the action of an acid and where the solubility in an alkali developing solution is increased (referred to below as "acid decomposable resin" or "resin (A)") and (B) a compound which generates acid due to the irradiation of actinic rays or radiation (referred to below as "acid generator" or "compound (B)").

The inventors found that pattern profile and DOF are improved in a case where a pattern is formed using a high reflection substrate as it is without using a reflection preventing film such as particularly in a case where a pattern is formed for implantation by using the resin (A) with a specific configuration as an acid decomposable resin and using the compound (B) with a specific configuration as an acid generator. Here, these effects are not limited to a case of use for implantation.

Below, each component will be described in detail.

(A) Acid Decomposable Resin

The acid decomposable resin contains at least one type of repeating unit which is represented by the general formula (PG1), at least one type of repeating unit which is selected from the repeating units which are represented by the general formula (PG2) and the general formula (PG3), and at least one type of repeating unit which includes a lactone structure. The repeating units which are represented by the general formula (PG1), the general formula (PG2), and the general formula (PG3) have a group (referred to below as "acid decomposable group") which generates an alkali soluble group (here, a carboxyl group) by being decomposed due to the action of an acid.

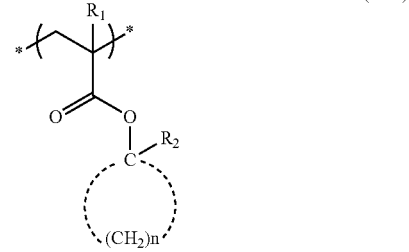

(PG1)

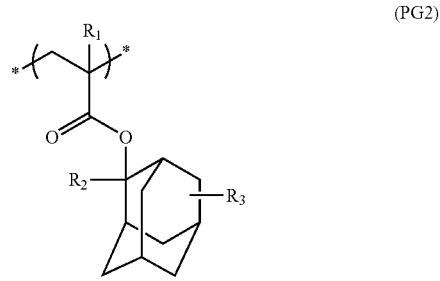

(PG2)

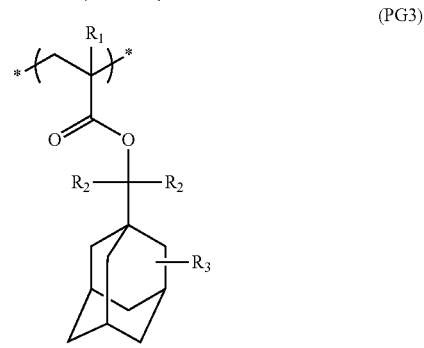

(PG3)

In the general formula (PG1), $R_1$ represents a hydrogen atom or an alkyl group which may have a substituent, $R_2$ represents an alkyl group, and n represents an integer of 4 to 7.

In the general formula (PG2), $R_1$ represents a hydrogen atom or an alkyl group which may have a substituent, $R_2$ represents an alkyl group or a cycloalkyl group, and $R_3$ represents a hydrogen atom or an alkyl group which may have a substituent.

In the general formula (PG3), $R_1$ represents a hydrogen atom or an alkyl group which may have a substituent, $R_2$ each independently represent an alkyl group or a cycloalkyl group, and $R_3$ represents a hydrogen atom or an alkyl group which may have a substituent.

The general formula (PG1) will be described in more detail.

The alkyl group which is represented by $R_1$ may be a linear chain shape or a branched chain shape. The carbon number of the alkyl group is preferably 1 to 8, is more preferably 1 to 4, and is even more preferably 1 or 2.

As the substituent which the alkyl group may have, for example, there are the examples of a hydroxyl group, an alkoxy group, a halogen, an acyloxy group, and the like.

$R_1$ is preferable a hydrogen atom, a methyl group, a hydroxymethyl group, or a trifluoromethyl group.

The alkyl group which is represented by $R_2$ may be a linear chain shape or a branched chain shape. The carbon number of the alkyl group is preferably 1 to 6, is more preferably 1 to 4, and is even more preferably 1 or 3. As the alkyl group, for example, there are the examples of a methyl group, an ethyl group, or an isopropyl group.

n represents an integer of 4 to 7, and the C atom which is bonded to $R_2$ and $(CH_2)n$ form an alicyclic structure with a single ring with 5 to 8 members. n is preferably 4 or 5.

Below, there are the specific examples of the repeating unit which is represented by the general formula (PG1).

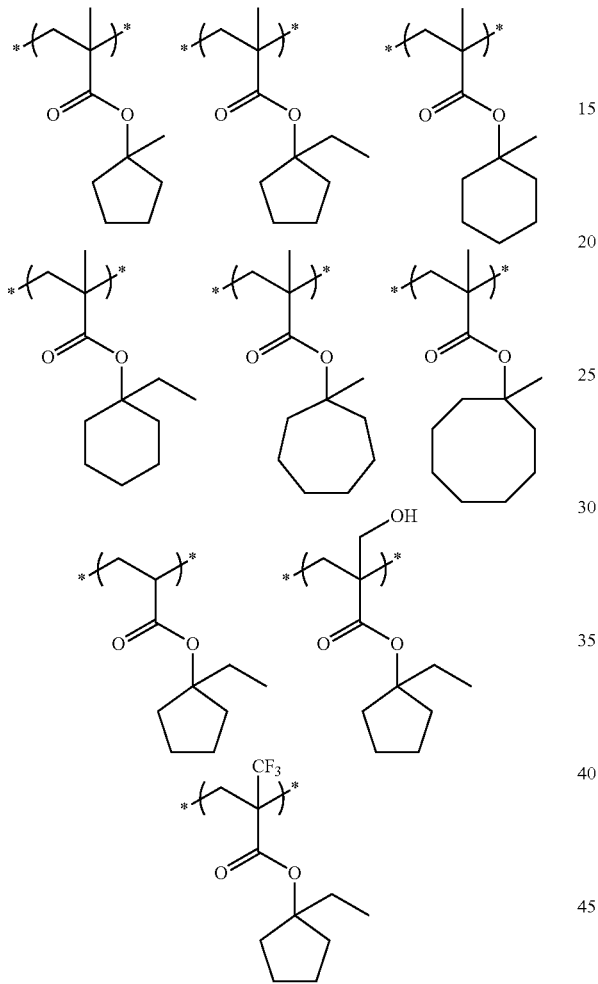

Next, the general formula (PG2) will be described in detail.

As $R_1$, there are the examples which are the same as was described as $R_1$ in the general formula (PG1) previously.

As the alkyl group which is represented by $R_2$, there are the examples which are the same as was described as $R_2$ in the general formula (PG1) previously.

The alkyl group which is represented by $R_2$ may be monocyclic or polycyclic, and for example, there are the examples of a cyclopentyl group, a cyclohexyl group, a norbornyl group, a tetracyclodecanyl group, a tetracyclododecanyl group, an adamantyl group, and the like.

The alkyl group which is represented by $R_3$ may be a linear chain shape or a branched chain shape. The carbon number of the alkyl group is preferably 1 to 8, is more preferably 1 to 6, and is even more preferably 1 to 4.

As the substituent which the alkyl group may have, for example, there are the examples of a hydroxyl group, an alkoxy group, an acyloxy group, and the like.

$R_3$ is preferable a hydrogen atom, a methyl group, or a 2-hydroxyisopropyl group.

Below, there are the examples of specific examples of the repeating unit which is represented by the general formula (PG2).

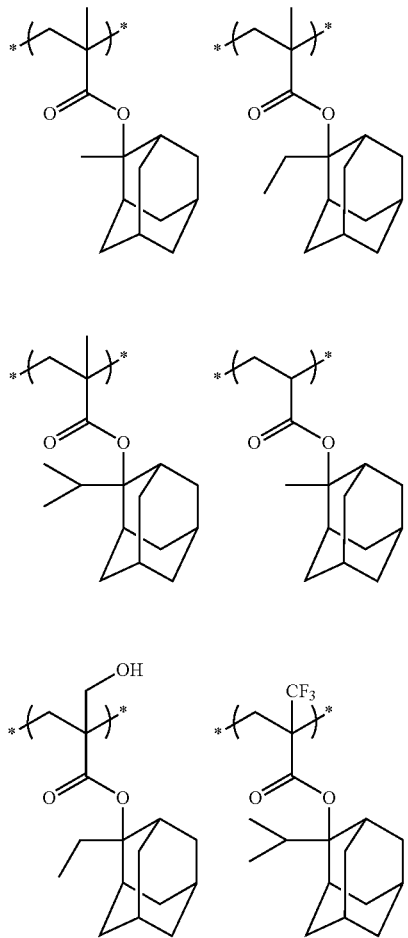

Next, the general formula (PG3) will be described.

As $R_1$, $R_2$, and $R_3$, there are the examples which are the same as was described as $R_1$, $R_2$, and $R_3$ in the general formula (PG2) previously.

Below, there are the specific examples of the repeating unit which is represented by the general formula (PG3).

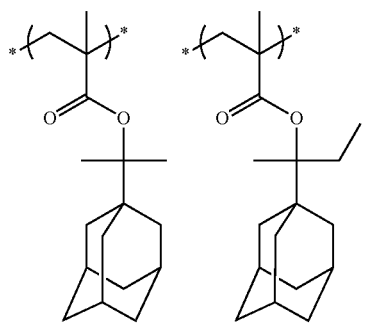

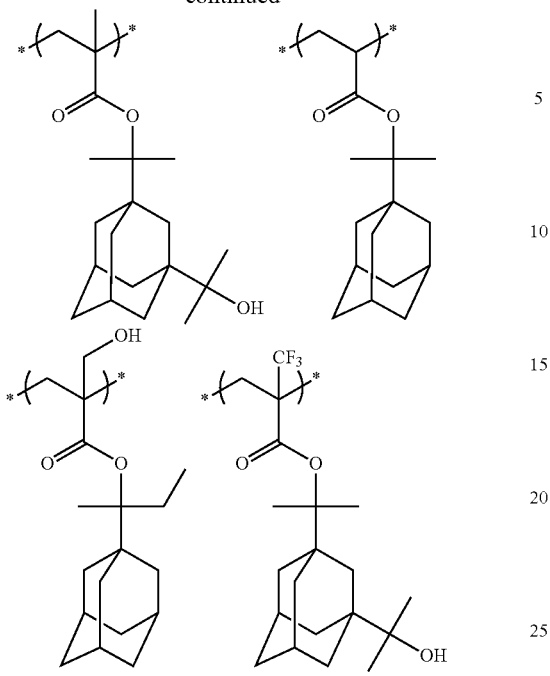

The content of the repeating unit which is represented by the general formula (PG1) included in the resin (A) is preferably 10 to 80 mol %, is more preferably 20 to 70 mol %, and is even more preferably 20 to 70 mol % with the total of the repeating units in the resin (A) as a reference. Most preferable is 30 to 60 mol %.

The total content of the repeating units which are represented by the general formula (PG2) and the general formula (PG3) included in the resin (A) is preferably 5 to 50 mol % and is more preferably 10 to 30 mol % with the total of the repeating units in the resin (A) as a reference.

The resin (A) may further include a repeating unit which is a repeating unit with an acid decomposable group and is different to the repeating units which are represented by the general formulae (PG1), (PG2), and (PG3) which are described above.

The resin (A) contains at least one type of repeating unit which includes a lactone structure.

As the lactone structure, there is no particular limitation, but a lactone structure with a 5 to 7 membered ring is preferable, and another ring structure with a form in which a bicyclo structure or a spiro structure is condensed with a lactone structure is preferable. Having a repeating unit with a lactone structure which is represented by any of the general formulae (LC1-1) to (LC1-17) is preferable. In addition, the lactone structure may be directly bonded to the main chain. As the preferable lactone structure, there are (LC1-4) and (LC1-8) and there is an improvement in LWR (line width roughness) and development defects due to a specific lactone structure being used.

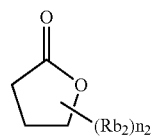
LC1-1

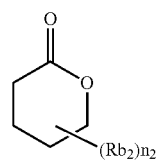
LC1-2

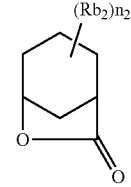
LC1-3

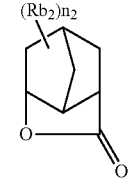
LC1-4

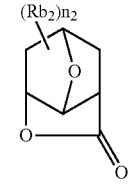
LC1-5

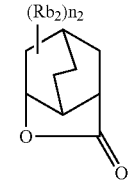
LC1-6

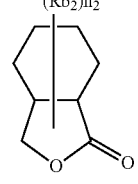
LC1-7

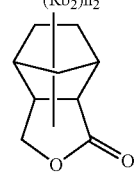
LC1-8

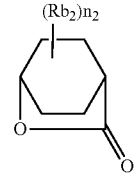
LC1-9

LC1-10 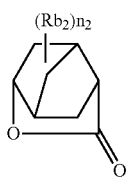

LC1-11 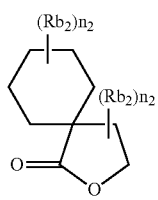

LC1-12 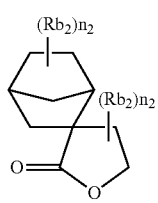

LC1-13 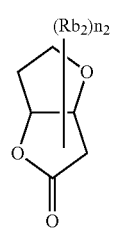

LC1-14 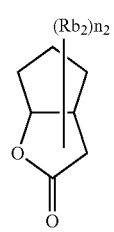

LC1-15 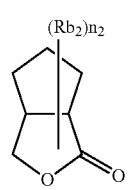

LC1-16 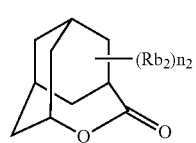

LC1-17 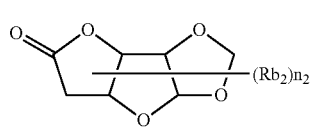

The lactone structure portion may have or may not have a substituent ($Rb_2$). As a preferable substituent ($Rb_2$), there are the examples of an alkyl group with a carbon number of 1 to 8, a cycloalkyl group with a carbon number of 4 to 7, an alkoxy group with a carbon number of 1 to 8, an alkoxycarbonyl group with a carbon number of 1 to 8, a carboxyl group, a halogen atom, a hydroxyl group, a cyano group, an acid decomposable group, and the like. An alkyl group with a carbon number of 1 to 4, a cyano group, and an acid decomposable group are more preferable. $n_2$ represents an integer of 0 to 4. When $n_2$ is 2 or more, the substituents ($Rb_2$) of which there are a plurality may be the same or may be different, and in addition, the substituents ($Rb_2$) of which there are a plurality may form a ring by bonding to each other.

The resin (A) preferably contains a repeating unit with a lactone structure which is represented by the general formula (III) in one aspect.

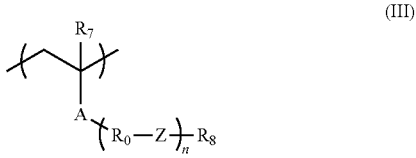

(III)

In general formula (III),

A represents an ester bond (a group represented by —COO—) or an amide bond (a group represented by —CONH—).

$R_0$ each independently represent an alkylene group, a cycloalkylene group, or a combination thereof in the case of there being a plurality thereof.

Z each independently represent an ether bond, an ester bond, an amide bond, a urethane bond,
(a group represented by

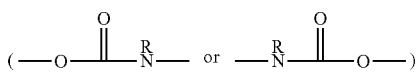

or a urea bond
(a group represented by

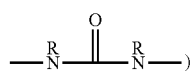

in the case of there being a plurality thereof. Here, R represents a hydrogen atom, an alkyl group, a cycloalkyl group, or an aryl group.

$R_8$ represents a monovalent organic group with a lactone structure.

n represents an integer of 1 to 5 which is the number of repeating units which is represented by —$R_0$—Z—.

$R_7$ represents a hydrogen atom, a halogen atom, or an alkyl group.

The alkylene group or the cycloalkylene group of $R_0$ may have a substituent.

Z is preferably an ether bond or an ester bond and is particularly preferably an ester bond.

The alkyl group of $R_7$ is preferably an alkyl group with a carbon number of 1 to 4, a methyl group or an ethyl group is more preferable, and a methyl group is particularly preferable. The alkyl group of $R_7$ may be substituted, and as the substituent, for example, there are the examples of a halogen atom such as a fluorine atom, a chlorine atom, or a bromine atom, a mercapto group, a hydroxy group, an alkoxy group such as, a methoxy group, an ethoxy group, an isopropoxy group, a t-butoxy group, or a benzyloxy group, or an acetoxy group such as an acetyl group or a propionyl group. $R_7$ is preferably a hydrogen atom, a methyl group, a trifluoromethyl group, or a hydroxymethyl group.

As a preferable chain alkyl group of $R_0$, a chain alkylene with a carbon number of 1 to 10 is preferable, a carbon number of 1 to 5 is more preferable, and for example, there are the examples of a methylene group, an ethylene group, a propylene group, and the like. As a preferable cycloalkylene, there is a cycloalkylene with a carbon number of 1 to 20, and for example, there are the examples of cyclohexylene, cyclopentylene, norbornylene, adamantylene, and the like. In order for the effects of the present invention to be exhibited, a chain alkylene group is more preferable and a methylene group is particularly preferable.

The substituent which the lactone structure represented by $R_8$ has is not limited as long as it has a lactone structure, and as a specific example, there are the examples of the lactone structures which are represented by general formulae (LC1-1) to (LC1-17) which will be described later. Among these, the structure which is represented by (LC1-4) is particularly preferable. In addition, $n_2$ in general formulae (LC1-1) to (LC1-17) is more preferably 2 or less.

In addition, $R_8$ is preferably a monovalent organic group which has an unsubstituted lactone structure or a monovalent organic group which has a lactone structure with a methyl group, a cyano group or an alkoxycarbonyl group as a substituent and is more preferably a monovalent organic group with a lactone structure (cyanolactone) with a cyano group as a substituent.

Specific examples of the repeating units with a lactone structure represented by the general formula (III) are shown below, but the present invention is not limited to these.

In the specific examples, R represents a hydrogen atom, an alkyl group which may have a substituent, or a halogen atom and preferably is a hydrogen atom, a methyl group, a hydroxymethyl group, or an acetoxymethyl group.

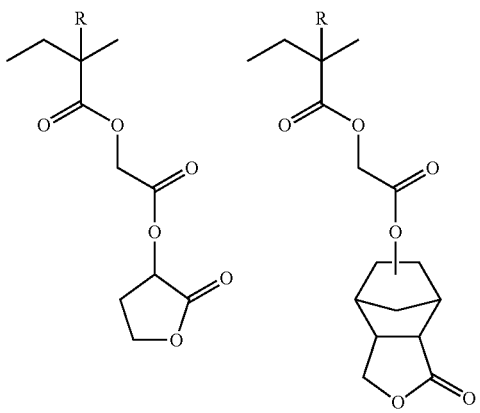

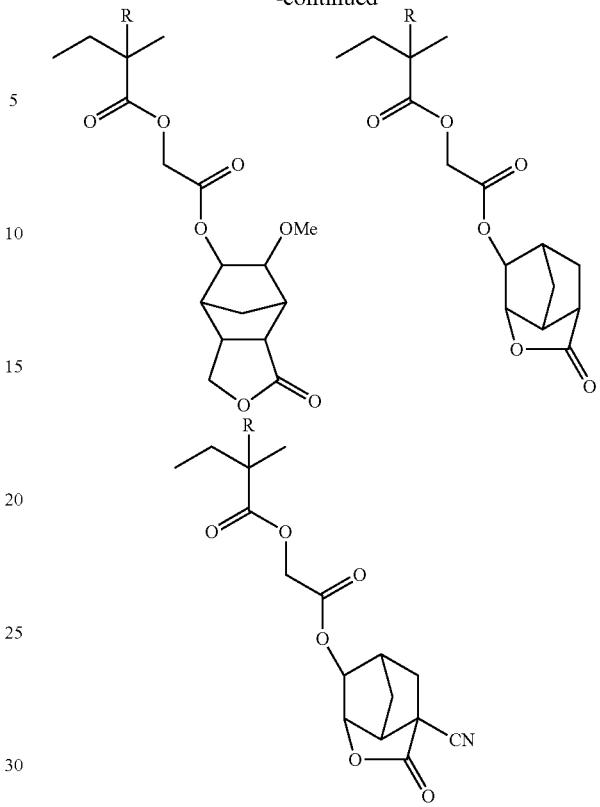

As the repeating unit with a lactone structure represented by the general formula (III), the repeating unit which is represented by the general formula (III-1) is preferable.

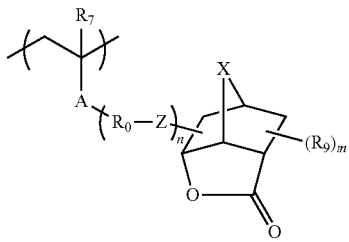

(III-1)

In the general formula (III-1),
$R_7$, A, $R_0$, Z, and n are the same as in the general formula (III) above.
$R_9$ each independently represent an alkyl group, a cycloalkyl group, an alkoxycarbonyl group, a cyano group, a hydroxyl group, or an alkoxy group in a case of a plurality thereof, and in a case of a plurality thereof, two $R_9$ may be bonded and form a ring.
X represents an alkylene group, an oxygen atom or a sulfur atom.
m is the number of substituents and represents an integer of 0 to 5. m is preferably 0 or 1.
As the alkyl group of $R_9$, an alkyl group with a carbon number of 1 to 4 is preferable, a methyl group and an ethyl group are more preferable, and a methyl group is the most preferable. As the cycloalkyl group, there can be the examples of a cyclopropyl group, a cyclobutyl group, a cyclopentyl group, or a cyclohexyl group. As the alkoxycarbonyl group, there can be the examples of a methoxycarbonyl group, an ethoxycarbonyl group, a n-butoxycarbonyl, a t-butoxycarbonyl, and the like. As the alkoxy group, there can be the examples of a methoxy group, an ethoxy group, a propoxy group, an isopropoxy group, and a butoxy group. These groups may have a substituent, and as the substituent, there can be the examples of a hydroxy group, an alkoxy group such as, a methoxy group, and an ethoxy group, a cyano group, and a halogen atom such as a fluorine atom. $R_9$ is preferably a methyl group, a cyano group, or an alkyloxycarbonyl group, and is more preferably a cyano group.

As the alkylene group of X, there are the examples of a methylene group, an ethylene group, and the like. X is preferably an oxygen atom or a methylene group and is more preferably a methylene group.

In a case where m is one or more, at least one $R_9$ is preferably substituted at an α position or a β position of a carbonyl group of a lactone and is particularly preferably substituted at an α position.

Specific examples of the repeating unit with a group which has a lactone structure represented by the general formula (III-1) are shown below but the present invention is not limited to these. In the specific examples below, R represents a hydrogen atom, an alkyl group which may have a substituent, or a halogen atom, and preferably represents a hydrogen atom, a methyl group, a hydroxymethyl group, or an acetoxymethyl group.

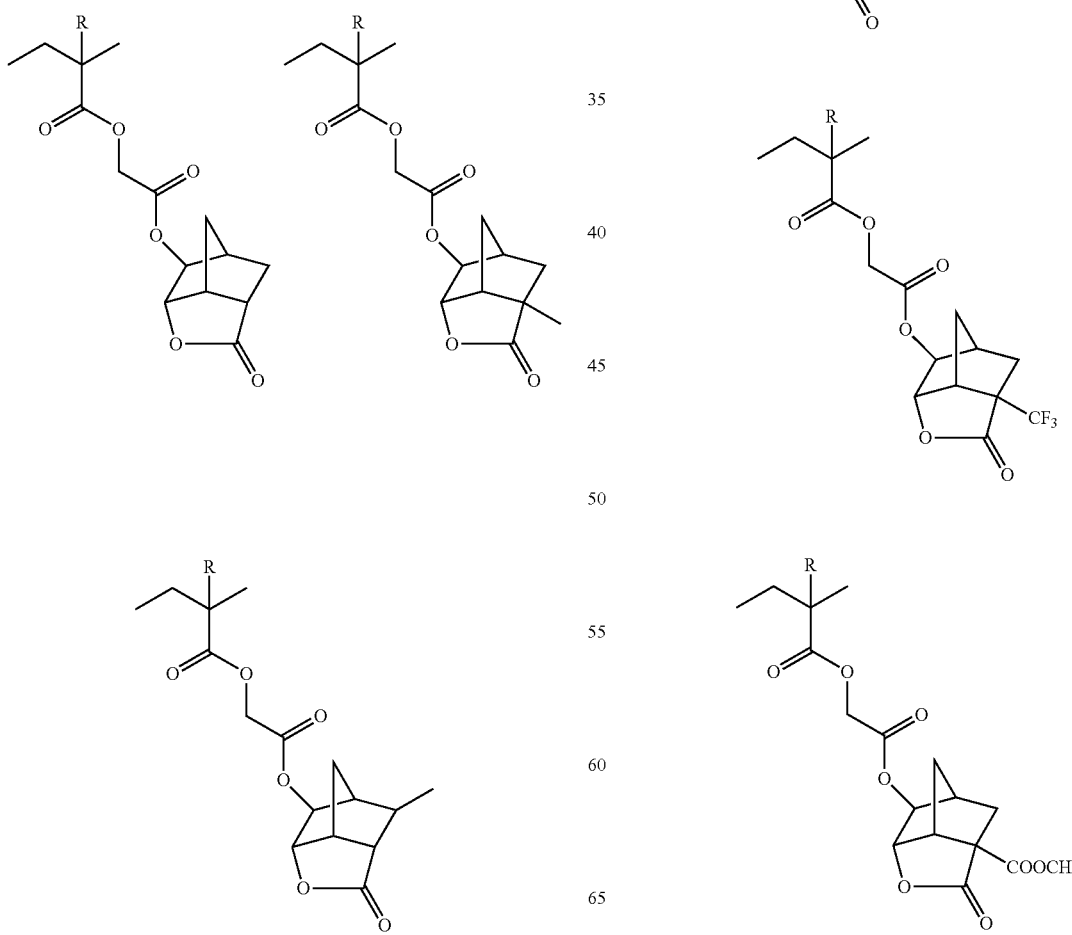

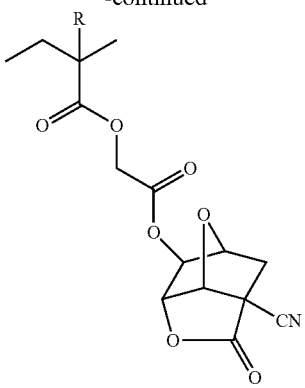
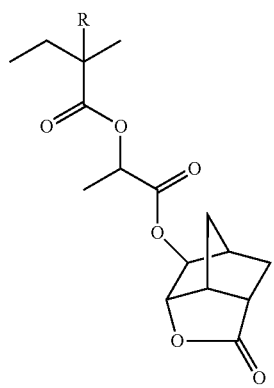
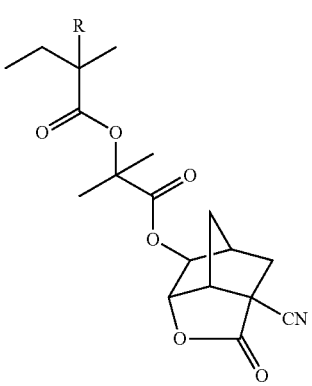
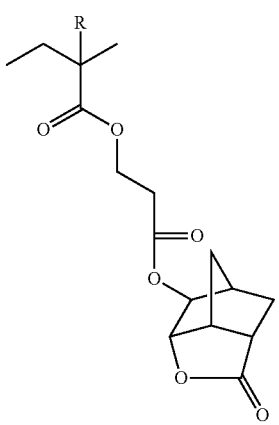
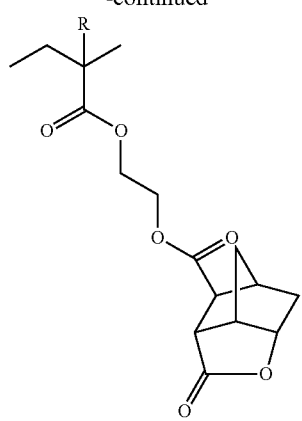
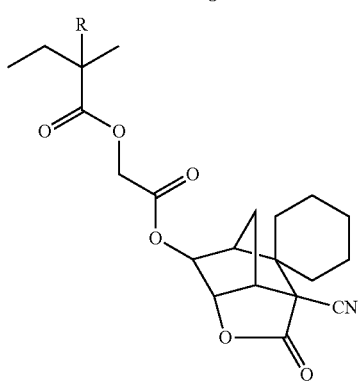
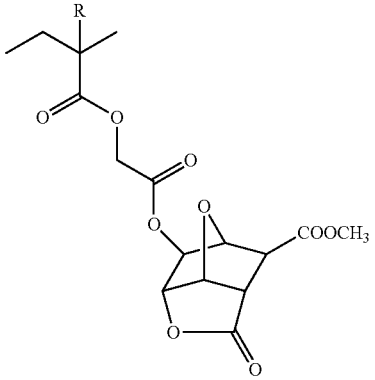
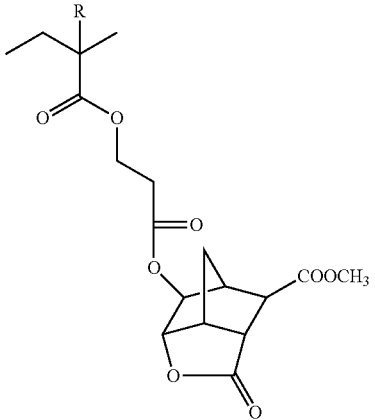

-continued

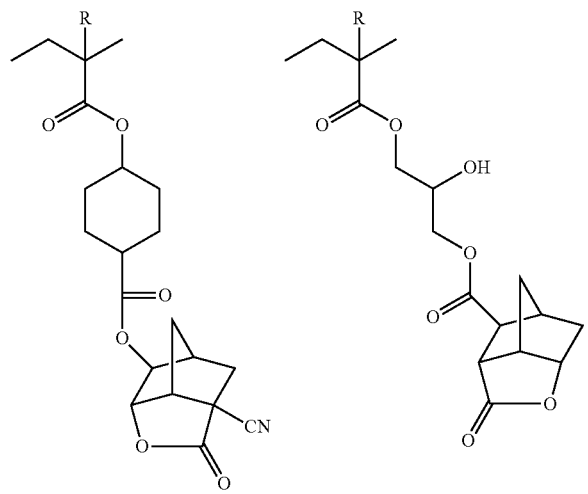

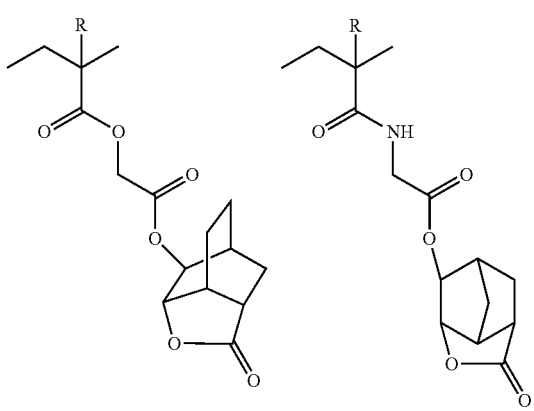

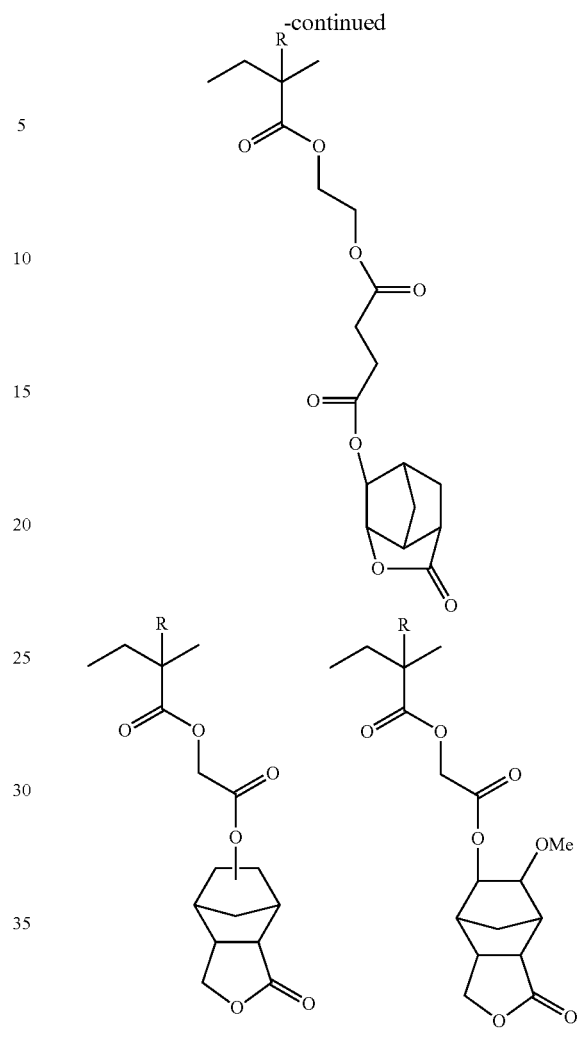

The content of the repeating unit which is represented by the general formula (III) is preferably 15 to 60 mol %, is more preferably 20 to 60 mol %, and is even more preferably 30 to 50 mol % with regard to the total of the repeating units in the resin by totaling when a plurality of types are contained therein.

The resin (A) may contain a repeating unit which is represented by the general formula (AII') in one aspect.

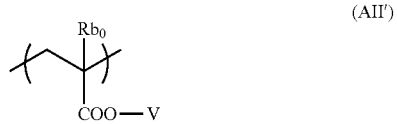

(AII')

In the general formula (AII'), $Rb_0$ represents a hydrogen atom, a halogen atom, or an alkyl group with a carbon number of 1 to 4. As a preferable substituent which the alkyl group of $Rb_0$ may have, there are the examples of a hydroxyl group or a halogen atom. As the halogen atom of $Rb_0$, there can be the examples of a fluorine atom, a chlorine atom, a bromine atom, or an iodine atom. A hydrogen atom, a methyl group, a hydroxymethyl group, or a trifluoromethyl group is preferable and a hydrogen atom and a methyl group are particularly preferable.

V represents a group with a structure which is shown by any of the general formulae (LC1-1) to (LC1-17) described above.

The resin (A) may contain a repeating unit other than the repeating unit represented by the general formula (III) and the general formula (AII') described above as the repeating unit with a lactone structure.

As specific examples of the repeating unit with a lactone structure, in addition to the specific examples given as examples above, there are the examples below, but the present invention is not limited to these.

(in the general formulae, Rx represents H, CH$_3$, CH$_2$OH, or CF$_3$)

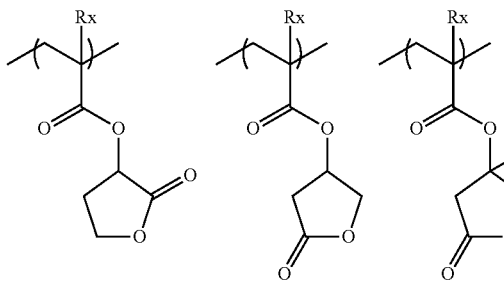

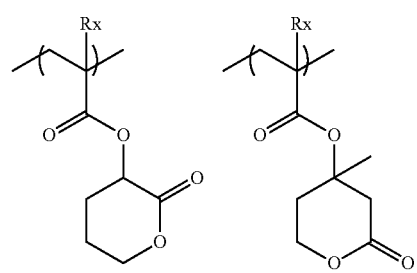

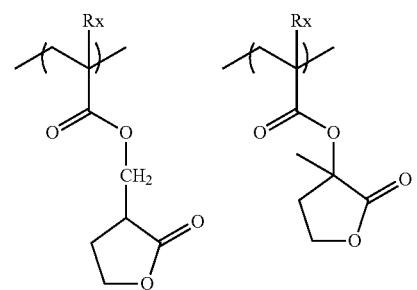

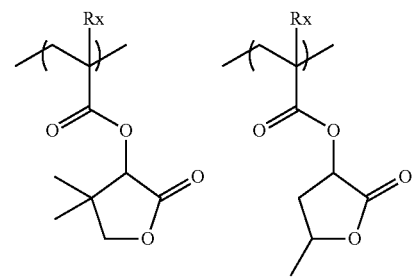

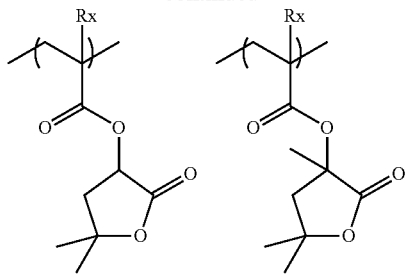

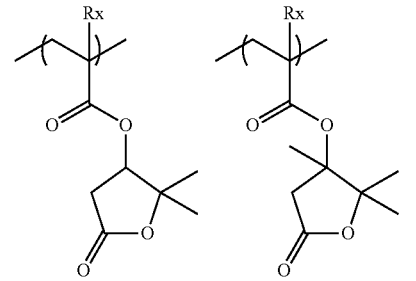

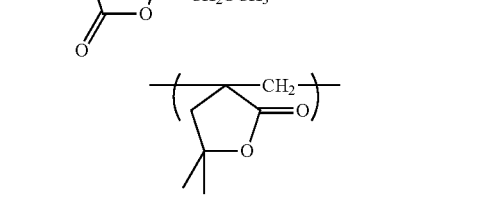

(in the general formulae, Rx represents H, CH$_3$, CH$_2$OH, or CF$_3$)

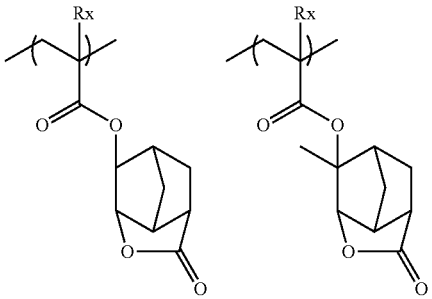

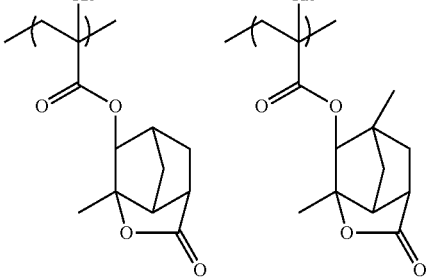

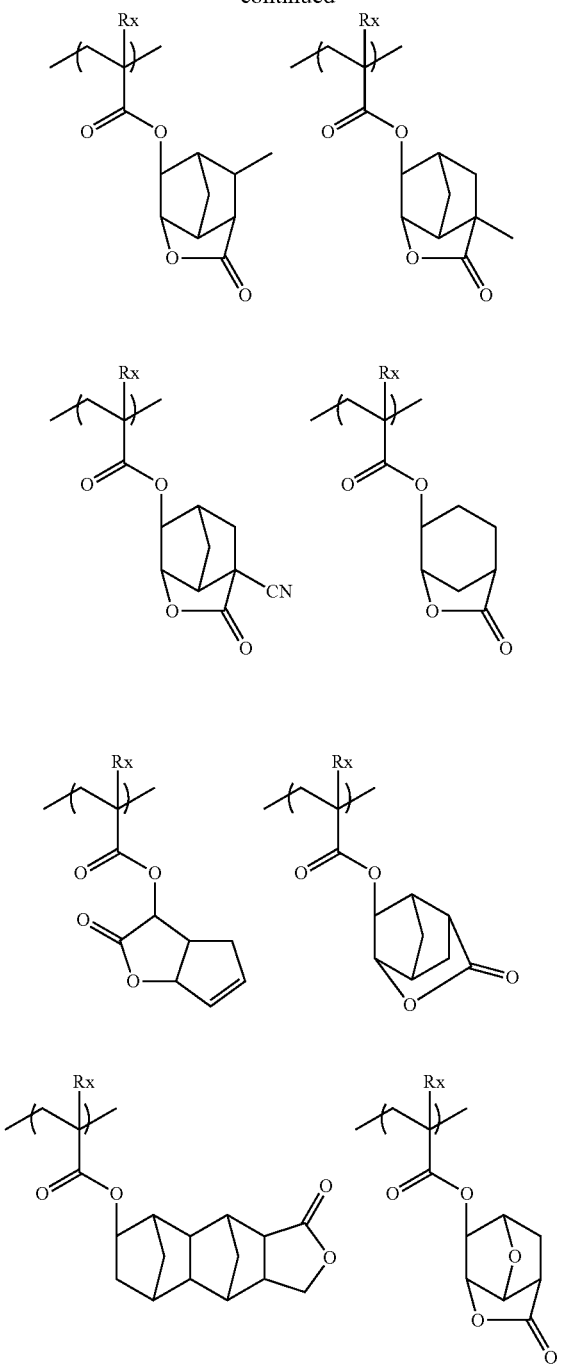
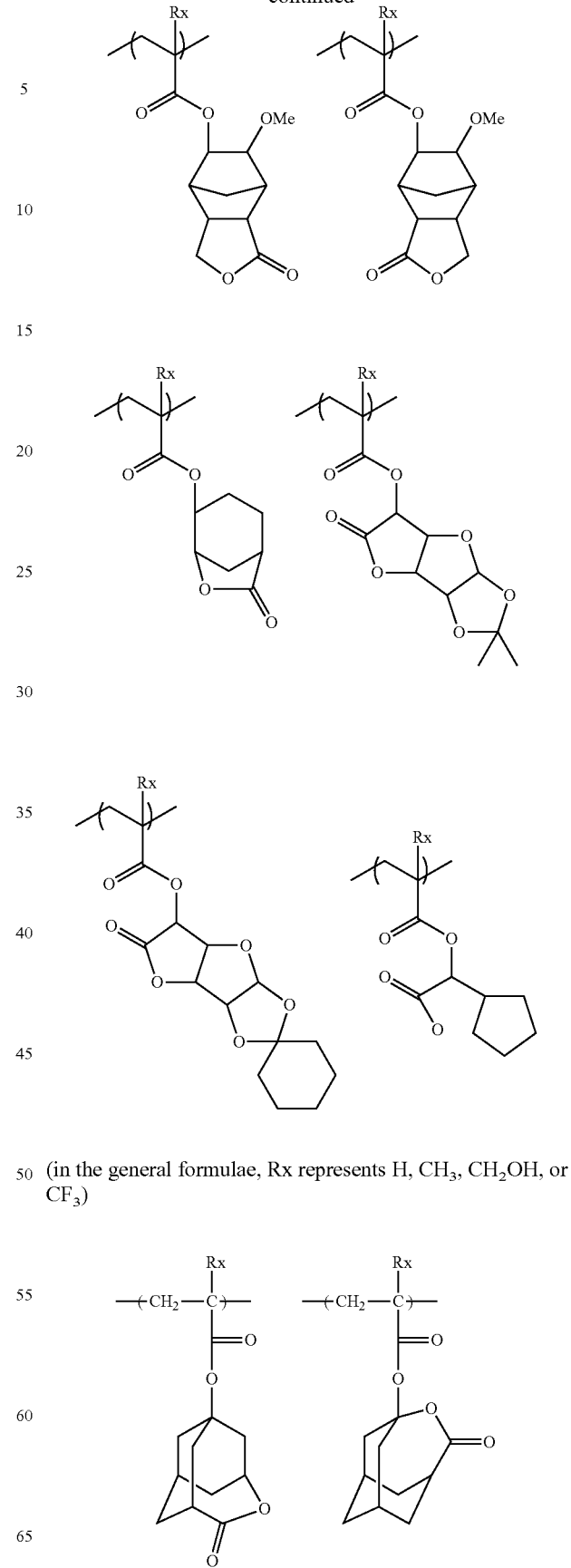
(in the general formulae, Rx represents H, CH₃, CH₂OH, or CF₃)

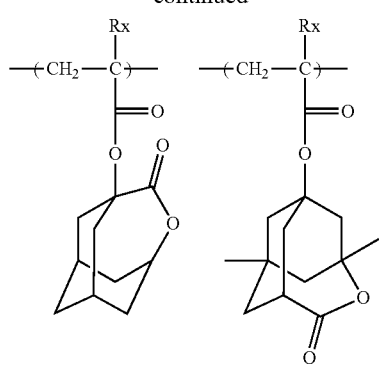
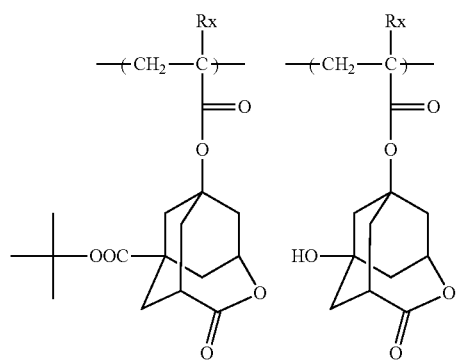
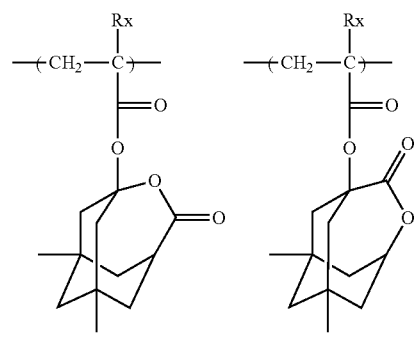
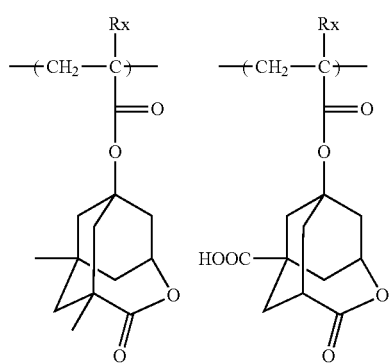
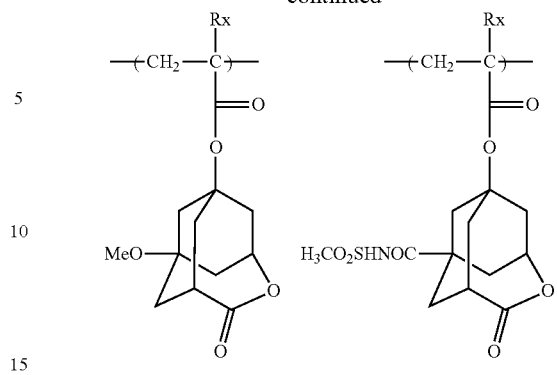
As the particularly preferable repeating units in the specific examples above other than the repeating units represented by the general formula (III), there are the examples of the repeating units below. Pattern profile and iso-dense bias are improved due to the selecting of the optimal lactone group.
(in the general formulae, Rx represents H, CH$_3$, CH$_2$OH, or CF$_3$)
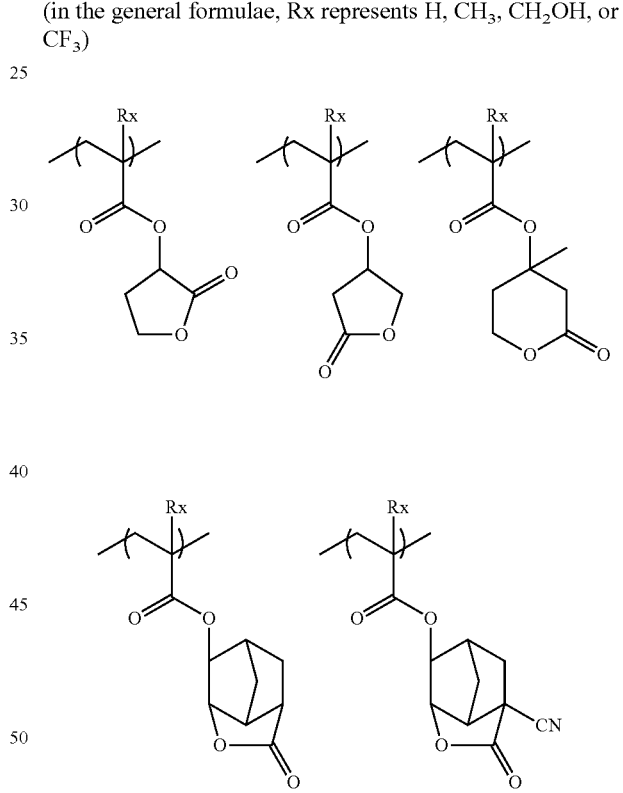
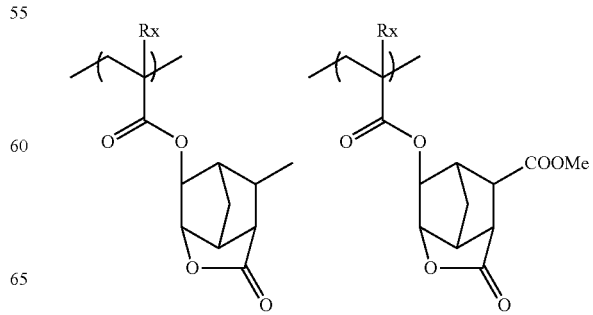

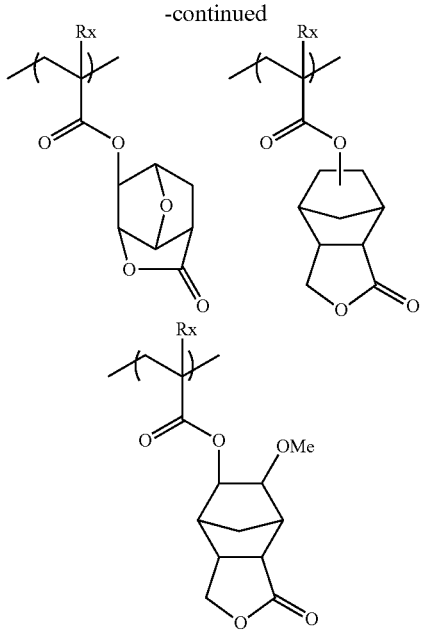

In the repeating units with the lactone group, optical isomers generally exist, but any optical isomer may be used. In addition, one type of optical isomer may be used by itself or a plurality of types of optical isomers may be mixed and used. In a case where one type of optical isomer is mainly used, the optical purity (ee) is preferably 90 or more and more preferably 95 or more.

The content of the repeating unit with the lactone other than the repeating unit which is represented by the general formula (III) is preferably 15 to 60 mol %, is more preferably 20 to 50 mol %, and is even more preferably 30 to 50 mol % with regard to the total of the repeating units in the resin by totaling when a plurality of types are contained therein.

In order to increase the effects of the present invention, it is possible to use two or more types of lactone repeating units which are selected from the general formula (III) in combination. In a case of use in combination, it is preferable that two or more types be selected from the lactone repeating units where n is 1 and used in combination in the general formula (III).

The resin (A) may further contain a repeating unit with a sultone (cyclic sulfonate ester) structure. As the sultone structure, there are no particular limits, and for example, there are the examples of the sultone structures which are represented by the general formulae (SL1-1) and (SL1-2). As the repeating unit with a sultone structure, for example, there is the example of a repeating unit where $R_8$ in the general formula (III) or V in the general formula (AII') described above is a group with a sultone structure.

Here, $Rb_2$ and $n_2$ in the general formula below are the same as $Rb_2$ and $n_2$ in the general formulae (LC1-1) to (LC1-17) which have been described above.

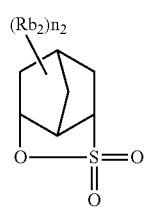

SL1-1

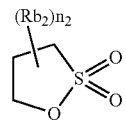

SL1-2

Other Repeating Units

The resin (A) preferably has a repeating unit with a hydroxyl group or a cyano group other than the repeating unit with the acid decomposable group or the repeating unit with the lactone structure described above. Due to this, substrate adhesion and affinity to the developing solution are improved. The repeating unit with a hydroxyl group or a cyano group preferably is a repeating unit with an alicyclic hydrocarbon structure which is substituted by a hydroxyl group or a cyano group and preferably has no acid decomposable group. As the alicyclic hydrocarbon structure in the alicyclic hydrocarbon structure which is substituted by a hydroxyl group or a cyano group, an adamantyl group, a diamantyl group, or a norbornane group are preferable. As a preferable alicyclic hydrocarbon structure which is substituted by a hydroxyl group or a cyano group, partial structures which are represented by the general formulae (VIIa) to (VIId) are preferable.

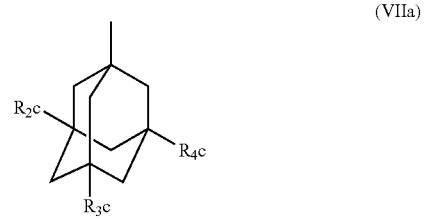
(VIIa)

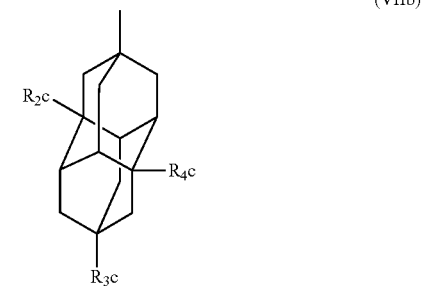
(VIIb)

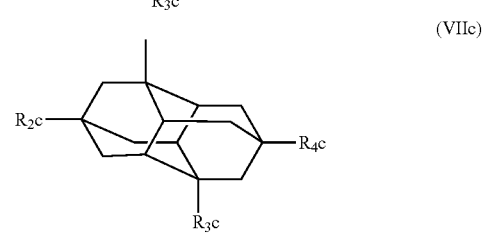
(VIIc)

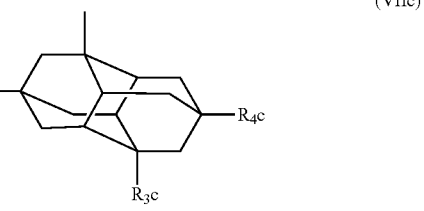
(VIId)

In the general formulae (VIIa) to (VIIc), $R_{2c}$ to $R_{4c}$ each independently represent a hydrogen atom, a hydroxyl group, or a cyano group. Here, at least one in $R_{2c}$ to $R_{4c}$ represents a hydroxyl group or a cyano group. One or two in $R_{2c}$ to $R_{4c}$ is preferably a hydroxyl group and the remainder are hydrogen atoms. In the general formula (VIIa), it is more preferable that two of $R_{2c}$ to $R_{4c}$ are hydroxyl groups and the remainder are hydrogen atoms.

As the repeating unit with a partial structure which is represented by the general formulae (VIIa) to (VIId), there can be the examples of the repeating units which are represented by the general formulae (AIIa) to (AIId).

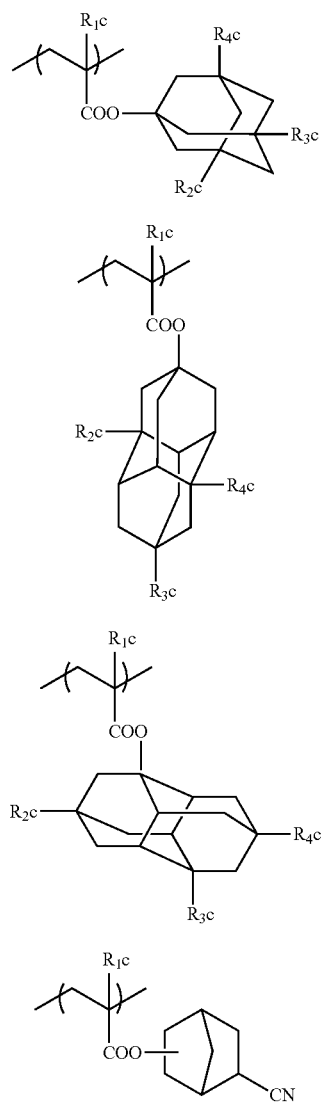

In the general formulae (AIIa) to (AIId), $R_{1c}$ represents a hydrogen atom, a methyl group, a trifluoromethyl group, or a hydroxymethyl group.

$R_{2c}$ to $R_{4c}$ are the same as $R_{2c}$ to $R_{4c}$ in the general formulae (VIIa) to (VIIc).

The content of the repeating unit with a cyano group or a hydroxyl group is preferably 5 to 40 mol %, is more preferably 5 to 30 mol %, and is even more preferably 10 to 25 mol % with regard to the total of the repeating units in the resin (A).

Specific examples of the repeating unit with a cyano group or a hydroxyl group are shown below, but the present invention is not limited to these.

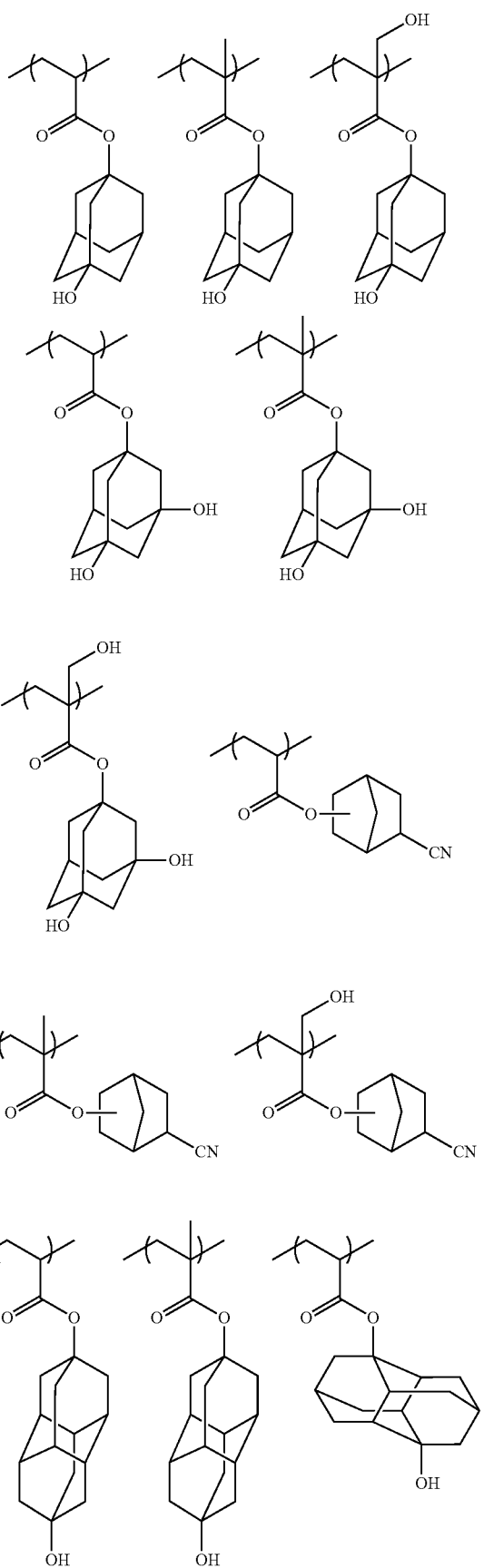

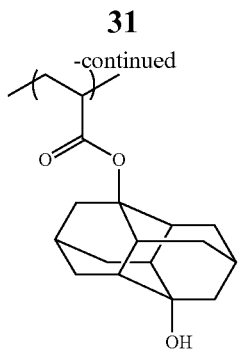

The resin which uses the actinic ray-sensitive or radiation-sensitive resin composition of the present invention may have a repeating unit with an alkali soluble group. As the alkali soluble group, there are the examples of a carboxyl group, a sulfonamide group, a sulfonylimide group, a bissulfonylimide group, or an aliphatic alcohol (for example, a hexafluoroisopropanol group) which is substituted by an electron withdrawing group at an a position and having a repeating unit with a carboxyl group is preferable. Due to the resin containing a repeating unit with an alkali soluble group, resolution during formation of contact holes is enhanced. As the repeating unit with an alkali soluble group, any of a repeating unit where an alkali soluble group bonds directly to the main chain of the resin such as repeating units derived from acrylic acid or methacrylic acid, a repeating unit where an alkali soluble group bonds to the main chain of the resin via a linking group, or further, introduction of a polymerization initiator or a chain transfer agent which has an alkali soluble group to a terminal of a polymer chain used during polymerization is preferable, and the linking group may have a monocyclic or polycyclic hydrocarbon structure. The repeating unit derived from acrylic acid or methacrylic acid is particularly preferable.

The content of the repeating unit with an alkali soluble group is preferably 0 to 20 mol %, is more preferably 3 to 15 mol %, and is even more preferably 5 to 10 mol % with regard to the total of the repeating units in the resin (A).

There are examples of specific examples of the repeating unit with an alkali soluble group below, but the present invention is not limited to this.

In the specific examples, Rx represents H, $CH_3$, $CH_2OH$, or $CF_3$.

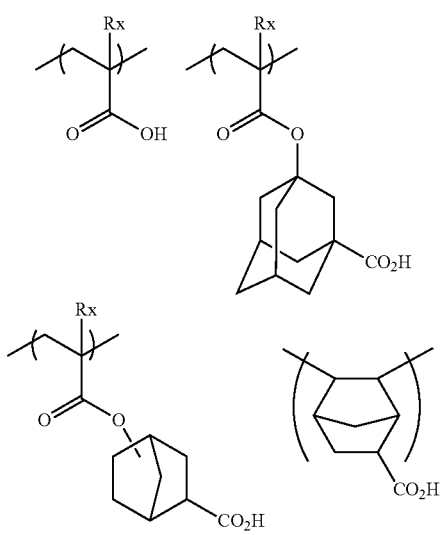

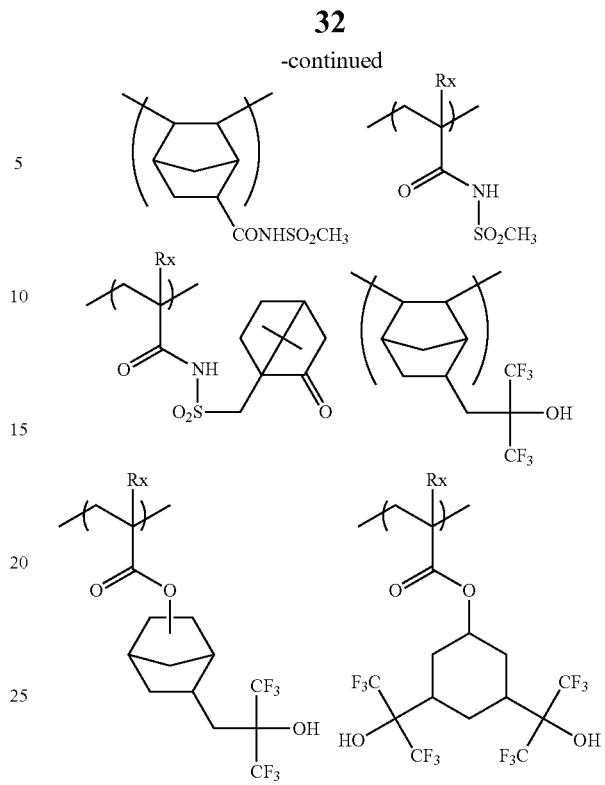

It is possible for the resin (A) of the present invention to further have a repeating unit which has an alicyclic hydrocarbon structure without a polar group and which does not exhibit acid decomposability. As such a repeating unit, there is the example of the repeating unit which is represented by the general formula (IV).

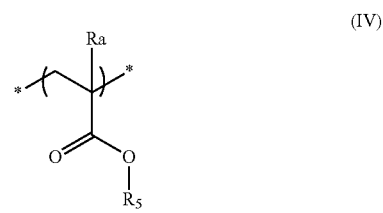

In the general formula (IV), $R_5$ has at least one ring structure and represents a hydrocarbon group which does not have either a hydroxyl group or a cyano group.

Ra represents a hydrogen atom, an alkyl group, or a —$CH_2$—O—$Ra_2$ group. In the general formula, $Ra_2$ represents a hydrogen atom, an alkyl group, or an acyl group. Ra is preferably a hydrogen atom, a methyl group, a hydroxymethyl group, or a trifluoromethyl group, and is particularly preferably a hydrogen atom or a methyl group.

A monocyclic hydrocarbon group or a polycyclic hydrocarbon group is included in the ring structure which $R_5$ has. As the monocyclic hydrocarbon group, for example, there are the examples of a cycloalkyl group with a carbon number from 3 to 12 such as a cyclopentyl group, a cyclohexyl group, a cycloheptyl group, and a cyclooctyl group, and a cycloalkenyl group with a carbon number from 3 to 12 such as a cyclohexenyl group. As a preferable monocyclic hydrocarbon group, there is a monocyclic hydrocarbon group with a carbon number of 3 to 7, and more preferably, there are the examples of a cyclopentyl group and a cyclohexyl group.

A ring-assembly hydrocarbon group and a crosslinked-ring hydrocarbon group are included in the polycyclic hydrocarbon group, and as an example of a ring-assembly hydrocarbon group, a bicyclohexyl group, a perhydronaphthalenyl group, and the like are included. As the crosslinked-ring hydrocarbon group, for example, a bicyclic hydrocarbon ring such as pinane, bornane, norpinane, norbornane, a bicyclooctane ring (such as bicyclo[2.2.2]octane ring or bicyclo[3.2.1] octane ring), a tricyclic hydrocarbon ring such as homobrendane, adamantane, tricyclo[5.2.1.0$^{2,6}$]decane and tricyclo [4.3.1.1$^{2,5}$]undecane rings, and a tetracyclic hydrocarbon ring such as tetracyclo[4.4.0.1$^{2,5}$.1$^{7,10}$]dodecane and perhydro-1,4-methano-5,8-methanonaphthalene rings. Furthermore, the crosslinked-ring hydrocarbon ring includes a condensed-ring hydrocarbon ring and condensed-ring where there is condensation of a plurality of cycloalkane rings with 5 to 8 members such as perhydronaphthalene (decalin), perhydroanthracene, perhydrophenanthrene, perhydroacenaphthene, perhydrofluorene, perhydroindene, and perhydrophenalene rings.

As a preferable crosslinked-ring hydrocarbon ring, there are the examples of a norbornyl group, an adamantyl group, a bicyclooctanyl group, a tricyclo[5.2.1.0$^{2,6}$]decanyl group, and the like. As a more preferable crosslinked-ring hydrocarbon ring, there are the examples of a norbornyl group and an adamantyl group.

The alicyclic hydrocarbon groups may have a substituent. As a preferable substituent, there are the examples of a halogen atom, an alkyl group, a hydroxyl group which is protected by a protective group, an amino group which is protected by a protective group, and the like. As a preferable halogen atom, there is a bromine, a chlorine, or a fluorine atom, and as a preferable alkyl group, there is a methyl, an ethyl, a butyl or a t-butyl group. The alkyl group above may further have a substituent, and as the substituent which may be included, there can be the examples of a halogen atom, an alkyl group, a hydroxyl group which is protected by a protective group, and an amino group which is protected by a protective group.

As the protective group, for example, there are the examples of an alkyl group, a cycloalkyl group, an aralkyl group, a substituted methyl group, a substituted ethyl group, an alkoxycarbonyl group or an aralkyloxycarbonyl group. As a preferable alkyl group, there is an alkyl group with a carbon number of 1 to 4. As a preferable substituted methyl group, there is a methoxymethyl, a methoxythiomethyl, a benzyloxymethyl, a t-butoxymethyl or a 2-methoxyethoxymethyl group. As a preferable substituted ethyl group, there is a 1-ethoxyethyl or a 1-methyl-1-methoxyethyl group. As a preferable acyl group, there is an aliphatic acyl group with a carbon number of 1 to 6 such as a formyl, an acetyl, a propionyl, a butyryl, an isobutyryl, a valeryl or a pivaloyl group. As the alkoxycarbonyl group, there is an example of an alkoxycarbonyl group with a carbon number of 1 to 4.

The content of the repeating unit, which has an alicyclic hydrocarbon structure without a polar group and which does not exhibit acid decomposability, is preferably 0 to 40 mol % and is more preferably 0 to 20 mol % with regard to the total of the repeating units in the resin (A).

There are examples of specific examples of the repeating unit which has an alicyclic hydrocarbon structure without a polar group and which does not exhibit acid decomposability below, but the present invention is not limited to these. In the general formulae, Ra represents H, $CH_3$, $CH_2OH$, or $CF_3$.

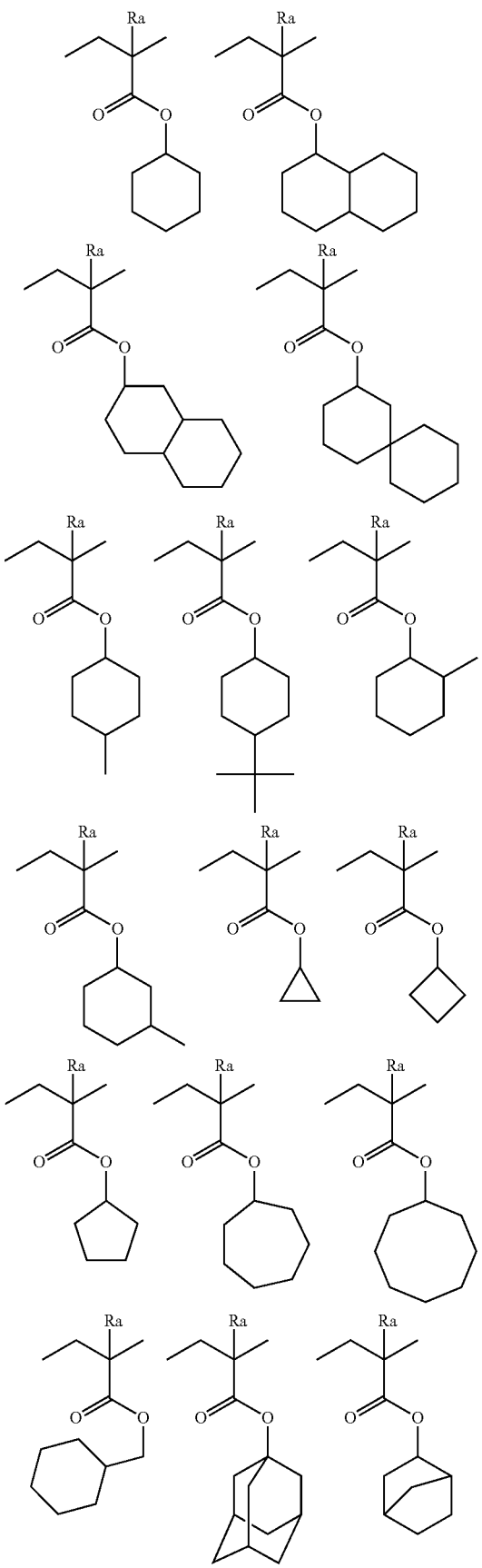

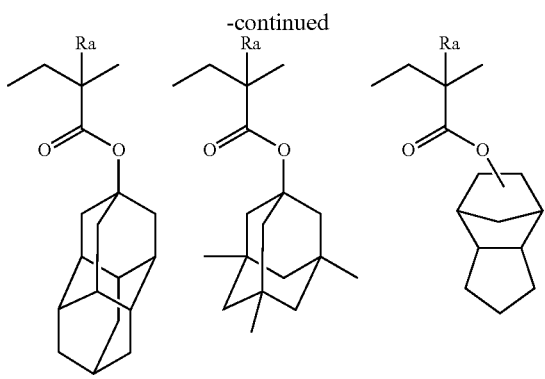

The resin (A) which is used in the composition of the present invention is able to have various repeating structural units other than the repeating structural units described above for the objectives of regulating the dry etching resistance, standard developer adaptability, substrate adhesion, and resist profile and further resolving power, heat resistance, and sensitivity which are necessary and typical characteristics of a resist.

As such repeating structural units, there can be the examples of the repeating structural units which correspond to the following monomers, but this does not limit the present invention.

Due to this, it is possible to precisely regulate the performance which is required of the resin which is used in the composition of the present invention, and in particular (1) solubility with regard to coating solvents, (2) film forming property (glass transition point), (3) alkali developing, (4) film loss (selection of hydrophilicity/hydrophobicity and alkali soluble groups), (5) adhesion to a substrate in an unexposed area, and (6) dry etching resistance.

As such a monomer, for example, there can be the examples of a compound having an unsaturated bond where addition polymerization is possible which is selected from among acrylic esters, methacrylic esters, acrylamides, methacrylamides, an allyl compound, vinyl ethers, vinyl esters, and the like.

Other than this, there may be copolymerization with any unsaturated compound where addition polymerization is possible which is copolymerizable with a monomer which corresponds to the various repeating structural units described above.

The molar ratios of the respective repeating structural units in the resin (A) which is used in the composition in the present invention are appropriately set in order to regulate the dry etching resistance, standard developer adaptability, substrate adhesion, and resist profile of the resist and further resolving power, heat resistance, and sensitivity which are necessary and typical characteristics of a resist.

When the composition of the present invention is for ArF exposure, it is preferable for the resin (A) which is used in the composition of the present invention to not have an aromatic group from the viewpoint of transparency to ArF light. More specifically, the content of the repeating unit with an aromatic group is preferably 5 mol % or less and is more preferably 3 mol % or less with regard to the total of the repeating units in the resin (A), and not having the repeating unit with an aromatic group is even more preferable. In addition, the resin (A) preferably has a monocyclic or polycyclic alicyclic hydrocarbon structure.

Here, it is preferable for the resin (A) not to contain a fluorine atom and a silicon atom from the viewpoint of mutual solubility with a hydrophobic resin which is a second resin which will be described below.

As the resin (A) which is used in the composition of the invention, all the repeating units preferably are configured by (meth)acrylate repeating units. In this case, it is possible to use a resin where any of all the repeating units are methacrylate-based repeating units, all the repeating units are acrylate-based repeating units, or all the repeating units are methacrylate-based repeating units and acrylate-based repeating units, but 50 mol % or less of acrylate-based repeating units with respect to the total of the repeating units is preferable. A copolymer which includes 20 to 50 mol % of (meth)acrylate-based repeating units with an acid-decomposable group, 20 to 50 mol % of (meth)acrylate-based repeating units with a lactone group, 5 to 30 mol % of (meth)acrylate-based repeating units with an alicyclic hydrocarbon structure substituted with a hydroxyl group or a cyano group and 0 to 20 mol % of other (meth)acrylate-based repeating units is preferable.

In a case where the composition of the present invention is irradiated with KrF excimer laser light, an electron beam, X-rays or high-energy light rays with a wavelength of 50 nm or less (EUV and the like), the resin (A) preferably further has a hydroxystyrene-based repeating unit. A hydroxystyrene-based repeating unit, a hydroxystyrene-based repeating unit which is protected by an acid decomposable group, and an acid decomposable repeating unit such as a (meth)acrylic acid tertiary alkyl ester are more preferable.

As a preferable hydroxystyrene-based repeating unit with an acid-decomposable group, for example, there are the examples of a repeating unit derived from t-butoxycarbonyloxystyrene, 1-alkoxyethoxystyrene and (meth)acrylic acid tertiary alkyl ester, and a repeating unit derived from 2-alkyl-2-adamantyl (meth)acrylate and dialkyl(1-adamantyl)methyl (meth)acrylate is more preferable.

The resin (A) is able to be synthesized according to normal techniques (for example, radical polymerization). For example, as typical synthetic methods, there are the examples of a batch polymerization method in which polymerization is performed by a type of monomer and an initiator being dissolved in a solvent and heated and a dropwise polymerization method in which a solution of a type of monomer and an initiator is added dropwise to a heated solvent over a period of 1 to 10 hours, and the dropwise polymerization method is preferable. As a reaction solvent, for example, there are the examples of ethers such as tetrahydrofuran, a 1,4-dioxane or diisopropyl ether, ketones such as methyl ethyl ketone or methyl isobutyl ketone, an ester solvent such as ethyl acetate, an amide solvent such as dimethylformamide or dimethylacetamide, or a solvent which dissolves the composition of the present invention such as propylene glycol monomethyl ether acetate, propylene glycol monomethyl ether, or cyclohexanone which are described later. Polymerization with the use of the same solvent as the solvent used in the photosensitive composition of the present invention is more preferable. Due to this, it is possible to suppress particle generation during storage.

The polymerization reaction is preferably performed in an atmosphere of an inert gas such as nitrogen or argon. The polymerization is initiated by the use of a radical initiator (azo-based initiator, peroxide, or the like) which is commercially available as a polymerization initiator. As the radical initiators, an azo-based initiator is preferable, and an azo-based initiator with an ester group, a cyano group or a carboxyl group is preferable. As a preferable initiator, there are the examples of azobisisobutyronitrile, azobisdimethylvaleronitrile, dimethyl 2,2'-azobis(2-methylpropionate) and the like. The initiator is supplemented or divided addition thereof is performed as required, after the completion of the reaction, the reaction mixture is introduced into a solvent, and the desired polymer is recovered by a method for extraction, solid recovery, and the like. The concentration of the reaction is 5 to 50 mass % and is preferably 10 to 30 mass %. The reaction temperature is generally 10° to 150° C., is preferably 30 to 120° C., and is more preferably 60 to 100° C.

The weight average molecular weight of the resin (A) of the present invention as the polystyrene equivalent value as measured using a GPC method is preferably 1,000 to 200,000, more preferably 2,000 to 20,000, even more preferably 3,000 to 15,000, and still further preferably 3,000 to 10,000. By setting the weight average molecular weight to 1,000 to 200,000, it is possible to prevent deterioration in heat resistance and dry etching resistance and also it is possible to prevent deterioration of developability, and deterioration in film forming properties due to higher viscosity.

In addition, dispersion (molecular weight distribution Mw/Mn) is normally in the range of 1 to 3, is preferably 1 to 2.6, more preferably 1 to 2, and even more preferably 1.4 to 2.0. The resolution and resist formation is improved as the molecular weight distribution becomes smaller, and also, the side wall of the resist pattern is smooth and roughness is improved. In the specifications, the weight average molecular weight (Mw) and the average molecular weight (Mn) of the resin (A) are able to be obtained using an HLC-8120 (manufactured by Tosoh Corporation), using a TSK gel Multipore HXL-M (7.8 mm ID×30.0 cm manufactured by Tosoh Corporation) as a column and using THF (tetrahydrofuran) as an eluent.

Specific examples of the resin (A) are shown below.

1

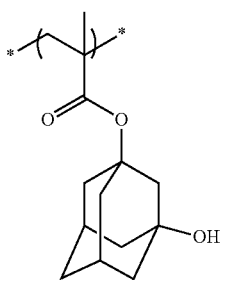

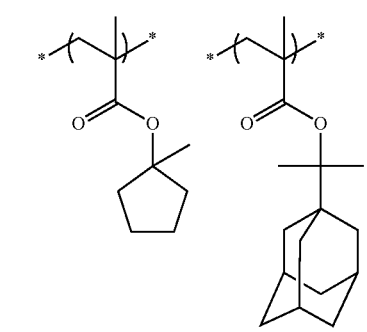

2
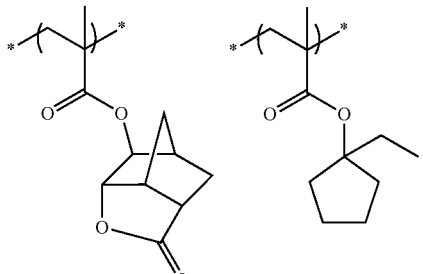

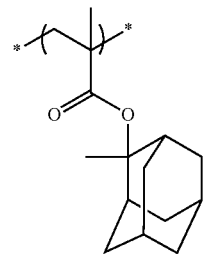

3
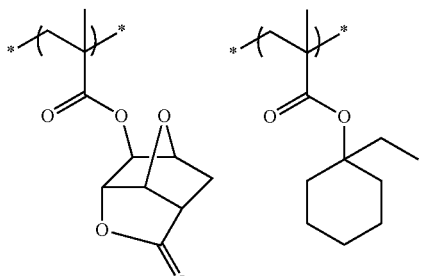

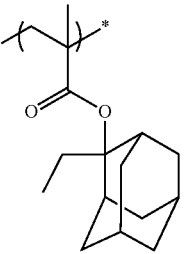

4
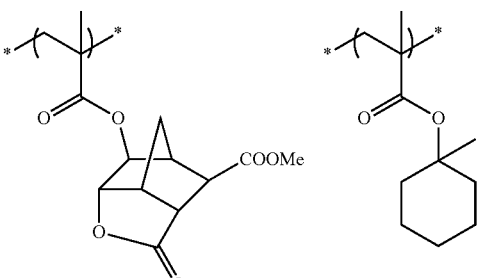

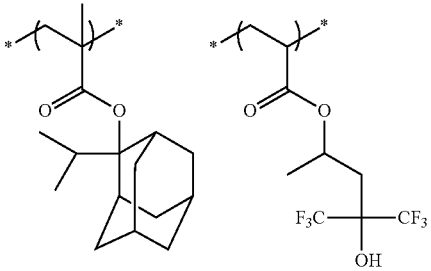

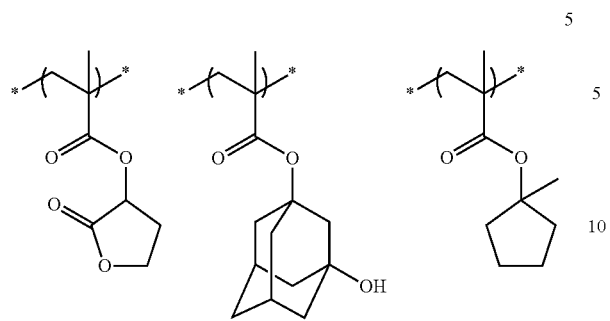
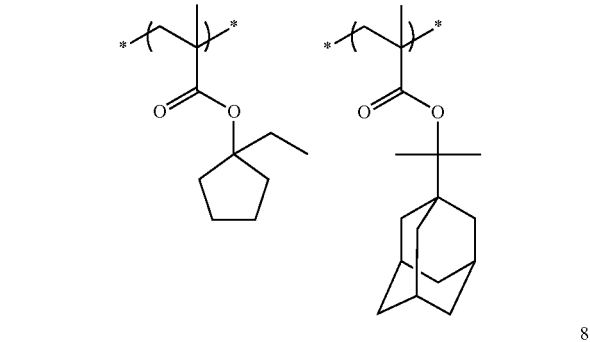
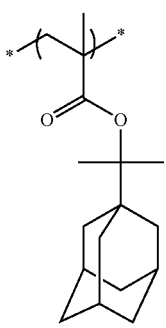
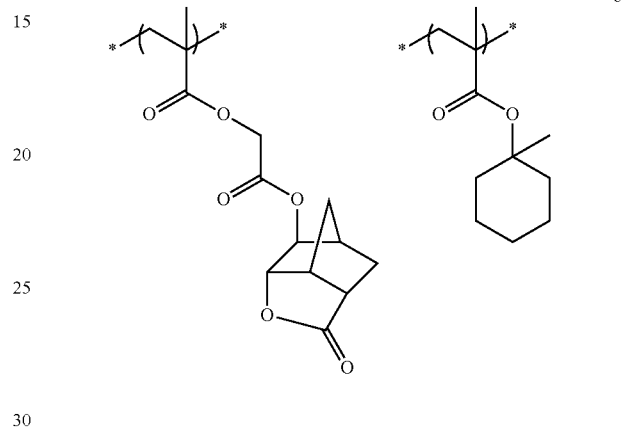
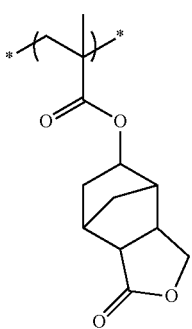
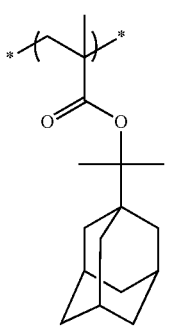
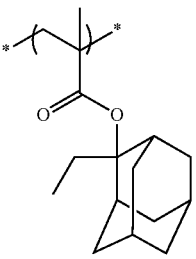
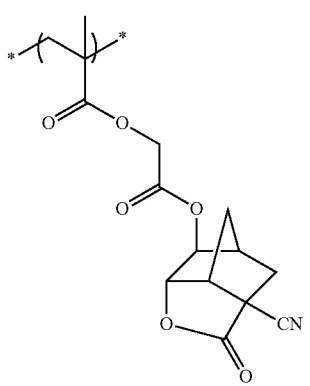
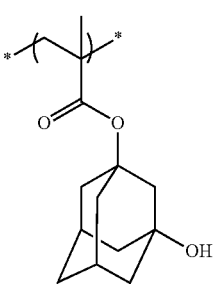
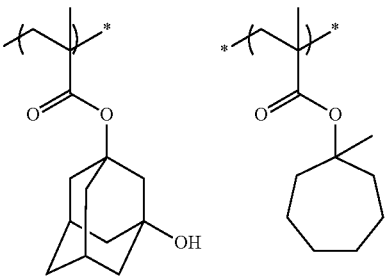
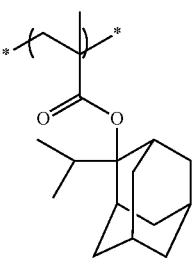

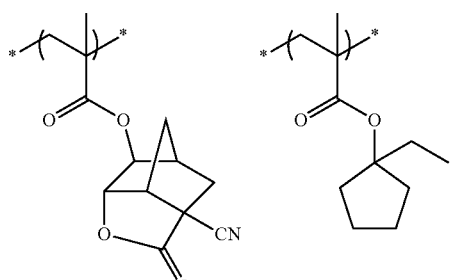

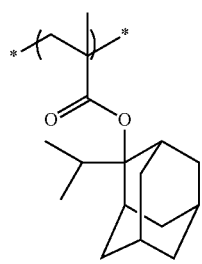

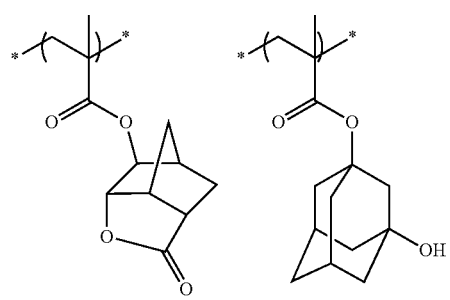

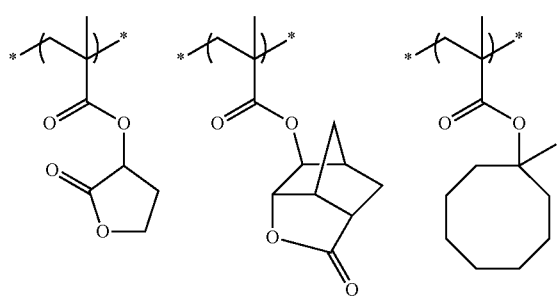

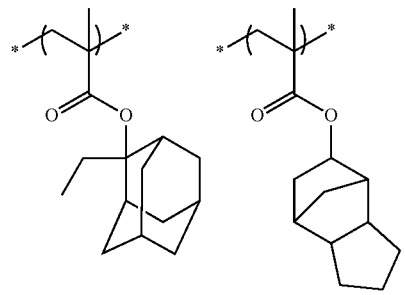

The distribution of the resin (A) in the total composition of the present invention is preferably 30 to 99 mass % and more preferably 60 to 98 mass % in the total solid content.

In addition, the resin of the present invention may be used either solely or may be used in combination.

Here, in a range which does not deteriorate the effects of the present invention, resins other than the resin (A) of the present invention may be used in combination. As the resins other than the resin (A) of the present invention, there can be the examples of an acid decomposable resin which may contain a repeating unit which can be contained in the resin (A) described above or another known acid decomposable resin.

(B) Acid Generator

The composition of the present invention contains a compound (B) which is represented by the general formula (B1) as an acid generator. The molecular weight of the anion moiety of the compound is 200 or less and is preferably 180 or less.

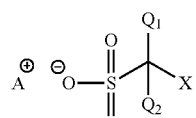 (B1)

In the general formula (B1), $A^+$ represents a sulfonium cation or an iodonium cation.

$Q_1$ and $Q_2$ each independently represent a fluorine atom or $CF_3$.

X represents a substituent which includes at least one carbon atom and does not contain a fluorine atom or contains two or fewer fluorine atoms.

As the substituent which is represented by X, for example, there are the examples of a hydrocarbon group where the number of carbon atoms is 1 to 4 and more preferably 1 to 2, and a hetero atom such as an oxygen atom or a nitrogen atom. In the case where a fluorine atom is contained, the number of fluorine atoms is 2 or less and preferably is 1 or less. It is more preferable if no fluorine atoms are included.

As one preferable aspect of the substituent which is represented by X, there is the example of a group which is represented by —Y—$R_1$ in the general formula (B2) which is described below.

The acid generator (B) preferably is a compound which is represented by the general formula (B2) below in one aspect.

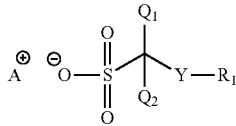
(B2)

In the general formula (B2), $A^+$, $Q_1$, and $Q_2$ are the same as the respective groups in the general formula (B1).

Y represents an alkylene group which may have a substituent by a fluorine atom, an ether bond, an ester bond, an amide atom, or a combination of two or more thereof.

$R_1$ represents a hydrogen atom or an alkyl group which may have a substituent.

The alkyl group which is represented by $R_1$ may have a linear chain shape or may have a branched chain shape. In a case where the alkyl group has a substituent, as the substituent, for example, there are the examples of a hydroxyl group, a halogen atom, a cyano group, a carboxyl group, a carbonyl group, and the like.

The number of carbon atoms which are included in the group represented by —Y—$R_1$ is, for example, preferably 1 to 4 and is more preferably 1 to 2. In addition, in a case where a fluorine atom is contained, the number of fluorine atoms is 2 or less and is more preferably 1 or less.

Specific examples of the anion structure in the compound (B) which is represented by the general formulae (B1) or (B2) are shown below with molecular weights (Mw).

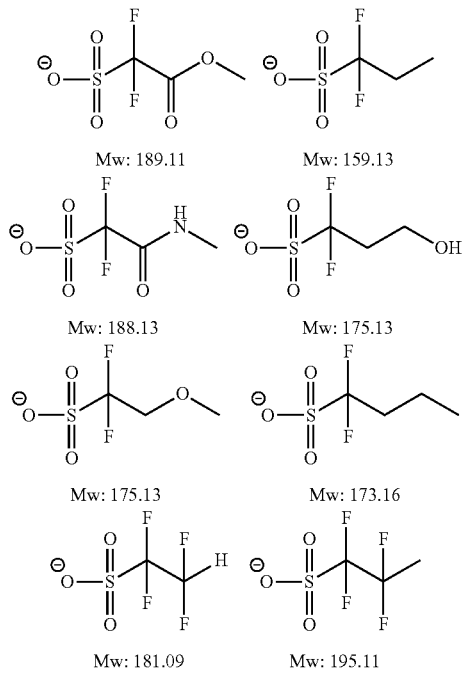

As the sulfonium cation or the iodonium cation which is represented by $A^+$ in the general formulae (B1) and (B2), for example, there are the examples of cations which are represented by the general formulae (ZI') and (ZII') below.

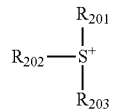
ZI'

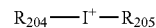
ZII'

In the general formula (ZI'),
$R_{201}$, $R_{202}$, and $R_{203}$ each independently represent an organic group. The carbon number of the organic group is typically 1 to 30 and is preferably 1 to 20.

In addition, a ring structure may be formed by bonding two out of $R_{201}$ to $R_{203}$, and an oxygen atom, a sulfur atom, an ester bond, an amide bond, or a carbonyl group may be included in the ring. As the group which is formed by the bonding of two out of $R_{201}$ to $R_{203}$, there can be the example of an alkylene group (for example, a butylene group and a pentylene group).

In the general formula (ZII'), $R_{204}$ and $R_{205}$ each independently represent an aryl group, an alkyl group, or a cycloalkyl group.

First, the general formula (ZI') will be described in detail.

As the organic groups of $R_{201}$, $R_{202}$, and $R_{203}$ in the general formula (ZI'), for example, there can be the examples of the groups which correspond to the groups which are represented in cations (ZI-1), (ZI-2), (ZI-3), (ZI-4) which will be described later.

Here, there may be a compound with a plurality of structures which are represented by the general formula (ZI'). For example, at least one of the cations in $R_{201}$ to $R_{203}$ which are represented by the general formula (ZI') may be a compound with a structure where it is bonded to another one of the cations in $R_{201}$ to $R_{203}$ which is represented by the general formula (ZI').

Furthermore, as a preferable (ZI') component, there can be the examples of cations (ZI-1), (ZI-2), (ZI-3), (ZI-4) which will be described later.

The cation (ZI-1) is an arylsulfonium compound where at least one of $R_{201}$ to $R_{203}$ in the general formula (ZI') above is an aryl group, that is, is an arylsulfonium cation.

In the arylsulfonium cations, all of the $R_{201}$ to $R_{203}$ may be aryl groups or a portion of $R_{201}$ to $R_{203}$ may be an aryl group and the remainder may be an alkyl group or a cycloalkyl group.

As the arylsulfonium cation, for example, there can be the examples of a triarylsulfonium cation, a diarylalkylsulfonium cation, an aryldialkylsulfonium cation, a diarylcycloalkylsulfonium cation, and an aryldicycloalkylsulfonium cation.

The aryl group of the arylsulfonium cation is preferably a phenyl group or a naphthyl group and more preferably a phenyl group. The aryl group may be an aryl group with a heterocyclic structure with an oxygen atom, a nitrogen atom, a sulfur atom or the like. As the heterocyclic structure, for example, there can be the examples of pyrrole, furan, thiophene, indole, benzofuran, benzothiophene, or the like. In a case where the arylsulfonium cation has two or more aryl groups, the two or more aryl groups may be the same or may be different.

An alkyl group or a cycloalkyl group which the arylsulfonium cation has as required is preferably a linear or branched alkyl group with a carbon number of 1 to 15 or a cycloalkyl group with a carbon number of 3 to 15. For example, there can be the examples of a methyl group, an ethyl group, a propyl group, an n-butyl group, a sec-butyl group, a t-butyl group, a cyclopropyl group, a cyclobutyl group, a cyclohexyl group, or the like.

The aryl group, alkyl group or cycloalkyl group represented by $R_{201}$ to $R_{203}$ may have as a substituent an alkyl group (for example, with a carbon number of 1 to 15), a cycloalkyl group (for example, with a carbon number of 3 to 15), an aryl group (for example, with a carbon number of 6 to 14), an alkoxy group (for example, with a carbon number of 1 to 15), a halogen atom, a hydroxyl group or a phenylthio group. As a preferable substituent, there are a linear or branched alkyl group with a carbon number of 1 to 12, a cycloalkyl group with a carbon number of 3 to 12 and a linear, branched or cyclic alkoxy group with a carbon number of 1 to 12, and as a more preferable substituent, there are an alkyl group with a carbon number of 1 to 4 and an alkoxy group with a carbon number of 1 to 4. The substituents may be substituted into any one of the three of $R_{201}$ to $R_{203}$, or may be substituted into all three of $R_{201}$ to $R_{203}$. In a case where $R_{201}$ to $R_{203}$ represent an aryl group, the substituent preferably is substituted at the p-position of the aryl group.

Next, the cation (ZI-2) will be described.

The cation (ZI-2) is a cation where $R_{201}$ to $R_{203}$ in the general formula (ZI') each independently represent an organic group with no aromatic ring. Here, an aromatic ring includes an aromatic ring which contains a hetero atom.

The organic group with no aromatic ring as $R_{201}$ to $R_{203}$ typically has a carbon number of 1 to 30 and preferably a carbon number of 1 to 20.

$R_{201}$ to $R_{203}$ each independently preferably represent an alkyl group, a cycloalkyl group, an allyl group or a vinyl group, and more preferably are a linear or branched 2-oxoalkyl group, a 2-oxocycloalkyl group and an alkoxycarbonylmethyl group, and particularly preferable are a linear or branched 2-oxoalkyl group.

As a preferable alkyl group and cycloalkyl group of $R_{201}$ to $R_{203}$, there can be the examples of a linear or branched alkyl group with a carbon number of 1 to 10 (for example, a methyl group, an ethyl group, a propyl group, a butyl group or a pentyl group) and a cycloalkyl group with a carbon number of 3 to 10 (a cyclopentyl group, a cyclohexyl group or a norbornyl group). More preferably, as the alkyl group, there can be the examples of a 2-oxoalkyl group and an alkoxycarbonylmethyl group. As the cycloalkyl group, there can be the example of a 2-oxocycloalkyl group.

The 2-oxoalkyl group may be linear or branched, and preferably, there can be the examples of a group which has >C=O at the 2-position of the alkyl group.

As the 2-oxocycloalkyl group, preferably, there can be the example of a group which has >C=O at the 2-position of the cycloalkyl group.

As the alkoxy group of the alkoxycarbonylmethyl group, preferably, there can be the examples of an alkoxy group with a carbon number of 1 to 5 (a methoxy group, an ethoxy group, a propoxy group, a butoxy group and a pentoxy group).

$R_{201}$ to $R_{203}$ may be further substituted with a halogen atom, an alkoxy group (for example, with a carbon number of 1 to 5), a hydroxyl group, a cyano group or a nitro group.

The cation (ZI-3) is a cation which is represented by the general formula (ZI-3) below and is a cation with a phenacylsulfonium structure.

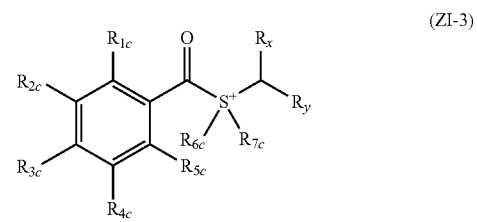

In the general formula (ZI-3), $R_{1c}$ and $R_{5c}$ each independently represent a hydrogen atom, an alkyl group, a cycloalkyl group, an alkoxy group, a halogen atom, or a phenylthio group.

$R_{6c}$ and $R_{7c}$ each independently represent a hydrogen atom, an alkyl group, a cycloalkyl group, a halogen atom, a cyano group, or an aryl group.

$R_x$ and $R_y$ each independently represent an alkyl group, a cycloalkyl group, a 2-oxoalkyl group, a 2-oxocycloalkyl group, an alkoxycarbonyl alkyl group, an allyl group, or a vinyl group.

Two or more out of $R_{1c}$ to $R_{5c}$, $R_{6c}$ and $R_{7c}$, and $R_x$ and $R_y$ may form a ring structure by being bonded to each other, and the ring structure may include an oxygen atom, a sulfur atom, an ester bond, or an amide bond. There can be the examples of a butylene group, a pentylene group, and the like as a group which is formed by bonding two or more out of $R_{1c}$ to $R_{5c}$, $R_{6c}$ and $R_{7c}$ and $R_x$ and $R_y$.

The alkyl group of $R_{1c}$ and $R_{7c}$ may be either linear or branched, and for example, there can be an alkyl group with a carbon number of 1 to 20, and more preferably, a linear or branched alkyl group with a carbon number of 1 to 12 (for example, a methyl group, an ethyl group, a linear or branched propyl group, a linear or branched butyl group, and a linear or branched pentyl group), and as the cycloalkyl group, for example, there can be the example of a cycloalkyl group with a carbon number of 3 to 8 (for example, a cyclopentyl group and a cyclohexyl group).

As the alkoxy group of $R_{1c}$ and $R_{5c}$, there may be any of a linear, branched, or ring shape, and for example, there can be the examples of an alkoxy group with a carbon number of 1 to 10, and more preferably, a linear or branched alkoxy group with a carbon number of 1 to 5 (for example, a methoxy group, an ethoxy group, a linear or branched propoxy group, a linear or branched butoxy group, or a linear or branched pentoxy group) or an alkoxy group with a ring shape with a carbon number of 3 to 8 (for example, a cyclopentyloxy group or a cyclohexyloxy group).

Preferably, any out of $R_{1c}$ and $R_{5c}$ is a chain or branched alkyl group, a cycloalkyl group, or a linear, branched, or ring shaped alkoxy group, and more preferably, the sum of the carbon number of $R_{1c}$ and $R_{5c}$ is 2 to 15. Due to this, solvent solubility is further improved and the generation of particles during storage is suppressed.

As the aryl group of $R_{6c}$ and $R_{7c}$, a carbon number of 5 to 15 is preferable, and for example, there can be the examples of a phenyl group and a naphthyl group.

In a case where a ring is formed by $R_{6c}$ and $R_{7c}$ being bonded, as a group which is formed by $R_{6c}$ and $R_{7c}$ being bonded, an alkylene group with a carbon number of 2 to 10 is preferable, and for example, there can be the examples of an ethylene group, a propylene group, a butylene group, a pentylene group, a hexylene group, and the like. In addition, the ring is formed by $R_{6c}$ and $R_{7c}$ being bonded may have a hetero atom such as an oxygen atom in the ring.

As the alkyl group and the cycloalkyl group of $R_x$ and $R_y$, there can be the examples of the alkyl group and the cycloalkyl group which is the same as in $R_{1c}$ and $R_{7c}$.

As the 2-oxoalkyl group and the 2-oxocycloalkyl group, there can be the example of a group which has >C=O at the 2-position of the alkyl group and the cycloalkyl group as $R_{1c}$ and $R_{7c}$.

The alkoxy group in the alkoxycarbonylalkyl group can be an alkoxy group which is the same as in $R_{1c}$ and $R_{5c}$, and as the alkyl group, there can be the examples of an alkyl group with a carbon number of 1 to 12, and preferably, a linear alkyl group with a carbon number of 1 to 5 (for example, a methyl group and an ethyl group).

The allyl group has no particular limitations, but may be an allyl group which is unsubstituted or which is substituted with a monocyclic or polycyclic cycloalkyl group.

The vinyl group has no particular limitations, but may be a vinyl group which is unsubstituted or which is substituted with a monocyclic or polycyclic cycloalkyl group.

As a ring structure which may be formed by the bonding of $R_x$ and $R_y$, there are the examples of a ring with 5 members or 6 members where divalent $R_x$ and $R_y$ (for example, a methylene group, an ethylene group, a propylene group, and the like) are formed along with a sulfur atom in the general formula (ZI'-3), and particularly preferably, a ring with five members (that is, a tetrahydrothiophene ring).

$R_x$ and $R_y$ are preferably an alkyl group and a cycloalkyl group with a carbon number of 4 or more, more preferably 6 or more, and even more preferably an alkyl group and a cycloalkyl group with a carbon number of 8 or more.

There are the specific examples of the cation (ZI-3) below.

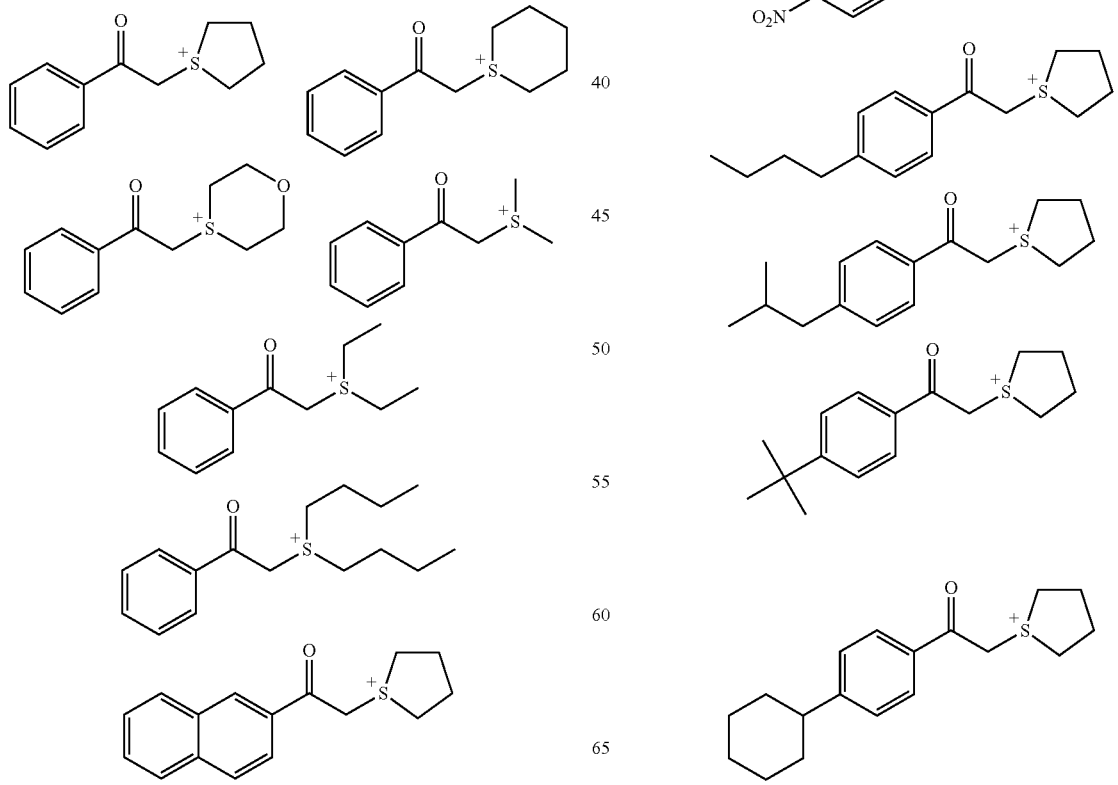

-continued

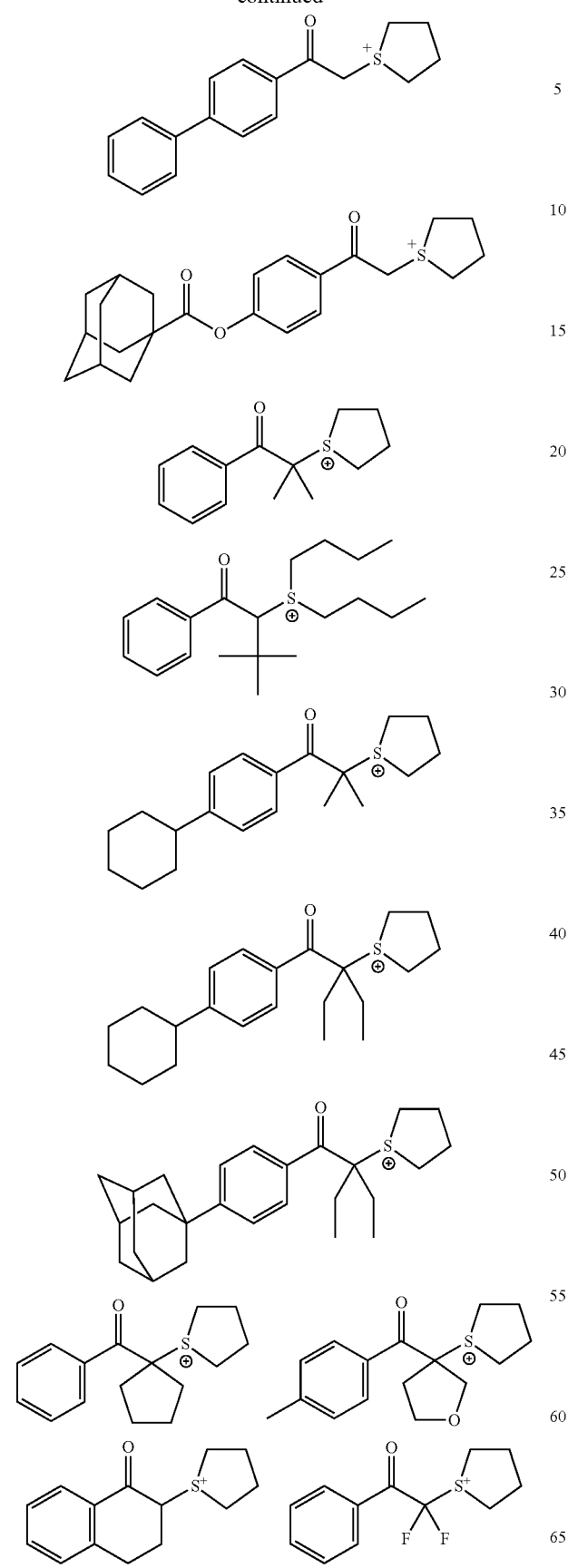
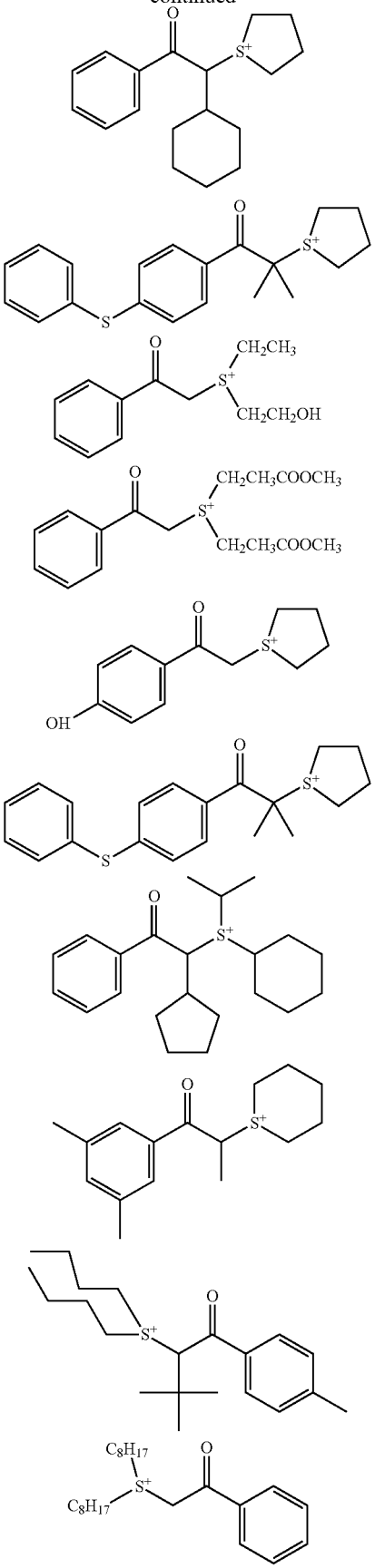

The cation (ZI-4) is a cation which is represented by the general formula (ZI-4) below.

$$(ZI-4)$$

In the general formula (ZI-4), $R_{13}$ represents a hydrogen atom, a fluorine atom, a hydroxyl group, an alkyl group, a cycloalkyl group, an alkoxy group, an alkoxycarbonyl group, or a group with a monocyclic or polycyclic cycloalkyl skeleton. These groups may have a substituent.

$R_{14}$ each independently represent an alkyl group, a cycloalkyl group, an alkoxy group, an alkoxycarbonyl group, an alkylcarbonyl group, an alkylsulfonyl group, a cycloalkylsulfonyl group, or a group with a monocyclic or polycyclic cycloalkyl skeleton in a case of a plurality thereof. These groups may have a substituent.

$R_{15}$ each independently represent an alkyl group, a cycloalkyl group, or a naphthyl group. A ring may be formed by two of $R_{15}$ being bonded to each other. This group may have a substituent.

l is an integer of 0 to 2.

r is an integer of 0 to 8.

In the general formula (ZI-4), the alkyl groups represented by $R_{13}$, $R_{14}$, and $R_{15}$ may be linear or branched and preferably each has a carbon number of 1 to 10, and there can be the examples of a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group, and the like. Of these alkyl groups, a methyl group, an ethyl group, an n-butyl group, a t-butyl group and the like are preferable.

As the cycloalkyl groups represented by $R_{13}$, $R_{14}$ and $R_{15}$, there are the examples of cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl, adamantyl, and the like. Cyclopropyl, cyclopentyl, cyclohexyl and cyclooctyl are especially preferable.

The alkoxy group of $R_{13}$ and $R_{14}$ is linear or branched and preferably has a carbon number of 1 to 10, and for example, there can be the examples of a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferable.

The alkoxycarbonyl group represented by $R_{13}$ and $R_{14}$ is linear or branched and preferably has a carbon number of 2 to 11, and for example, there can be the examples of a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are preferable.

As the group of $R_{13}$ and $R_{14}$ with a monocyclic or polycyclic cycloalkyl skeleton, for example there are the examples of a monocyclic or polycyclic cycloalkyloxy group and an alkoxy group with a monocyclic or polycyclic cycloalkyl group. These groups may further have a substituent.

As the monocyclic or polycyclic cycloalkyloxy group of $R_{13}$ and $R_{14}$, the total carbon number is 7 or more is preferable and a total carbon number of 7 or more and 15 or less is more preferable. In addition, a group with a monocyclic cycloalkyl skeleton is preferable. The monocyclic cycloalkyloxy group with a total carbon number of 7 or more represents a monocyclic cycloalkyloxy group with a substituent such as any of an alkyl groups such as a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group, or an iso-amyl group, a hydroxyl group, a halogen atom (fluorine, chlorine, bromine, iodine), a nitro group, a cyano group, an amide group, a sulfonamide group, an alkoxy group such as a methoxy group, an ethoxy group, a hydroxyethoxy group, a propoxy group, a hydroxypropoxy group, or a butoxy group, an alkoxycarbonyl group such as a methoxycarbonyl group or an ethoxycarbonyl group, an acyl group such as a formyl group, an acetyl group, or a benzoyl group, an acyloxy group such as an acetoxy group or a butyryloxy group, or a carboxy group on a cycloalkyloxy group such as a cyclopropyloxy group, a cyclobutyloxy group, a cyclopentyloxy group, a cyclohexyloxy group, a cycloheptyloxy group, a cyclooctyloxy group, or a cyclododecanonyloxy group and the total carbon number where an arbitrary substituent is combined on a cycloalkyl group is 7 or more.

In addition, as the polycyclic cycloalkyloxy group with a total carbon number of 7 or more, there are the examples of a norbornyloxy group, a tricyclodecanyloxy group, a tetracyclodecanyloxy group, or an adamantanyloxy group.

As the cycloalkyl group of $R_{13}$ and $R_{14}$ with a monocyclic or polycyclic cycloalkyl skeleton, the total carbon number is 7 or more is preferable and a total carbon number of 7 or more and 15 or less is more preferable. In addition, an alkyloxy group with a monocyclic cycloalkyl skeleton is preferable. The alkyloxy group with a monocyclic cycloalkyl skeleton with a total carbon number of 7 or more is the substitution of a monocyclic cycloalkyl group which may have the substituent described above on an alkyloxy group such as methoxy, ethoxy, propoxy, butoxy, pentyloxy, hexyloxy, heptoxy, octyloxy, dodecyloxy, 2-ethylhexyl oxy, isopropoxy, sec-butoxy, t-butoxy, or iso-amyloxy and represents a group where the total carbon number which includes the substituent is 7 or more. There are the examples of a cyclohexylmethoxy group, a cyclopentylethoxy group, a cyclohexylethoxy group and the like, and a cyclohexylmethoxy group is preferable.

As the alkyloxy group with a polycyclic cycloalkyl skeleton with a total carbon number of 7 or more, there are the examples of a norbornylmethoxy group, a norbornylethoxy group, a tricyclodecanyl methoxy group, a tricyclodecanylethoxy group, a tetracyclodecanylmethoxy group, a tetracyclodecanylethoxy group, an adamantanylmethoxy group, and an adamantanylethoxy group, and a norbornylmethoxy group and a norbornylethoxy group are preferable.

As the alkyl group of the alkylcarbonyl group of $R_{14}$, there are the same specific examples as $R_{13}$ to $R_{15}$ described above.

The alkylsulfonyl group and the cycloalkylsulfonyl group of $R_{14}$ have a linear, branched or ring shape and preferably have a number of carbon atoms of 1 to 10, and for example, there can be the examples of a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group and the like. Of the alkylsulfonyl group and the cycloalkylsulfonyl group, a methanesulfonyl group, an ethanesulfonyl group, an n-propanesulfonyl group, an n-butanesulfonyl group, a cyclopentanesulfonyl group, a cyclohexanesulfonyl group and the like are preferable.

As a substituent which each group may have, there can be the examples of a halogen atom (e.g., a fluorine atom), a hydroxyl group, a carboxyl group, a cyano group, a nitro group, an alkoxy group, an alkoxyalkyl group, an alkoxycarbonyl group, an alkoxycarbonyloxy group or the like.

As the alkoxy group described above, for example, there can be the example of a linear, branched or ring shaped alkoxy group with a number of carbon atoms of 1 to 20 such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group or a cyclohexyloxy group.

As the alkoxyalkyl group described above, for example, there can be the example of a linear, branched or ring shaped alkoxyalkyl group with a number of carbon atoms of 2 to 21 such as a methoxymethyl group, an ethoxymethyl group, a 1-methoxyethyl group, a 2-methoxyethyl group, a 1-ethoxyethyl group or a 2-ethoxyethyl group.

As the alkoxycarbonyl group described above, for example, there can be the example of a linear, branched or ring shaped alkoxycarbonyl group with a number of carbon atoms of 2 to 21 such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

As the alkoxycarbonyloxy group described above, for example, there can be the example of a linear, branched or ring shaped alkoxycarbonyloxy group with a number of carbon atoms 2 to 21 such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

The ring structure that may be formed by the bonding of the two $R_{15}$ to each other is preferably an example of a ring with 5 members or 6 members which is formed by two divalent $R_{15}$ with the sulfur atom of the general formula (ZI-4) and is particularly preferably a ring with 5 members (that is, a tetrahydrothiophene ring), and may be condensed with an aryl group or a cycloalkyl group. The divalent $R_{15}$ may have substituents, and as the substituent, for example, there can be the examples of a hydroxyl group, a carboxy group, a cyano group, a nitro group, an alkoxy group, an alkoxyalkyl group, an alkoxycarbonyl group, an alkoxycarbonyloxy group and the like. The $R_{15}$ of the general formula (ZI-4) preferably is a methyl group, an ethyl group, a naphthyl group, a divalent group where two $R_{15}$ are bonded to each other so as to form a tetrahydrothiophene ring structure with the sulfur atom, or the like.

As the substituents which $R_{13}$ and $R_{14}$ can have, a hydroxyl group, an alkoxy group, an alkoxycarbonyl group and a halogen atom (in particular, a fluorine atom) are preferable.

l is preferably 0 or 1 and is more preferably 1.

r is preferably 0 to 2.

Below, there are the specific examples of the cation (ZI-4).

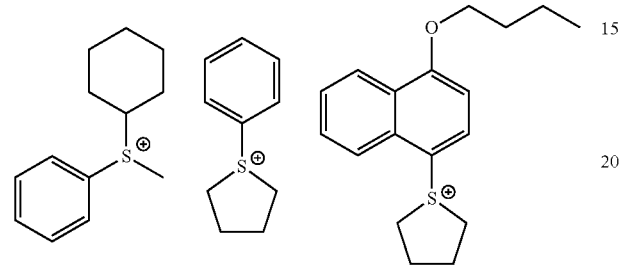

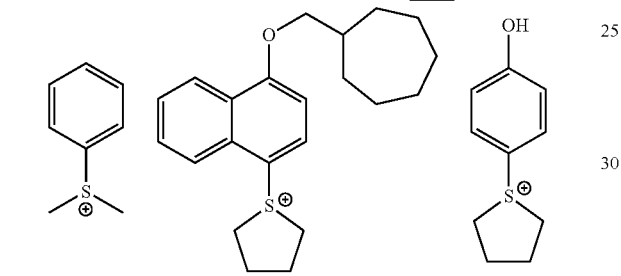

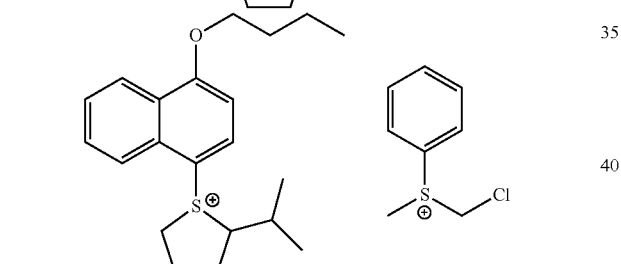

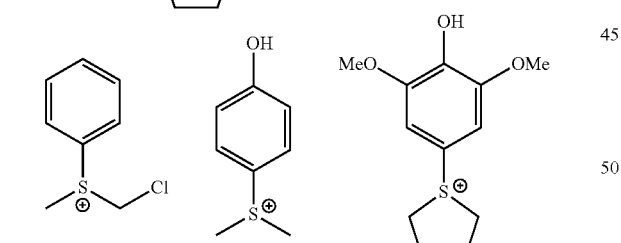

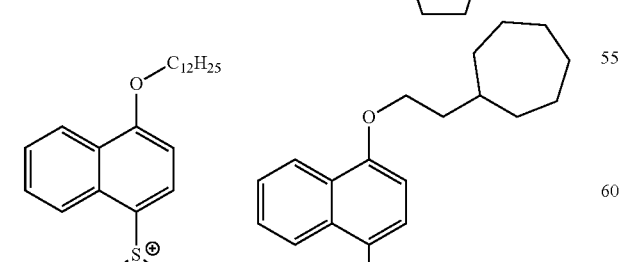

-continued

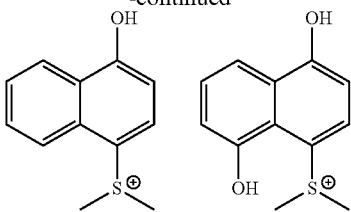

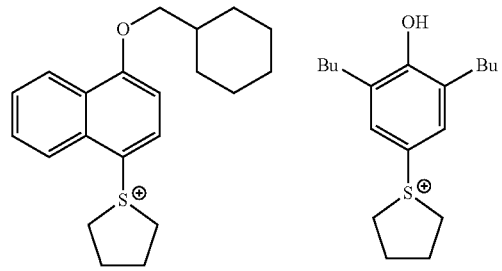

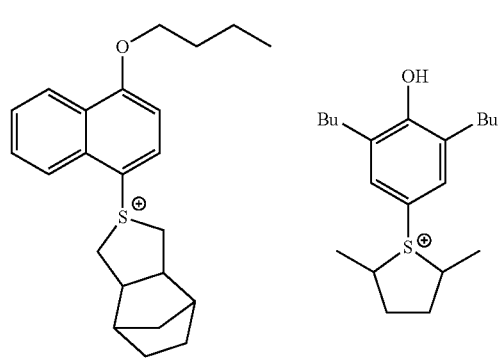

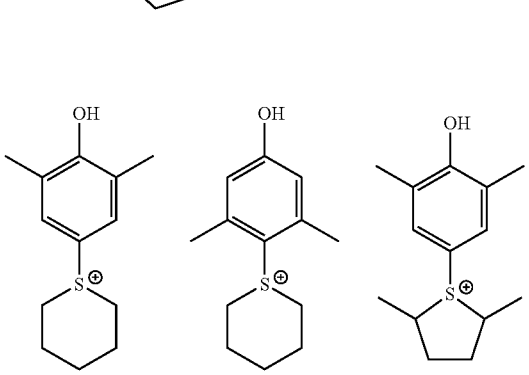

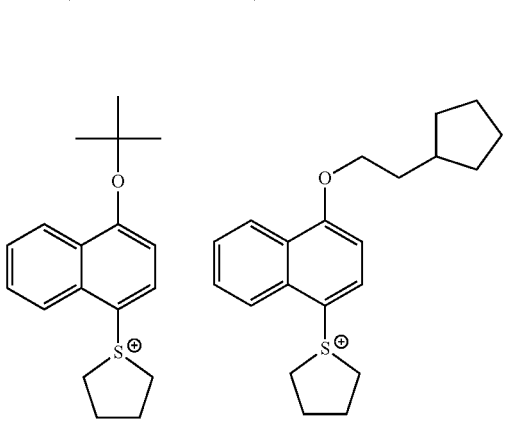

57
-continued
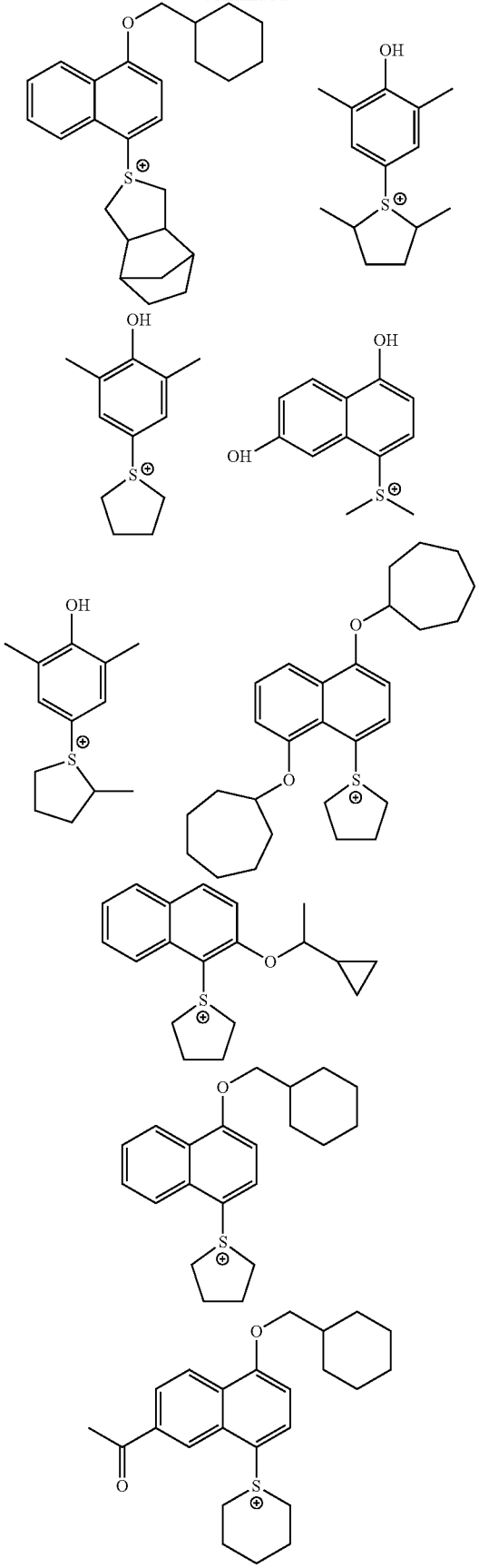
58
-continued
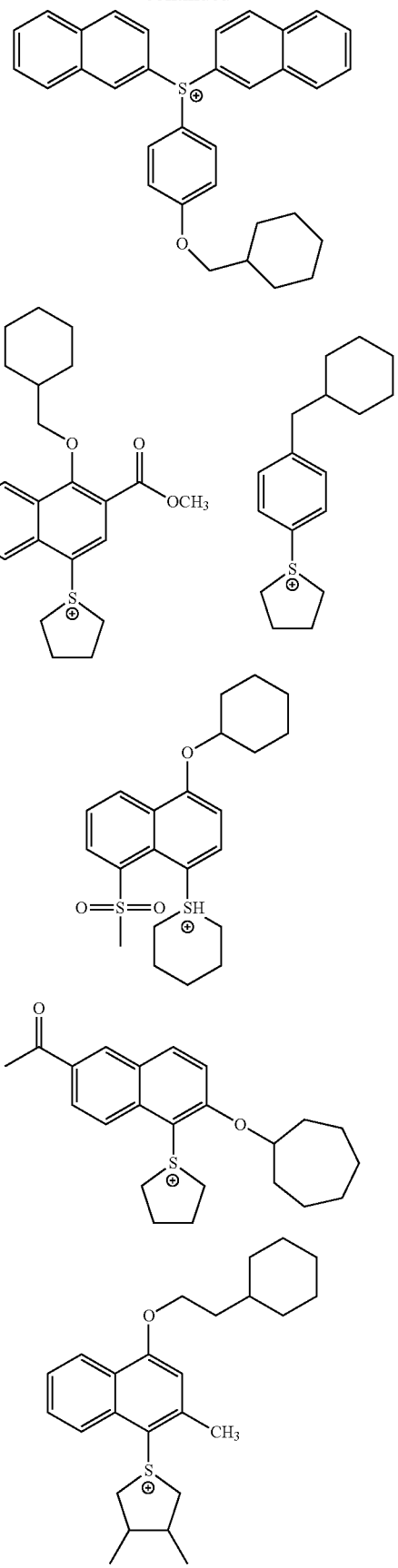

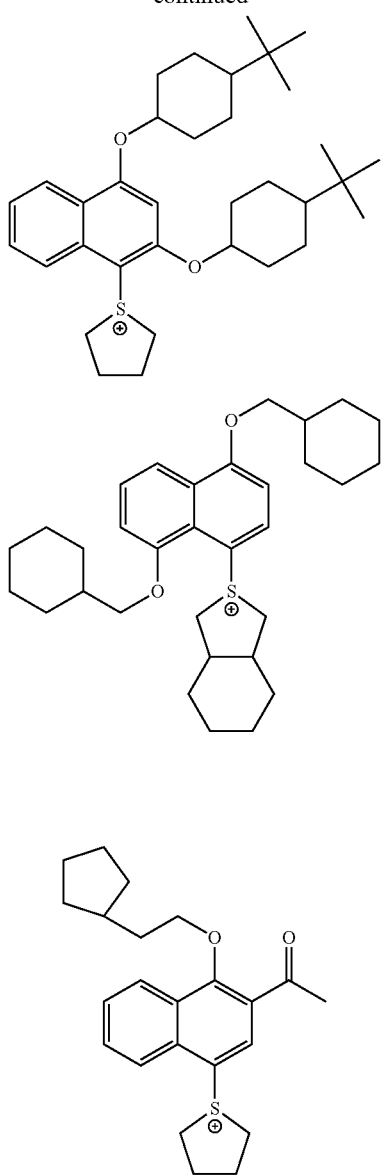
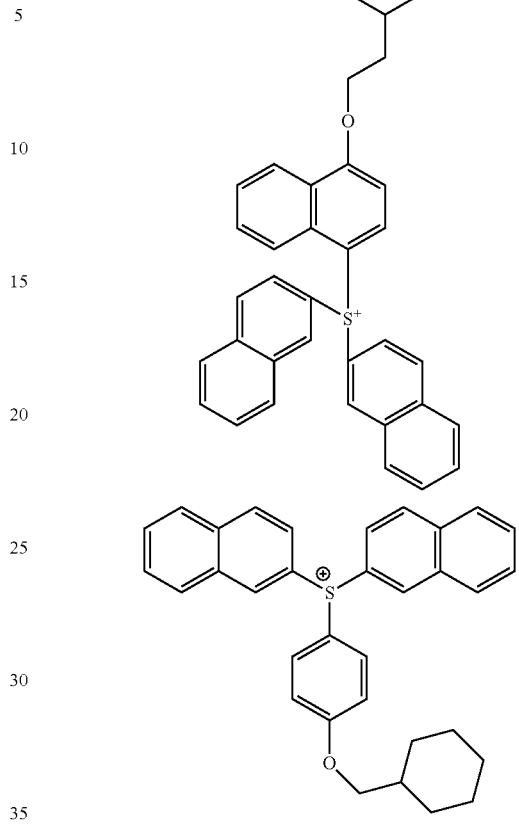

Next, the iodonium cation which is represented by the general formula (ZIP) will be described.

In the general formula (ZII'), $R_{204}$ and $R_{205}$ each independently represent an aryl group, an alkyl group or a cycloalkyl group as described above.

The aryl group of $R_{204}$ and $R_{205}$ is preferably a phenyl group or a naphthyl group and more preferably a phenyl group. The aryl group of $R_{204}$ and $R_{205}$ may be an aryl group with a heterocyclic structure with an oxygen atom, a nitrogen atom, a sulfur atom or the like. As the heterocyclic structure, for example, there can be the examples of pyrrole, furan, thiophene, indole, benzofuran, benzothiophene, or the like.

The alkyl group or cycloalkyl group of $R_{204}$ and $R_{205}$ is preferably a linear or branched alkyl group with a carbon number of 1 to 10 (for example, a methyl group, an ethyl group, a propyl group, a butyl group or a pentyl group) or a cycloalkyl group with a carbon number of 3 to 10 (a cyclopentyl group, a cyclohexyl group or a norbornyl group).

The aryl group, the alkyl group or the cycloalkyl group of $R_{204}$ and $R_{205}$ may have a substituent. As a substituent of the aryl group, alkyl group or cycloalkyl group of $R_{204}$ and $R_{205}$ may have, for example, there can be the examples of an alkyl group (for example, with a carbon number of 1 to 15), a cycloalkyl group (for example, with a carbon number of 3 to 15), an aryl group (for example, with a carbon number of 6 to 15), an alkoxy group (for example, with a carbon number of 1 to 15), a halogen atom, a hydroxyl group, a phenylthio group or the like.

There are the specific examples of the acid generator (B) which are represented by the general formula (B1) below.

1
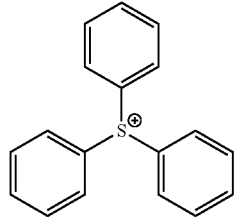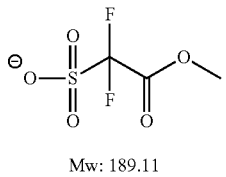
Mw: 189.11

2
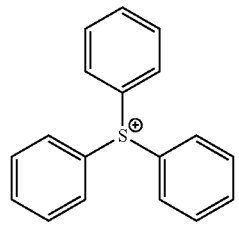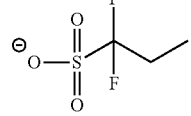
Mw: 159.13

3
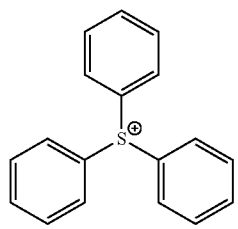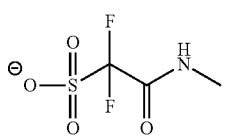
Mw: 188.13

4
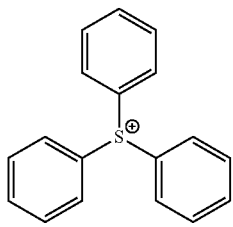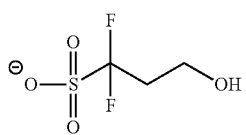
Mw: 175.13

5
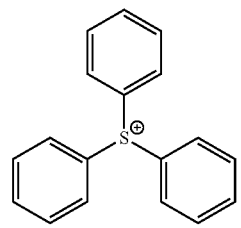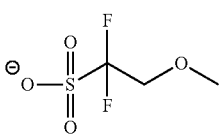
Mw: 175.13

6
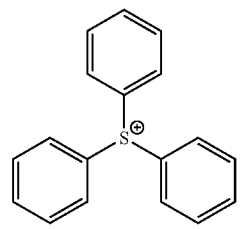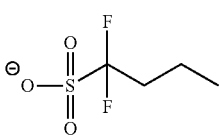
Mw: 173.16

-continued

7
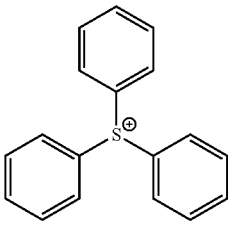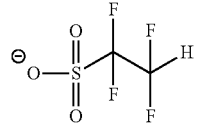
Mw: 181.09

8
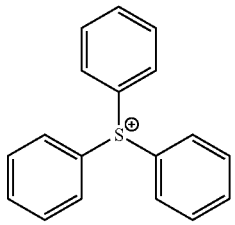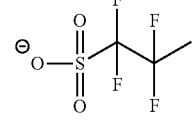
Mw: 195.11

9
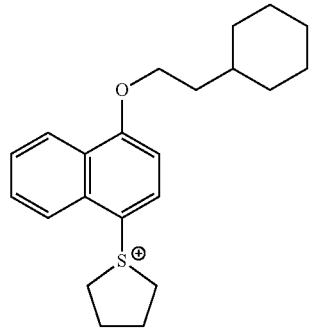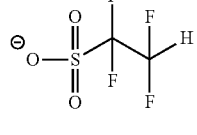
Mw: 181.09

10
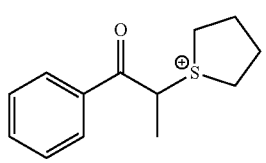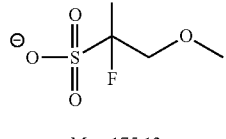
Mw: 175.13

11
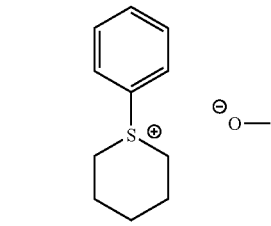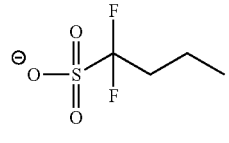
Mw: 173.16

The photo-acid generator (B) which is represented by the general formula (B1) can use a single type or a combination of two or more types.

The content of the acid generator (B) is preferably 0.5 to 30 mass %, more preferably 1.0 to 20 mass %, and even more preferably 1.5 to 10 mass % with the total solid content of the composition as a reference.

Other Acid Generators

The composition of the present invention may contain acid generators other than the compound (B) which is represented by the general formula (B1).

As acid generators which can be used together with the compound (B), it is possible to appropriately select and use a common compound which generates an acid due to irradiation of actinic rays or radiation used for a micro resist, a photo-initiator for optical cationic polymerization, a photo-initiator for optical radical polymerization, an optical achromatizing agent, an optical discoloring agent, or a mixture thereof.

As the acid generator, for example, there can be the examples of a diazonium salt, a phosphonium salt, a sulfonium salt, an iodonium salt, an imide sulfonate, an oxime sulfonate, a diazo disulfone, a disulfone, and an o-nitrobenzyl sulfonate.

In addition, a compound with a group which generates an acid due to irradiation of actinic rays or radiation or a compound which is introduced to a main chain or a side chain of a polymer, that is, a compound which is described in U.S. Pat. No. 3,849,137B, EP3914407B, JP1988-26653A (JP-S63-26653A), JP1980-164824A (JP-S55-164824A), JP1987-69263A (JP-S62-69263A), JP1988-146038A (JP-S63-146038A), JP1988-163452A (JP-S63-163452A), JP1987-153853A (JP-S62-153853A), and JP1988-146029A (JP-S63-146029A) can be used.

Furthermore, a compound which generates an acid due to light described in U.S. Pat. No. 3,779,778B, EP126,712B, and the like.

As a preferable compound among the acid generators, there can be the examples of the compounds which are represented in the general formulae (ZI), (ZII), and (ZIII).

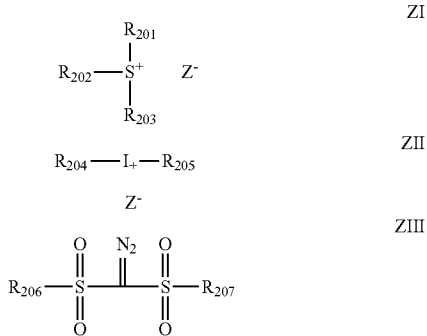

In the general formula (ZI), $R_{201}$, $R_{202}$, and $R_{203}$ each independently represent an organic group. The organic group is the same as in $R_{201}$, $R_{202}$, and $R_{203}$ in the general formula (ZI'), and as the $S(R_{201})(R_{202})(R_{203})^+$, for example, there are the examples of the cations (ZI-1), (ZI-2), (ZI-3), and (ZI-4).

$Z^-$ represents a non-nucleophilic anion.

The non-nucleophilic anion which is represented by $Z^-$ is an anion where the capacity for a nucleophilic reaction to occur is remarkably low and an anion which is able to suppress decomposition over time due to an intramolecular nucleophilic reaction. Due to this, the effect of suppressing line width variation over time is improved in the composition of the present invention.

As the non-nucleophilic anion, for example, there can be the example of a sulfonate anion, a carboxylate anion, a sulfonylimide anion, a bis(alkylsulfonyl)imide anion and a tris(alkylsulfonyl)methyl anion.

As the sulfonate anion, for example, there can be the example of an aliphatic sulfonate anion, an aromatic sulfonate anion and a camphorsulfonate anion.

As the carboxylate anion, for example, there can be the example of an aliphatic carboxylate anion, an aromatic carboxylate anion and an aralkylcarboxylate anion.

The aliphatic portion in the aliphatic sulfonate anion may be an alkyl group or a cycloalkyl group and is preferably an alkyl group with a carbon number of 1 to 30 or a cycloalkyl group with a carbon number of 3 to 30, and there can be the examples of a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group, a cyclopropyl group, a cyclopentyl group, a cyclohexyl group, an adamantyl group, a norbornyl group and a bornyl group.

The aromatic group in the aromatic sulfonate anion is preferably an aryl group with a carbon number of 6 to 14, and there can be examples of a phenyl group, a tolyl group and a naphthyl group.

The alkyl group, the cycloalkyl group and the aryl group in the aliphatic sulfonate anion and aromatic sulfonate anion may have a substituent. As the substituent of the alkyl group, the cycloalkyl group and the aryl group in the aliphatic sulfonate anion and aromatic sulfonate anion, there can be the examples of a nitro group, a halogen atom (a fluorine atom, a chlorine atom, a bromine atom, an iodine atom), a carboxyl group, a hydroxyl group, an amino group, a cyano group, an alkoxy group (preferably with a carbon number of 1 to 15), a cycloalkyl group (preferably with a carbon number of 3 to 15), an aryl group (preferably with a carbon number of 6 to 14), an alkoxycarbonyl group (preferably with a carbon number of 2 to 7), an acyl group (preferably with a carbon number of 2 to 12), an alkoxycarbonyloxy group (preferably with a carbon number of 2 to 7), an alkylthio group (preferably with a carbon number of 1 to 15), an alkylsulfonyl group (preferably with a carbon number of 1 to 15), an alkyliminosulfonyl group (preferably with a carbon number of 2 to 15), an aryloxysulfonyl group (preferably with a carbon number of 6 to 20), an alkylaryloxysulfonyl group (preferably with a carbon number of 7 to 20), a cycloalkylaryloxysulfonyl group (preferably with a carbon number of 10 to 20), an alkyloxyalkyloxy group (preferably with a carbon number of 5 to 20), and a cycloalkylalkyloxyalkyloxy group (preferably with a carbon number of 8 to 20). With regard to the aryl group or ring structure in each group, as the substituent, there are the further examples of an alkyl group (preferably with a carbon number of 1 to 15).

As the aliphatic portion in the aliphatic carboxylate anion, there are the examples of the same alkyl groups and cycloalkyl groups as in the aliphatic sulfonate anion.

As the aromatic group in the aromatic carboxylate anion, there are the examples of the same aryl groups as in the aromatic sulfonate anion.

As the aralkyl group in the aralkylcarboxylate anion, an aralkyl group with a carbon number of 6 to 12 is preferable, and for example, there are the examples of a benzyl group, a phenethyl group, a naphthylmethyl group, a naphthylethyl group and a naphthylbutyl group.

The alkyl group, the cycloalkyl group, the aryl group and the aralkyl group in the aliphatic carboxylate anion, aromatic carboxylate anion and aralkylcarboxylate anion may have a substituent. As the substituent of the alkyl group, the cycloalkyl group, the aryl group and the aralkyl group in the aliphatic carboxylate anion, aromatic carboxylate anion and aralkylcarboxylate anion, for example, there can be the same halogen atoms, alkyl groups, cycloalkyl groups, alkoxy groups and alkylthio groups as in the aromatic sulfonate anion.

As the sulfonylimide anion, for example, there is an example of saccharin anion.

As the alkyl group in the bis(alkylsulfonyl)imide anion and tris(alkylsulfonyl)methyl anion, an alkyl group with a carbon number of 1 to 5 is preferable, and for example, there can be the examples of a methyl group, an ethyl group, a propyl group, an isopropyl group, an n-butyl group, an isobutyl group, a sec-butyl group, a pentyl group and a neopentyl group. As the substituent of the alkyl group, there can be the examples of a halogen atom, an alkyl group which is substituted with a halogen atom, an alkoxy group, an alkylthio group, an alkyloxysulfonyl group, an aryloxysulfonyl group, and a cycloalkylaryloxysulfonyl group, and an alkyl group which is substituted with a fluorine atom is preferable. In addition, a structure where two alkyl groups in a bis(alkylsulfonyl)imide anion form a ring shaped structure by bonding to each other is preferable. In this case, the formed ring shaped structure is preferably a ring with 5 to 7 members.

As other examples of the non-nucleophilic anion, for example, there are fluorophosphates, fluoroborates, fluoroantimonates, and the like.

As the non-nucleophilic anion, an aliphatic sulfonate anion which is substituted by a fluorine atom at the α-position of the sulfonic acid, an aromatic sulfonate anion which is substituted by a fluorine atom or a group with a fluorine atom, a bis(alkylsulfonyl)imide anion with the alkyl group being substituted by a fluorine atom, or a tris(alkylsulfonyl)methide anion with the alkyl group being substituted by a fluorine atom is preferable. As the non-nucleophilic anion, a perfluoroaliphatic sulfonate anion with a carbon number of 4 to 8 or a benzenesulfonate anion with a fluorine atom is more preferably, and a nonafluorobutanesulfonate anion, a perfluorooctanesulfonate anion, a pentafluorobenzenesulfonate anion or a 3,5-bis(trifluoromethyl)benzenesulfonate anion is more preferable.

Next, the general formulae (ZII) and (ZIII) will be described.

$R_{204}$ to $R_{207}$ in the general formulae (ZII) and (ZIII), each independently represents an aryl group, an alkyl group or a cycloalkyl group. The aryl group, the alkyl group, and the cycloalkyl group in $R_{204}$ to $R_{207}$ are the same as the respective groups which are represented by $R_{204}$ and $R_{205}$ in the general formula (ZII') described above.

$Z^-$ represents a non-nucleophilic anion and there can be the same examples as the non-nucleophilic anion of $Z^-$ in the general formula (ZI).

As the acid generators which can be used in combination, there can be the further examples of the compounds which are represented by the general formulae (ZIV), (ZV), and (ZVI) below.

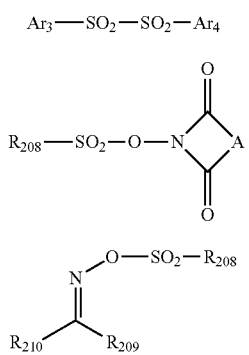

In general formulae (ZIV) to (ZVI), $Ar_3$ and $Ar_4$ each independently represent an aryl group.

$R_{208}$, $R_{209}$ and $R_{210}$ each independently represent an alkyl group, a cycloalkyl group, or an aryl group.

A represents an alkylene group, an alkenylene group or an arylene group.

Among the acid generators, the compounds represented by general formulae (ZI) to (ZIII) are preferable.

In addition, as the acid generator, a compound which generates an acid with one sulfonic acid group or imide group is preferable, a compound which generates a monovalent perfluoroalkanesulfonic acid, a compound which generates an aromatic sulfonic acid substituted by a group with a monovalent fluorine atom or a fluorine atom, or a compound which generates an imide acid substituted by a group with a monovalent fluorine atom or a fluorine atom is more preferable, and a sulfonium salt of fluoro-substituted alkanesulfonic acid, fluorine-substituted benzenesulfonic acid, fluorine-substituted imide acid or fluorine-substituted methide acid is still more preferable. In particular, the acid generator which can be used is particularly preferably a a fluoro-substituted alkanesulfonic acid where pKa of the acid generated is pKa=−1 or less, a fluoro-substituted benzenesulfonic acid or a fluoro-substituted imide acid, and the sensitivity is improved.

The content of the acid generator which can be used in combination with the acid generator (B) of the present invention can be arbitrarily determined in the range where there is no deterioration of the effects of the present invention.

Among the acid generators, there are the examples of the preferable examples below.

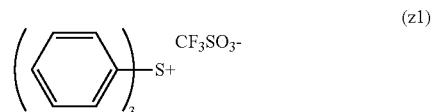

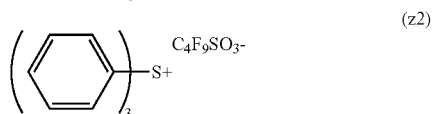

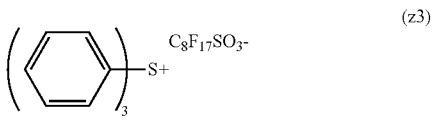

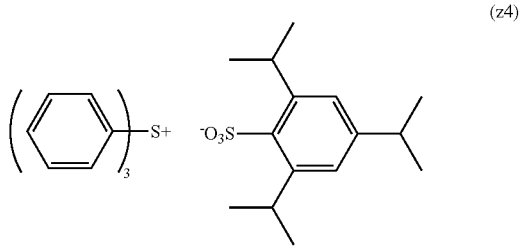

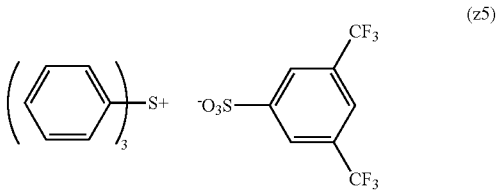

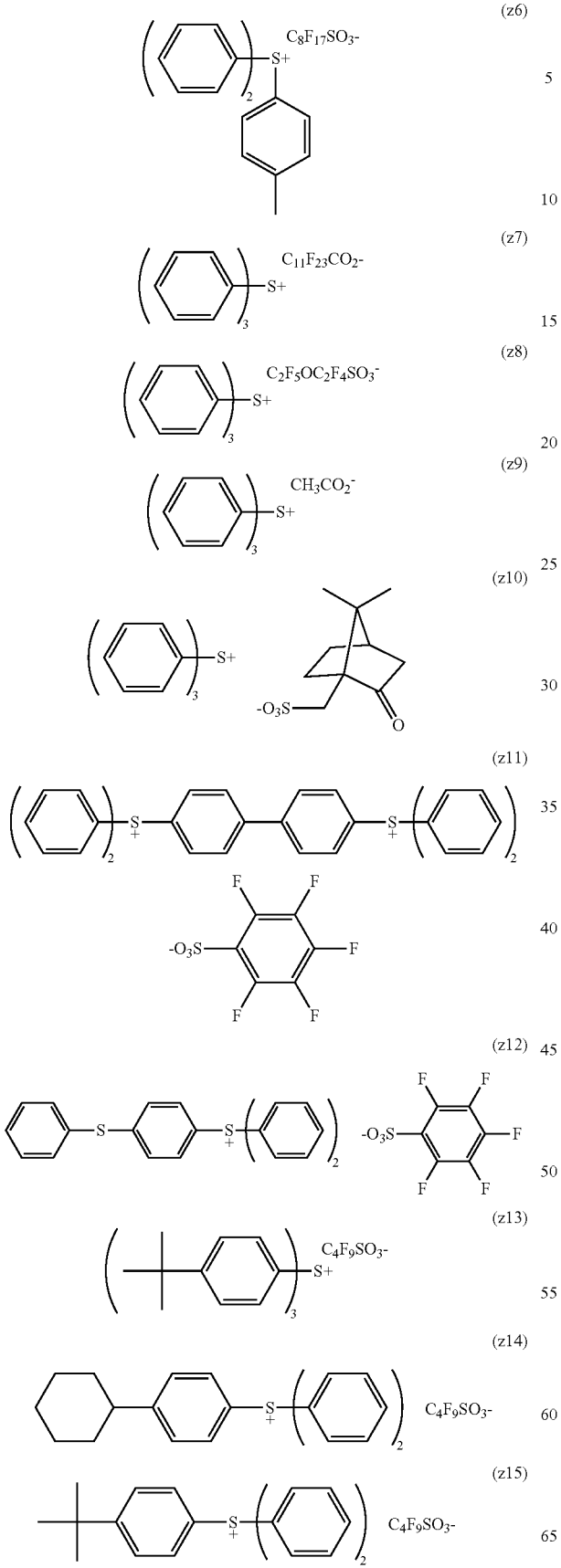
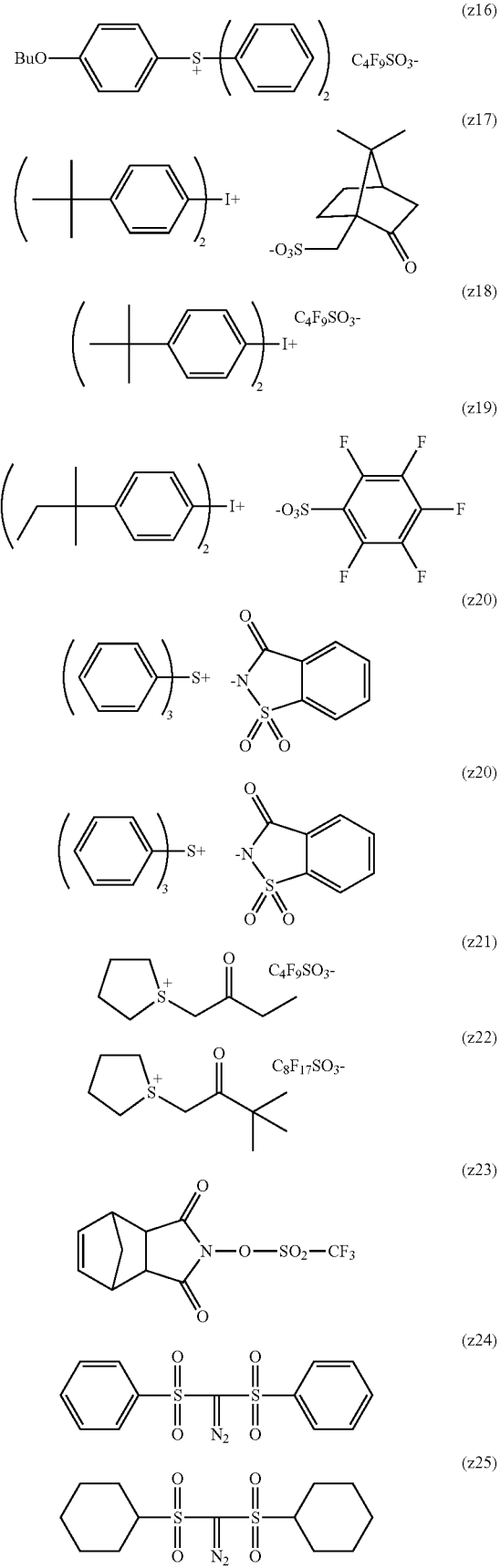

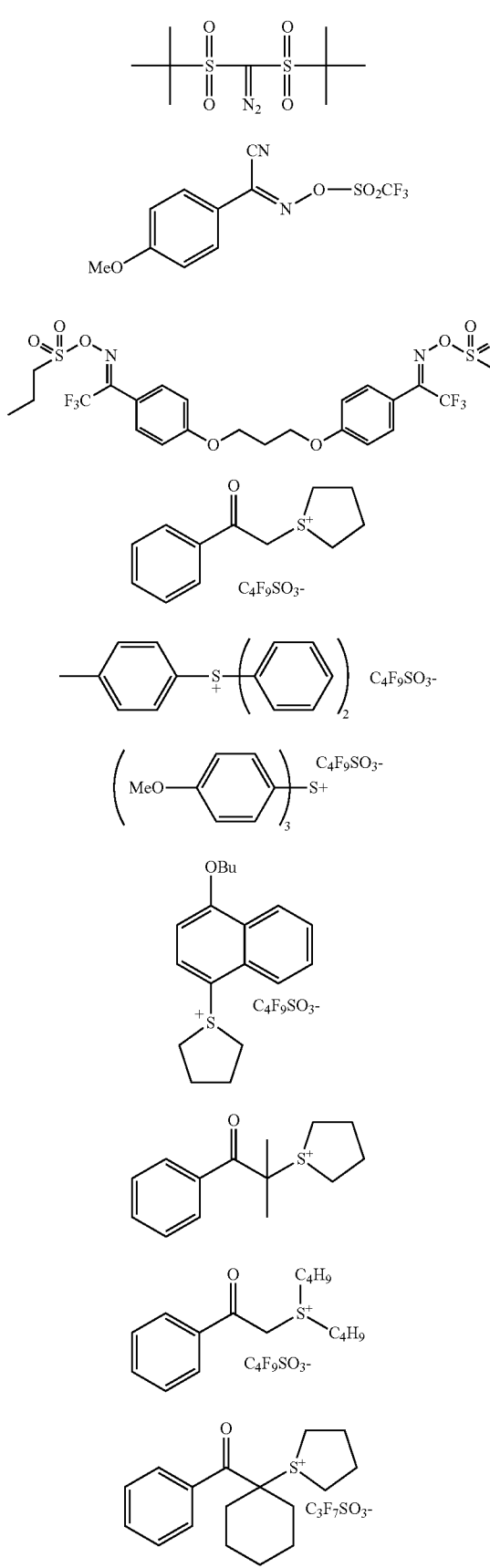
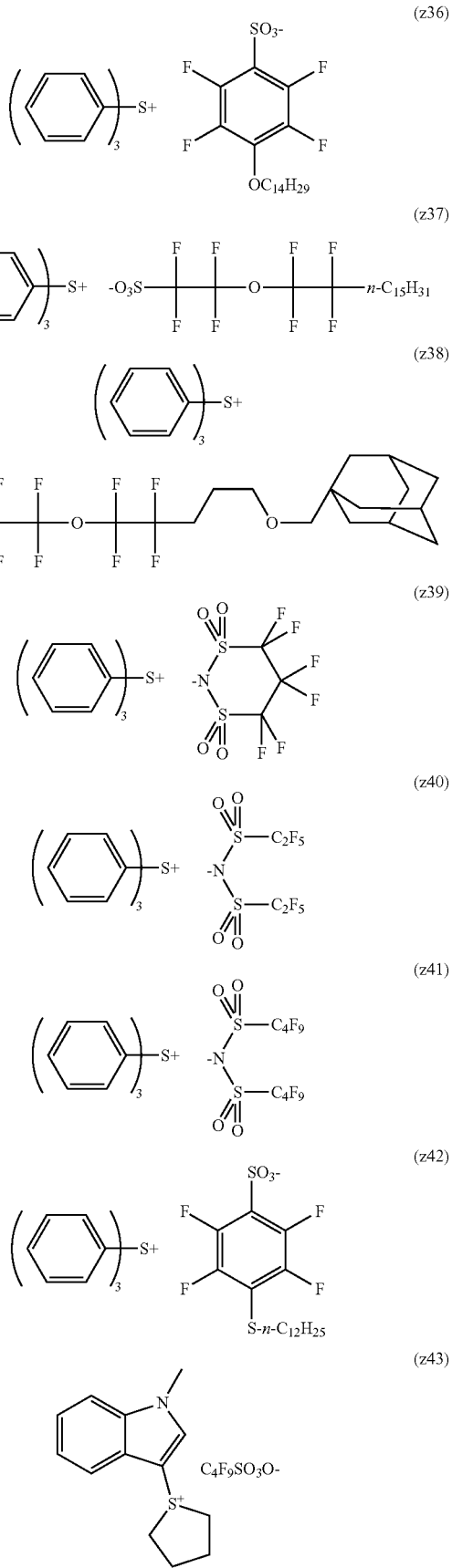

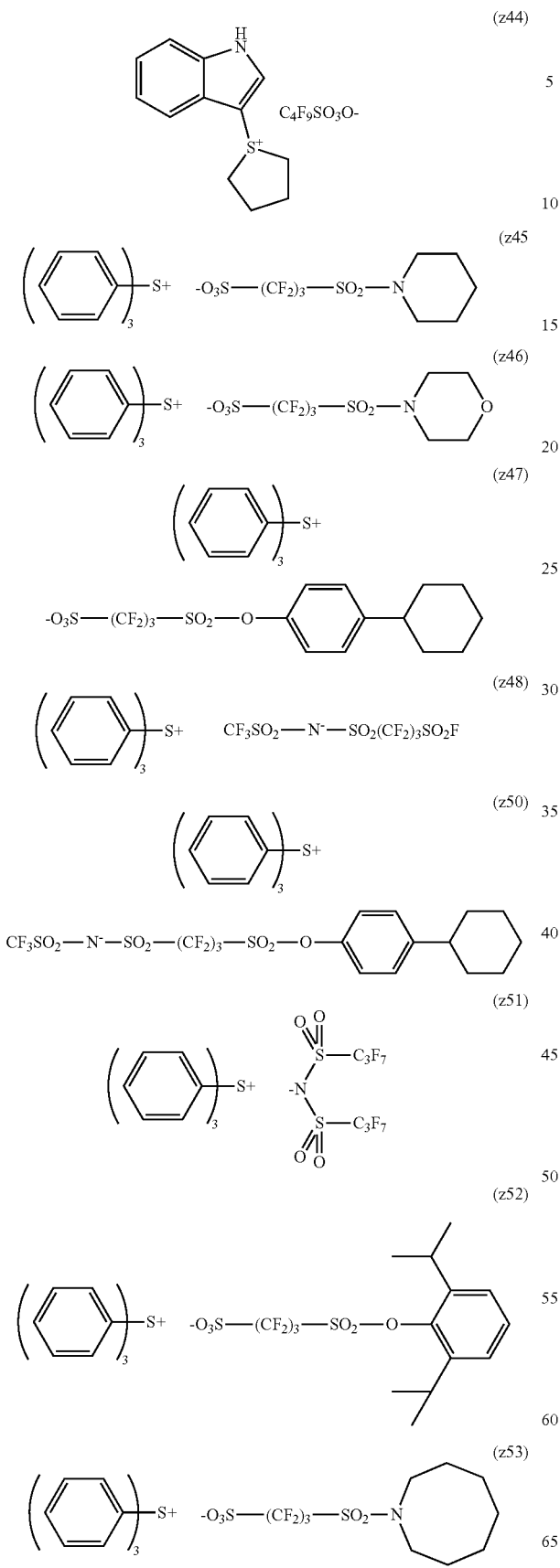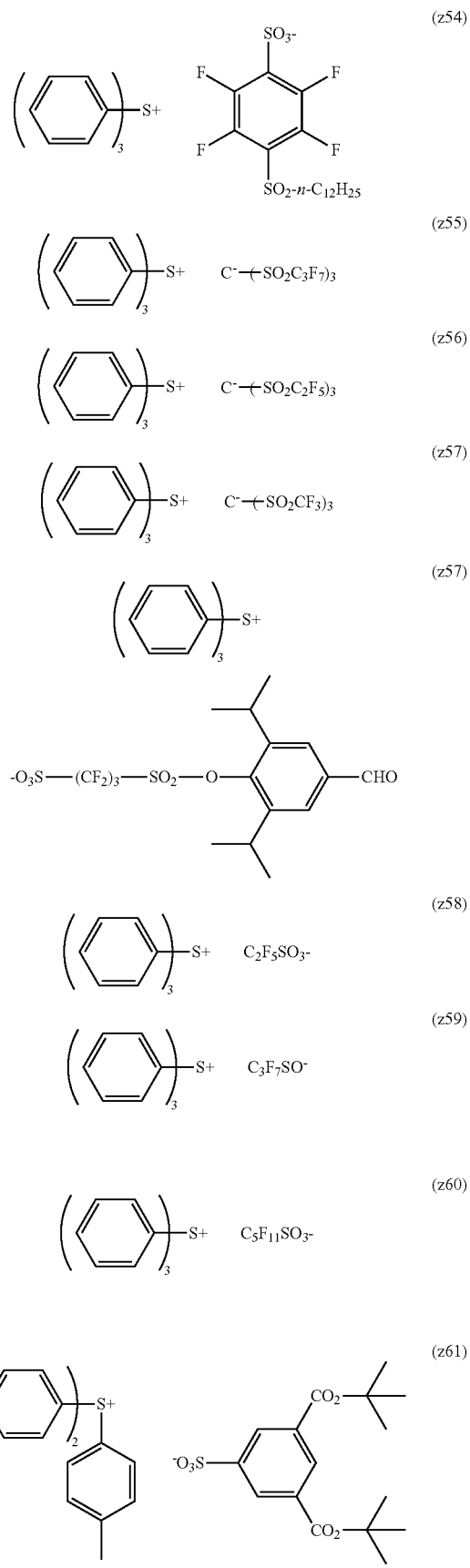

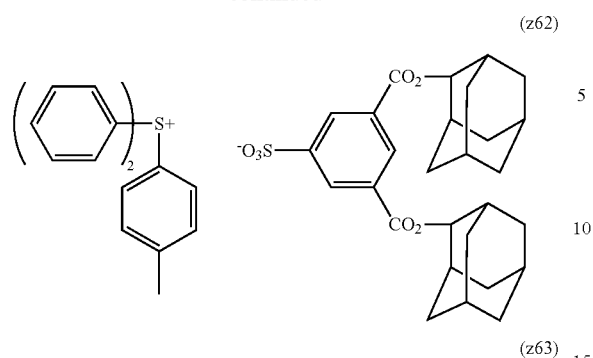
(z62)
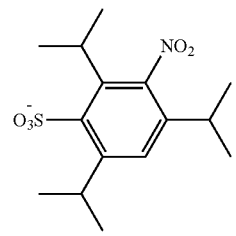
(z63)
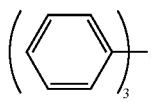
(z64)
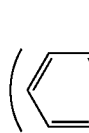
(z65)
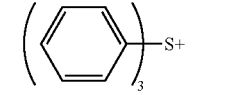
(z66)
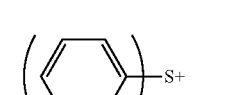
(z67)
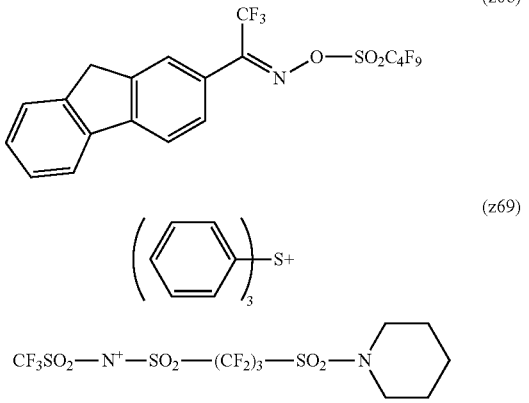

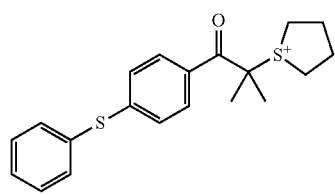 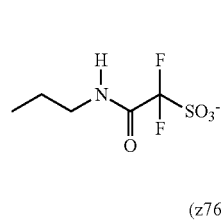 (z75)
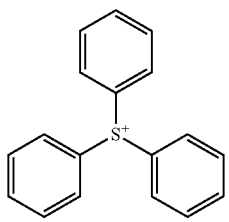 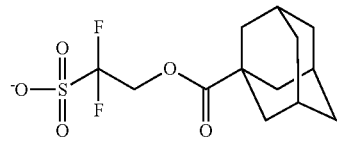 (z76)
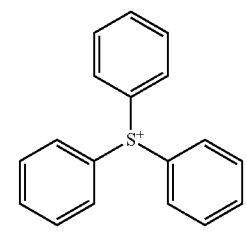 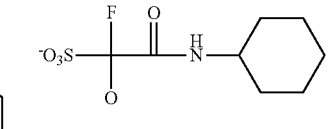 (z77)
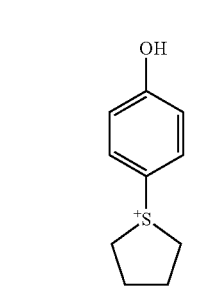 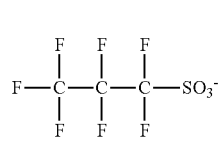 (z78)
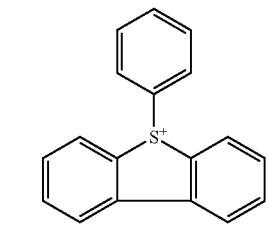 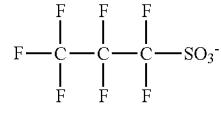 (z79)
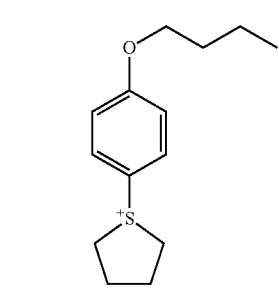 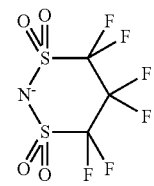 (z80)
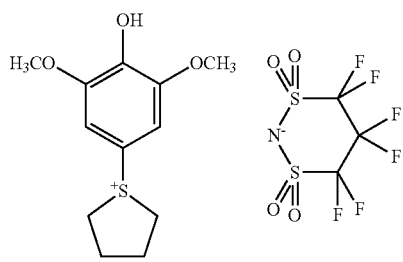 (z81)
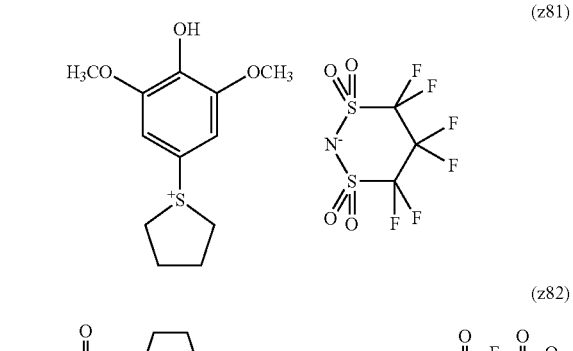 (z82)
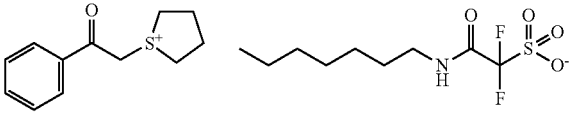 (z83)
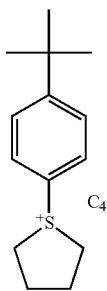 (z84)
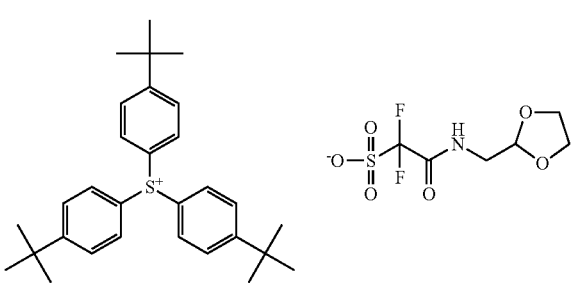 (z85)
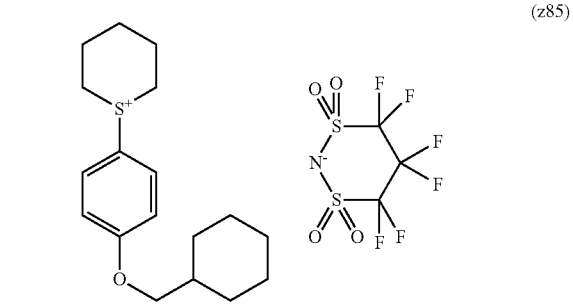 (z86)
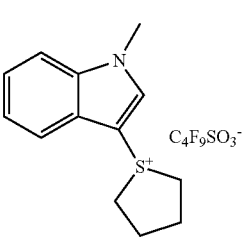

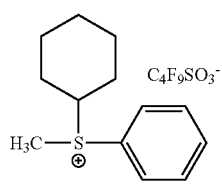
(z87)
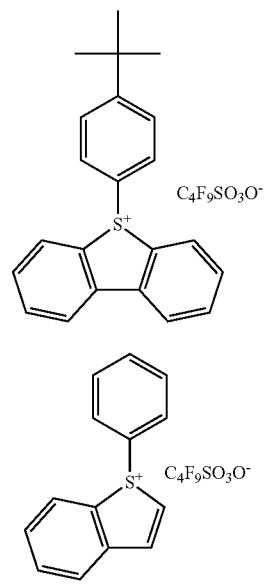
(z88)
(z89)
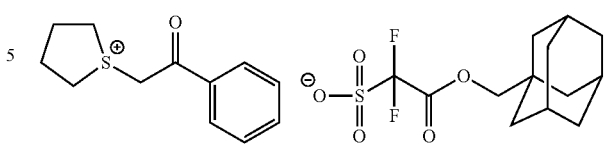
(z94)
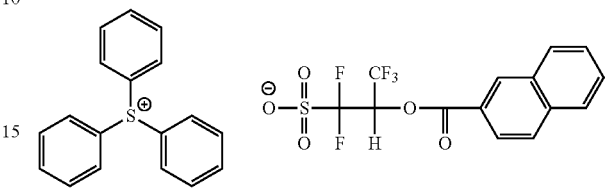
(z95)
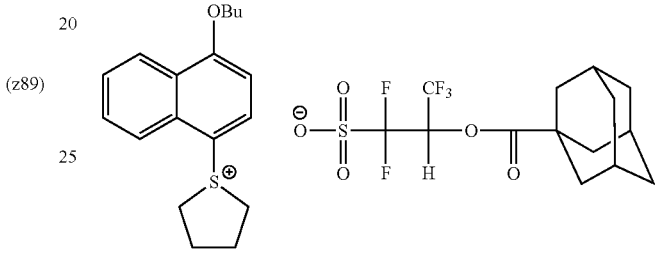
(z96)
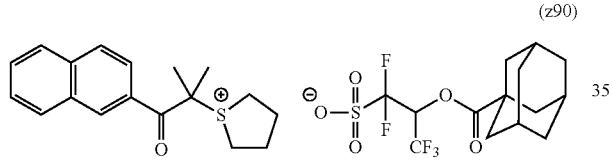
(z90)
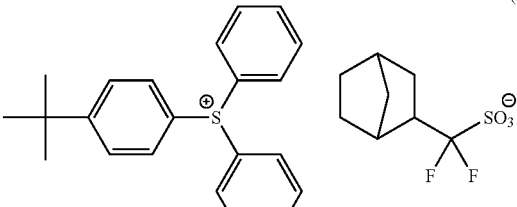
(z97)
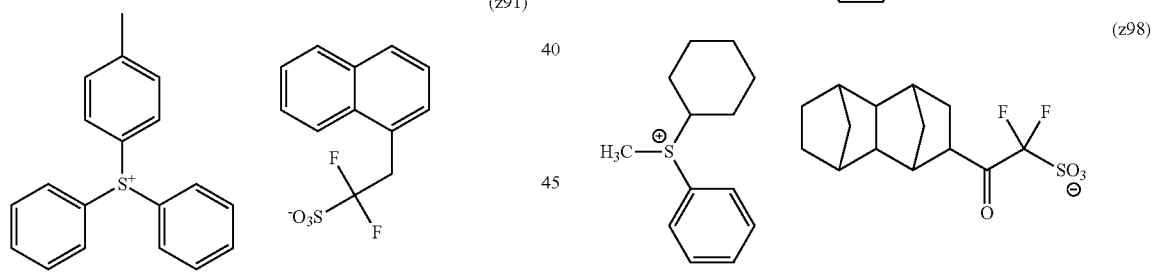
(z91)
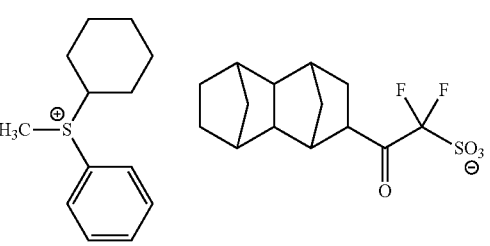
(z98)
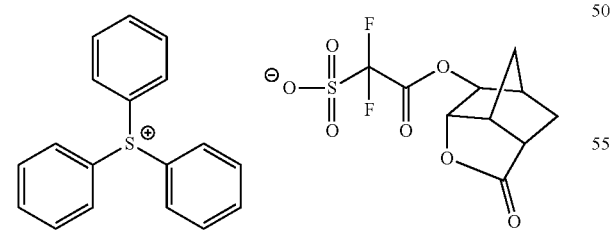
(z92)
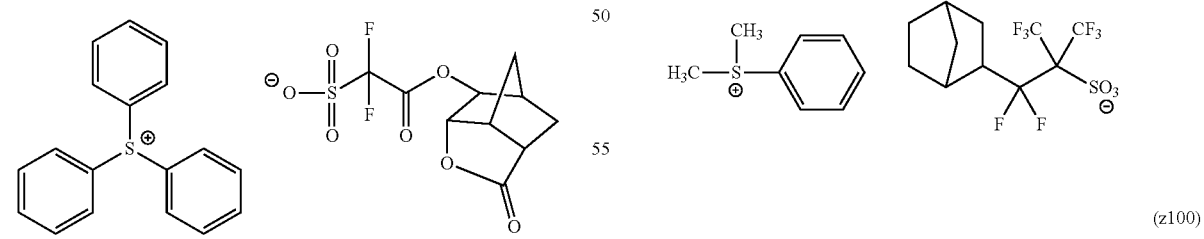
(z99)
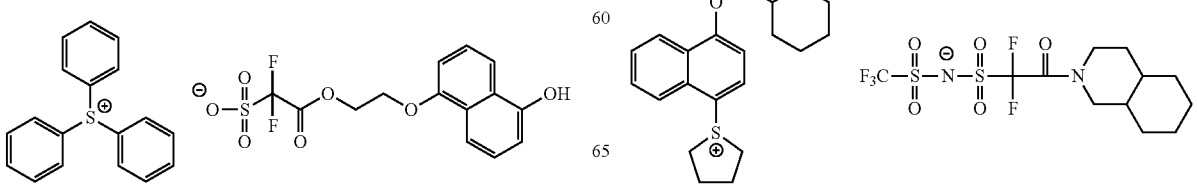
(z93)
(z100)

(z101)
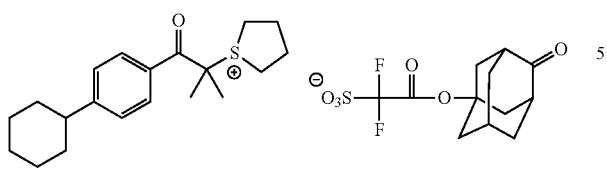

(z102)
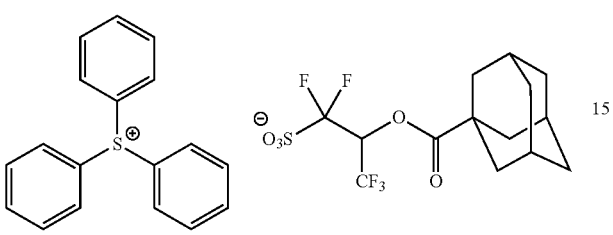

(z103)
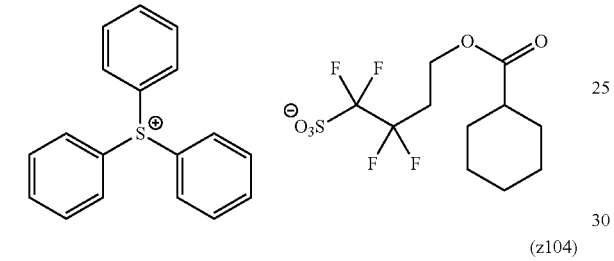

(z104)
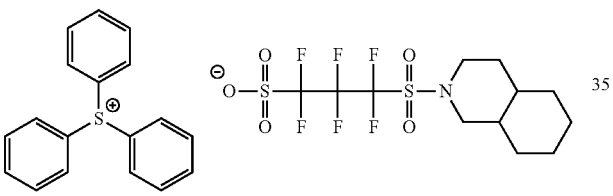

(z105)

(z106)
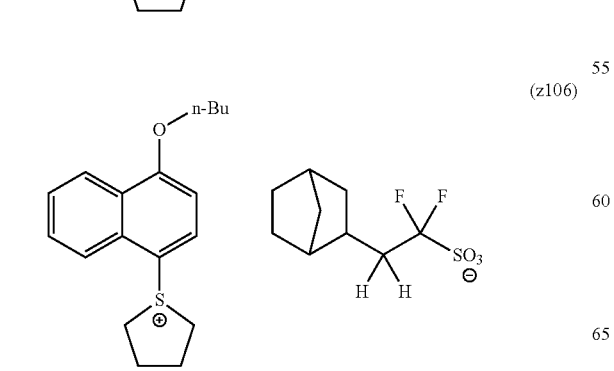

(z-107)
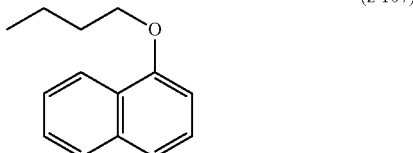

(z-108)
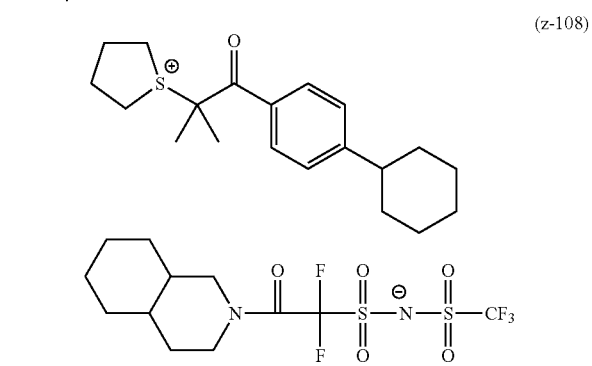

Nitrogen-Containing Compounds

The composition according to the present invention may further contain a nitrogen-containing compound in order to reduce the change in performance over time from exposure to heating.

As the nitrogen-containing compound, preferably, there can be the examples of the compounds with the structures shown in the general formulae (A) to (E) below.

  (A)

  (B)

  (C)

  (D)

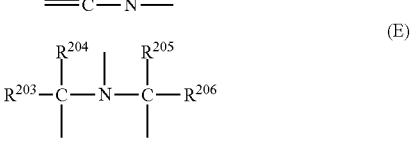  (E)

In general formulae (A) and (E), $R^{200}$, $R^{201}$ and $R^{202}$ may be the same or different and each independently represent a hydrogen atom, an alkyl group (preferably with a carbon number of 1 to 20), a cycloalkyl group (preferably with a carbon number of 3 to 20) or an aryl group (with a carbon number of 6 to 20), and here, $R^{201}$ and $R^{202}$ may form a ring by bonding with each other.

$R^{203}$, $R^{204}$, $R^{205}$, and $R^{206}$ may be the same or different and each independently represent an alkyl group with a carbon number of 1 to 20.

With regard to the alkyl group, as the alkyl group with a substituent, an aminoalkyl group with a carbon number of 1 to 20, a hydroxyalkyl group with a carbon number of 1 to 20, or a cyanoalkyl group with a carbon number of 1 to 20 is preferable.

The alkyl group in the general formulae (A) and (E) is more preferably unsubstituted.

As a preferable compound, there can be the example of guanidine, aminopyrrolidine, pyrazole, pyrazoline, piperazine, aminomorpholine, aminoalkylmorpholine, piperidine, and the like, and as a more preferable compound, there can be the examples of a compound with an imidazole structure, a diazabicyclo structure, an onium hydroxide structure, an onium carboxylate structure, a trialkylamine structure, an aniline structure or a pyridine structure, an alkylamine derivative with a hydroxyl group and/or an ether bond, and an aniline derivative with a hydroxyl group and/or an ether bond.

As the compound with an imidazole structure, there are the examples of imidazole, 2,4,5-triphenylimidazole, benzimidazole and 2-phenylbenzimidazole. As the compound having a diazabicyclo structure, there are the examples of a 1,4-diazabicyclo[2,2,2]octane, 1,5-diazabicyclo[4,3,0]nona-5-ene and 1,8-diazabicyclo[5,4,0]undeca-7-ene. As the compound with an onium hydroxide structure, there are the examples of tetrabutylammonium hydroxide, triarylsulfonium hydroxide, phenacylsulfonium hydroxide and sulfonium hydroxide with a 2-oxoalkyl group, and specifically, triphenylsulfonium hydroxide, tris(t-butylphenyl)sulfonium hydroxide, bis(t-butylphenyl)iodonium hydroxide, phenacylthiophenium hydroxide and 2-oxopropylthiophenium hydroxide. As the compound with an onium carboxylate structure, there are the examples of a compound where the anion moiety of the compound with an onium hydroxide structure is a carboxylate, and for example, there are the examples of acetate, adamantane-1-carboxylate, perfluoroalkyl carboxylate, and the like. As the compound with a trialkylamine structure, there are the examples of tri(n-butyl) amine and tri(n-octyl)amine. As the aniline compound, there can be the examples of 2,6-diisopropylaniline, N,N-dimethylaniline, N,N-dibutylaniline and N,N-dihexylaniline. As the alkylamine derivative with a hydroxyl group and/or an ether bond, there are the examples of ethanolamine, diethanolamine, triethanolamine, N-phenyldiethanolamine and tris(methoxyethoxyethyl)amine. As the aniline derivative with a hydroxyl group and/or an ether bond, there is the example of N,N-bis(hydroxyethyl)aniline.

As a preferable nitrogen-containing compound, there can be the further examples of an amine compound with a phenoxy group, an ammonium salt compound with a phenoxy group, an amine compound with a sulfonic acid ester group, and an ammonium salt compound with a sulfonic acid ester group.

In the amine compound with a phenoxy group, the ammonium salt compound with a phenoxy group, the amine compound with a sulfonic acid ester group, and the ammonium salt compound with a sulfonic acid ester group, at least one alkyl group preferably bonds with a nitrogen atom. In addition, there preferably is an oxygen atom in the alkyl chain and an oxyalkylene group is formed. The number of oxyalkylene groups in the molecule is 1 or more, is preferably 3 to 9, and is more preferably 4 to 6. Among the oxyalkylene groups, a structure of $-CH_2CH_2O-$, $-CH(CH_3)CH_2O-$ or $-CH_2CH_2CH_2O-$ is preferable.

As specific examples of the amine compound with a phenoxy group, the ammonium salt compound with a phenoxy group, the amine compound with a sulfonic acid ester group, and the ammonium salt compound with a sulfonic acid ester group, there are the examples of compounds (C1-1) to (C3-3) which are disclosed in paragraph [0066] of US2007/0224539A, and the like.

The molecular weight of the nitrogen-containing compound is preferable 250 or less. The nitrogen-containing compound where the molecular weight is 250 or less is effective in improving the DOF.

The nitrogen-containing compounds may be used as a single type or by using two or more types together.

In a case where the composition of the present invention includes the nitrogen-containing compound, the content thereof is preferably 0.001 to 10 mass % and more preferably 0.01 to 5 mass % with the total solid content of the composition of the present invention as a reference.

The proportion of content in the composition of the acid generator (in a case where an acid generator other than the compound (B) is included, the total of the compound (B) and the acid generator) and the nitrogen-containing compound is preferably acid generator/nitrogen-containing compound (molar ratio)=2.5 to 300. That is, the molar ratio is preferably 2.5 or more from the viewpoint of sensitivity and resolution and the molar ratio is 300 or less from the point of suppressing a reduction in resolution due to a thickening of the resist pattern over time until a heating processing after exposure. The acid generator/nitrogen-containing compound (molar ratio) is more preferably 3.5 to 200 and even more preferably 3.5 to 150.

<Low-Molecular-Weight Compound with Group Desorbed Due to Action of Acid Where Basicity Increases Due to Desorption>

The composition according to the present invention preferably contains a low-molecular compound with a group which desorbs due to the action of an acid where the basicity increases due to the desorption (referred to below as "low-molecular nitrogen-containing compound").

As the group which desorbs due to the action of an acid, there is no particular limitation, but an acetal group, a carbonate group, a carbamate group, a tertiary ester group, a tertiary hydroxyl group, or a hemiaminal ester is preferable. A carbamate group or a hemiaminal ester group is particularly preferable.

The molecular weight of the low-molecular nitrogen-containing compound with a group which desorbs due to the action of an acid is preferably 100 to 1000, is more preferably 100 to 700, and is even more preferably 100 to 500. From the point of view of an improvement in the DOF which is described previously, the molecular weight is particularly preferably 250 or less.

As the low-molecular nitrogen-containing compound, an amine derivative with the group which desorbs due to the action of an acid on the nitrogen atom is preferable.

The low-molecular nitrogen-containing compound may have a carbamate group with a protection group on the nitrogen atom. The protection group which configures the carbamate group is, for example, represented by the general formula (d-1) below.

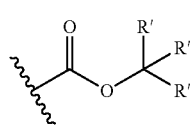

In the general formula (d-1),

R' each independently represent a hydrogen atom, a linear or branched alkyl group, a cycloalkyl group, an aryl group, an aralkyl group, or an alkoxyalkyl group. R' may form a ring by bonding to each other.

R' is preferably a linear chain or a branched chain alkyl group, a cycloalkyl group, or an aryl group. A linear chain or a branched chain alkyl group or cycloalkyl group is more preferable.

The low-molecular nitrogen-containing compound can be configured by arbitrarily combining the basic compound described above and the structure which is represented by the general formula (d-1).

The low-molecular nitrogen-containing compound particularly preferably has the structure which is represented by the general formula (A) below.

Here, the low-molecular nitrogen-containing compound may be equivalent to the basic compound described above as long as it is a low-molecular nitrogen-containing compound with a group which desorbs due to the action of an acid.

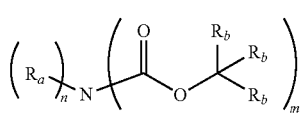

In the general formula (A), Ra indicates a hydrogen atom, an alkyl group, a cycloalkyl group, an aryl group, or an aralkyl group. In addition, when n=2, the two Ra may be the same or may be different or may form a divalent heterocyclic hydrocarbon group (preferably with a carbon number of 20 or less) or a derivative thereof by the two Ra being bonded to each other.

Rb each independently indicate a hydrogen atom, an alkyl group, a cycloalkyl group, an aryl group, an aralkyl group, or an alkoxyalkyl group. Here, when one or more of Rb is a hydrogen atom in —C(Rb)(Rb)(Rb), at least one of the remaining Rb is a cyclopropyl group, a 1-alkoxyalkyl group, or an aryl group.

At least two of Rb may bond and form an alicyclic hydrocarbon group, an aromatic hydrocarbon group, a heterocyclic hydrocarbon group, or a derivative thereof.

n represents an integer of 0 to 2, m represents an integer of 1 to 3, and n+m=3.

In the general formula (A), the alkyl group which are indicated by Ra and Rb, the cycloalkyl group, the aryl group, and the aralkyl group may have a substituent by a functional group such as a hydroxyl group, a cyano group, an amino group, a pyrrolidino group, a piperidino group, a morpholino group, or an oxo group, an alkoxy group, or a hydrogen atom. The alkoxyalkyl group which is indicated by Rb is the same.

As the alkyl group, the cycloalkyl group, the aryl group, and the aralkyl group which are indicated by Ra and/or Rb (the alkyl group, the cycloalkyl group, the aryl group, and the aralkyl group may have a substituent by the functional groups described above, an alkoxy group, or a hydrogen atom), for example, there can be the examples of a group where a group which is derived from a linear chain or branched chain alkane such as methane, ethane, propane, butane, pentane, hexane, heptane, octane, nonane, decane, undecane, dodecane or a group which is derived from these alkanes is substituted by, for example, one or more types or one or more of a cycloalkyl group such as a cyclobutyl group, a cyclopentyl group, or a cyclohexyl group, a group where a group which is derived from a cycloalkane such as cyclobutane, cyclopentane, cyclohexane, cycloheptane, cyclooctane, norbornane, adamantane, or noradamantane or a group which is derived from these cycloalkanes is substituted by, for example, one or more types or one or more of a linear chain or branched chain alkyl group such as a methyl group, an ethyl group, an n-propyl group, an i-propyl group, an n-butyl, a 2-methylpropyl group, a 1-methyl propyl group, or a t-butyl group, a group where a group which is derived from an aromatic compound such as benzene, naphthalene, or anthracene or a group which is derviated from these aromatic compounds is substituted by, for example, one or more types or one or more of a linear chain or branched chain alkyl group such as a methyl group, an ethyl group, an n-propyl group, an i-propyl group, an n-butyl, a 2-methylpropyl group, a 1-methyl propyl group, or a t-butyl group, a group where a group which is derived from a heterocyclic compound such as pyrrolidine, piperidine, morpholine, tetrahydrofuran, tetrahydropyran, indole, indoline, quinoline, perhydroquinoline, indazole, or benzimidazole or a group which is derived from these heterocyclic compounds is substituted by, for example, one or more types or one or more of a linear chain or branched chain alkyl group or a group which is derived from an aromatic compound, a group where a group which is derived from a linear chain or branched chain alkane. A group derived from a cycloalkane is substituted by, for example, one or more types or one or more of a group which is derived from an aromatic compound such as a phenyl group, a naphthyl group, or an anthracenyl group, a group where the substituent described above are substituted by a functional group such as a hydroxyl group, a cyano group, an amino group, a pyrrolidino group, a piperidino group, a morpholino group, or an oxo group, or the like.

In addition, as the divalent heterocyclic hydrocarbon group (preferably with a carbon number of 1 to 20) or the derivative thereof which is formed by bonding of the Ra described above to each other, for example, there are the examples of a group where a group which is derived from a heterocyclic compound such as pyrrolidine, piperidine, morpholine, 1,4,5,6-tetrahydropyrimi dine, 1,2,3,4-tetrahydroquinoline, 1,2,3,6-tetrahydropyridine, homopiperazine, 4-aza-benzimidazole, benzotriazole, 5-aza-benzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydro quinoxaline, perhydroquinoline, or 1,5,9-triazacyclododecane or a group which is derived from these heterocyclic compounds is substituted by, for example, one or more types or one or more of a group which is derived from a linear chain or branched chain alkane, a group which is derived from a cycloalkane, a, group which is derived from an aromatic compound, a group which is derived from a heterocyclic compound, or a functional group such as a hydroxyl group, a cyano group, an amino group, a pyrrolidino group, a piperidino group, a morpholino group, or an oxo group, or the like.

Particularly preferable low-molecular nitrogen-containing compounds in the present invention are specifically shown, but the present invention is not limited to these.

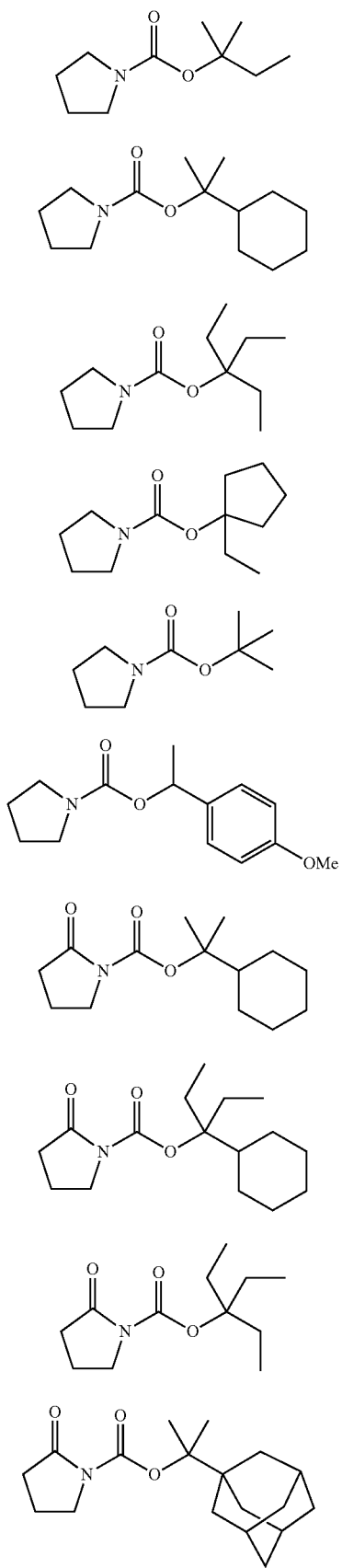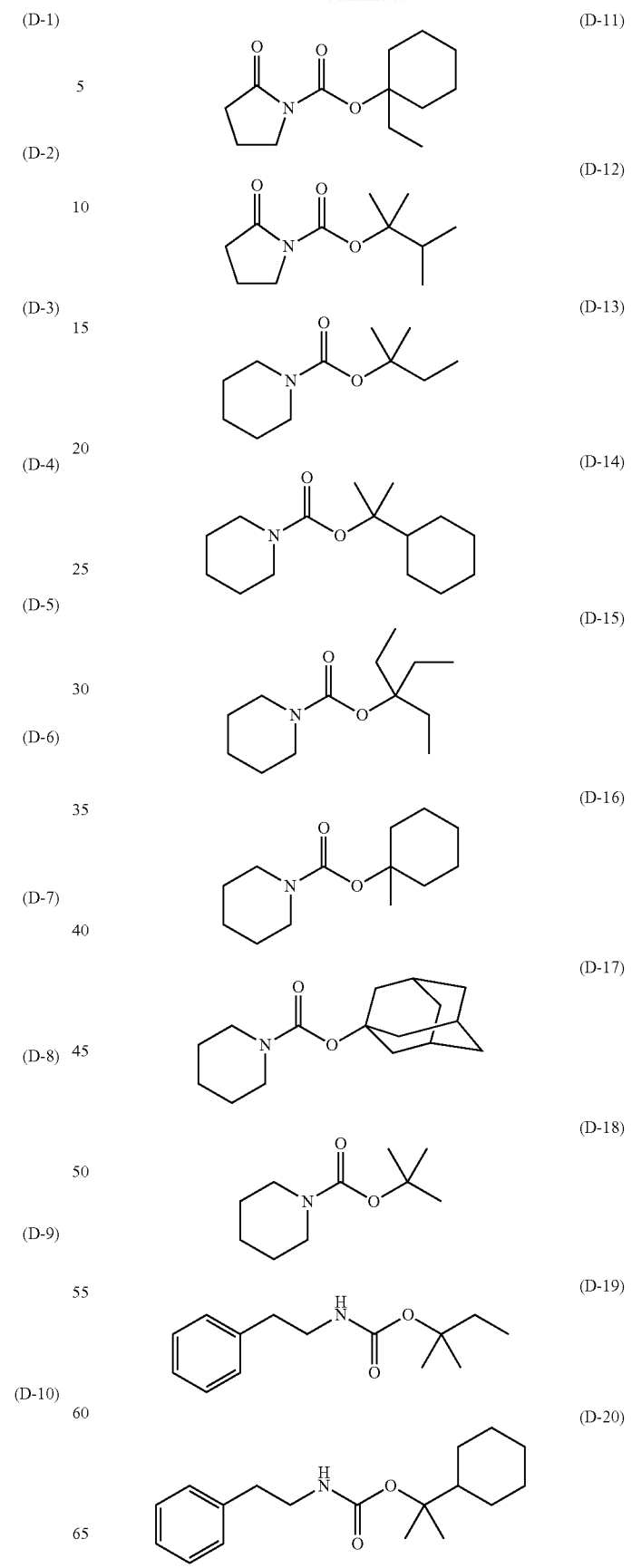

(D-21) 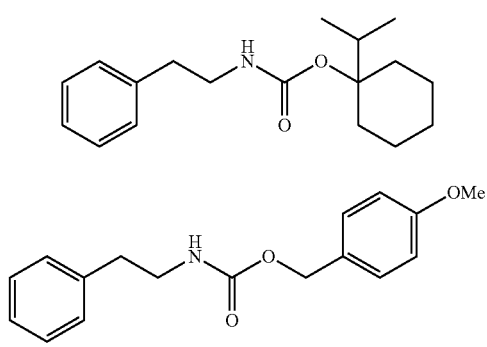
(D-22) 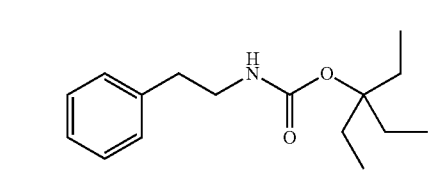
(D-23) 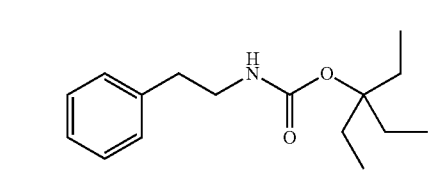
(D-24) 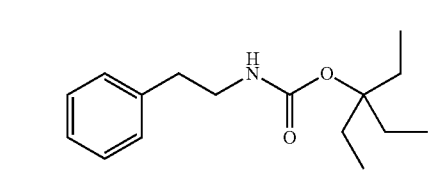
(D-25) 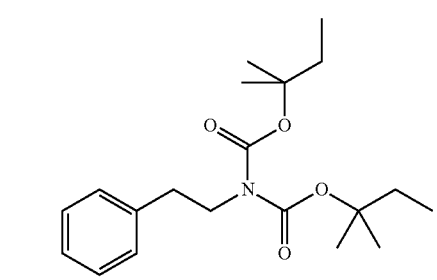
(D-26) 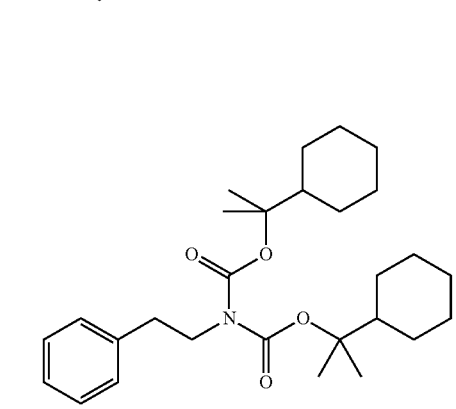
(D-27) 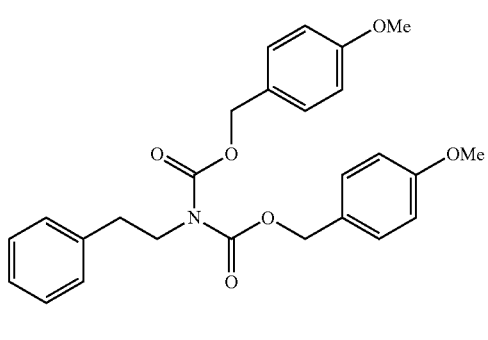
(D-28) 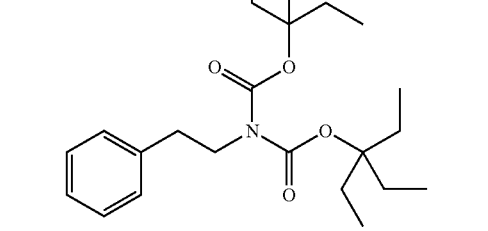
(D-29) 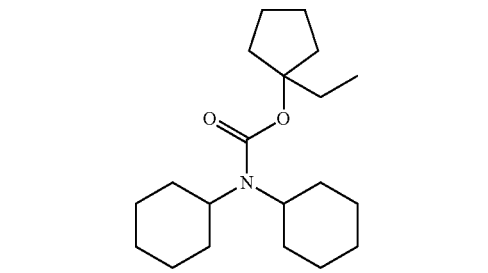
(D-30) 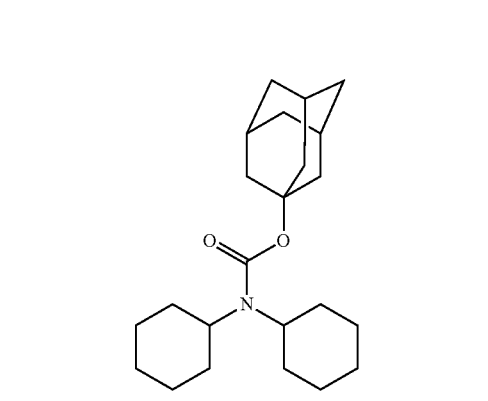
(D-31) 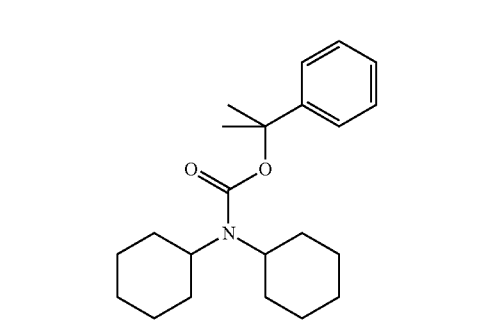

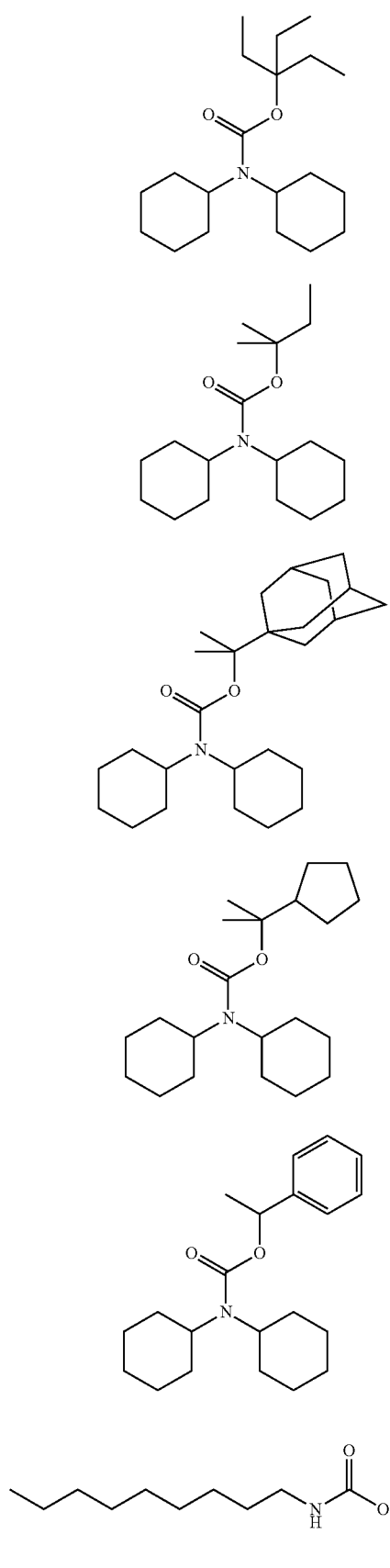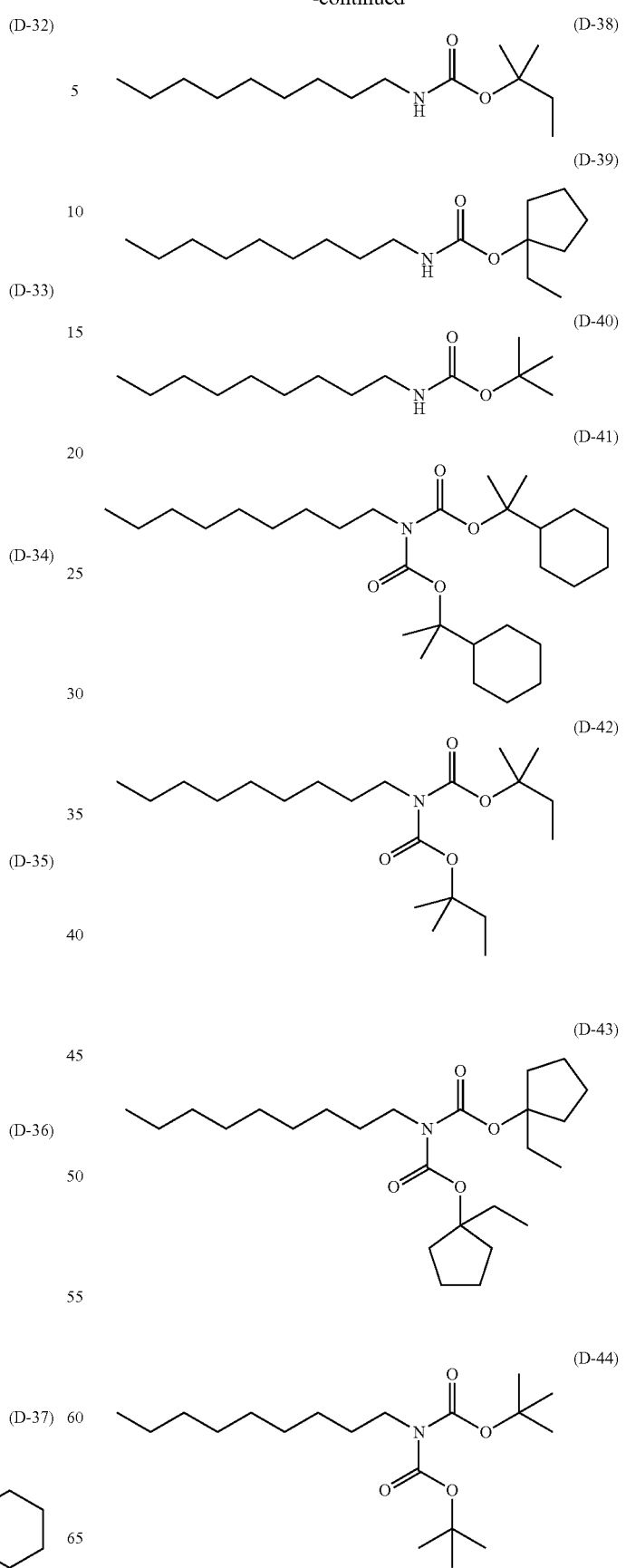

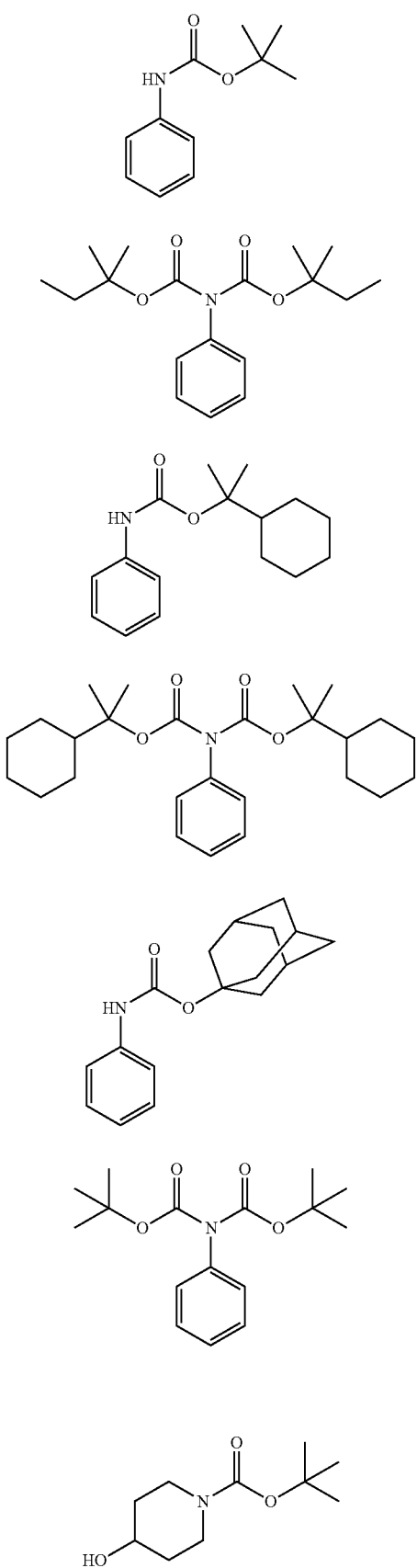

(D-45)
(D-46)
(D-47)
(D-48)
(D-49)
(D-50)
(D-51)

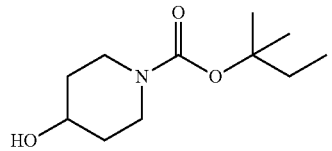

(D-52)

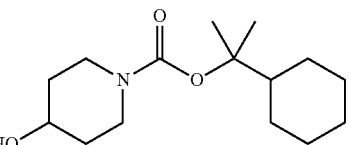

(D-53)

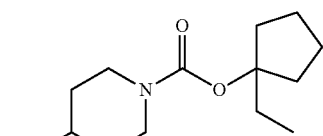

(D-54)

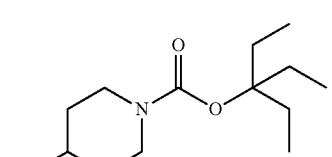

(D-55)

The compound which is represented by the general formula (A) can be synthesized using, for example, a method which is described in JP2009-199021A.

Single type or two or more types of the low-molecular nitrogen-containing compound can be used together.

In the present invention, the content of the low-molecular nitrogen-containing compound is preferably 0.001 to 20 mass %, is more preferably 0.001 to 10 mass %, and is even more preferably 0.01 to 5 mass % with the total solid content of the composition where the low-molecular nitrogen-containing compound has been combined as a reference.

The usage proportion of the acid generator and the low-molecular nitrogen-containing compound in the composition is preferably acid generator/[low-molecular nitrogen-containing compound+basic compound described above](molar ratio)=2.5 to 300. That is, the molar ratio is preferably 2.5 or more from the viewpoint of sensitivity and resolution and the molar ratio is 300 or less from the point of suppressing a reduction in resolution due to a thickening of the resist pattern over time until a heating processing after exposure. The acid generator/[low-molecular nitrogen-containing compound+basic compound described above](molar ratio) is more preferably 3.5 to 200 and even more preferably 3.5 to 150.

Some preferable specific examples as the low-molecular nitrogen-containing compound where the molecular weight (Mw) is 250 or less are shown below.

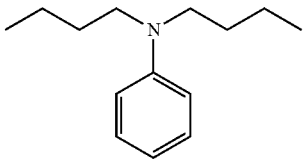

Mw: 205.34

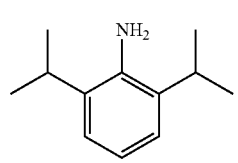

Mw: 177.29

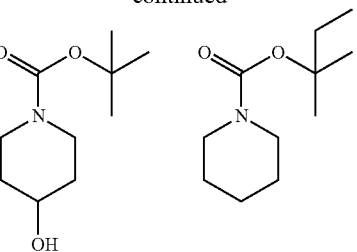

Mw: 201.26   Mw: 199.29

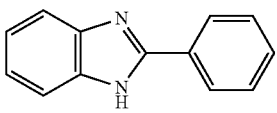

Mw: 194.23

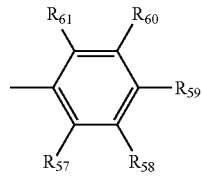

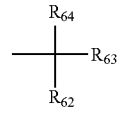

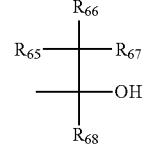

(D) Hydrophobic Resin

The composition according to the present invention may contain a hydrophobic resin with at least any of a fluorine atom or a silicon atom particularly when applied to immersion exposure (referred to below as "hydrophobic resin (D)" or simply "resin (D)"). Due to this, the hydrophobic resin (D) is lateralized in the film surface and the static and dynamic contact angles of the surface of the resist film can be improved with regard to water and the immersion liquid traceability can be improved in the case where the immersion liquid is water.

The hydrophobic resin (D) preferably is designed to be unevenly distributed in the boundary surface as described above, but it is not necessary to have a hydrophilic group within the molecule different from the surfactant and may not contribute to mixing of a polar or nonpolar substance evenly.

The hydrophilic resin (D) typically includes a fluorine atom and/or a silicon atom. The fluorine atom and/or the silicon atom in the hydrophilic resin (D) may be included in the main chain of the resin or may be included in the side chain.

In a case where the hydrophilic resin (D) includes a fluorine atom, as a partial structure which has the fluorine atom, a resin which has an alkyl group with a fluorine atom, a cycloalkyl group with a fluorine atom, or an aryl group with a fluorine atom is preferable.

The alkyl group with a fluorine atom (preferably with a carbon number of 1 to 10 and more preferably from 1 to 4) is a linear or branched alkyl group with at least one hydrogen atom being substituted by a fluorine atom and may further have substituents other than the fluorine atom.

The cycloalkyl group with a fluorine atom is a monocyclic or polycyclic cycloalkyl group with at least one hydrogen atom being substituted by a fluorine atom and may further have substituents other than the fluorine atom.

The aryl group with a fluorine atom is an aryl group such as a phenyl group or a naphthyl group with at least one hydrogen atom being substituted by a fluorine atom and may further have substituents other than the fluorine atom.

As the alkyl group with a fluorine atom, the cycloalkyl group with a fluorine atom, and the aryl group with a fluorine atom, preferably, there can be the examples of groups which are represented by the general formulae (F2) to (F4) below, but the present invention is not limited to these.

In the general formulae (F2) to (F4), $R_{57}$ to $R_{68}$ each independently represent a hydrogen atom, a fluorine atom or an alkyl group (linear or branched). Here, at least one of $R_{57}$ to $R_{61}$, at least one of $R_{62}$ to $R_{64}$, and at least one of $R_{65}$ to $R_{68}$ each independently represent a fluorine atom or an alkyl group (preferably with a carbon number of 1 to 4) with at least one hydrogen atom being substituted by a fluorine atom.

All of $R_{57}$ to $R_{61}$ and $R_{65}$ to $R_{67}$ are preferably fluorine atoms. $R_{62}$, $R_{63}$ and $R_{68}$ are preferably an alkyl group (preferably with a carbon number of 1 to 4) with at least one hydrogen atom being substituted by a fluorine atom and more preferably a perfluoroalkyl group with a carbon number of 1 to 4. $R_{62}$ and $R_{63}$ may form a ring by bonding to each other.

As specific examples of the group which is represented by the general formula (F2), there are the examples of a p-fluorophenyl group, a pentafluorophenyl group and a 3,5-di(trifluoromethyl)phenyl group.

As specific examples of the group which is represented by the general formula (F3), there are the examples of a trifluoromethyl group, a pentafluoropropyl group, a pentafluoroethyl group, a heptafluorobutyl group, a hexafluoroisopropyl group, a heptafluoroisopropyl group, a hexafluoro(2-methyl) isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group and a perfluorocyclohexyl group. A hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferable, and a hexafluoroisopropyl group and a heptafluoroisopropyl group are more preferred.

As specific examples of the group which is represented by general formula (F4), there are the examples of —C(CF$_3$)$_2$OH, —C(C$_2$F$_5$)$_2$OH, —C(CF$_3$)(CH$_3$)OH, and —CH(CF$_3$)OH and —C(CF$_3$)$_2$OH are preferable.

The partial structure which includes the fluorine atom may be directly bonded to the main chain, or furthermore, may be bonded to the main chain via a group which is selected from the group formed from an alkylene group, a phenylene group, an ether bond, a thioether bond, a carbonyl group, an ester bond, an amide bond, a urethane bond, and a ureylene bond or a group which is a combination of two or more thereof.

As an appropriate repeating unit with a fluorine atom, there are the examples shown below.

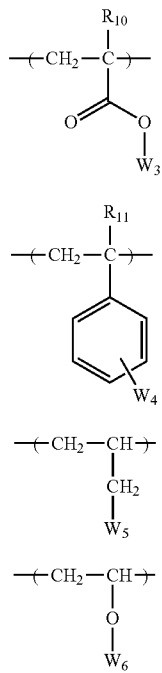

In the general formulae, $R_{10}$ and $R_{11}$ each independently represent a hydrogen atom, a fluorine atom, or an alkyl group. The alkyl group may be a linear or branched alkyl group with a carbon number of 1 to 4 and may have a substituent. As the alkyl with a substituent, in particular, there can be the example of a fluorinated alkyl group.

$W_3$ to $W_6$ each independently represent an organic group which contains at least one or more fluorine atoms. Specifically, there are the atomic groups of (F2) to (F4) below.

In addition, other than this, the hydrophobic resin (D) may have a unit as shown below as a repeating unit with a fluorine atom.

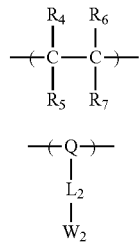

In the general formula, $R_4$ to $R_7$ each independently represent a hydrogen atom, a fluorine atom, or an alkyl atom. The alkyl group may be a linear or branched alkyl group with a carbon number of 1 to 4 and may have a substituent. As the alkyl with a substituent, in particular, there can be the example of a fluorinated alkyl group.

Here, at least one of $R_4$ to $R_7$ represents a fluorine atom. $R_4$ and $R_5$ or $R_6$ and $R_7$ may form a ring.

$W_2$ represents an organic group which contains at least one or more fluorine atoms. Specifically, there are the atomic groups of (F2) to (F4) below.

$L_2$ indicates a single bond or a divalent linking group. As the divalent linking group, for example, there are the examples of a substituted or unsubstituted arylene group, a substituted or unsubstituted alkylene group, a substituted or unsubstituted cycloalkylene group, —O—, —SO$_2$—, —CO—, —N(R)— (in the general formula, R represents a hydrogen atom or an alkyl), —NHSO$_2$—, or a divalent linking group which combines a plurality thereof.

Q represents an alicyclic structure. The alicyclic structure may have a substituent group, may be monocyclic type or may be polycyclic type, and may have a bridging format in the case of being polycyclic. As a monocyclic type, a cycloalkyl group with a carbon number of 3 to 8 is preferable, and for example, there can be the examples of a cyclopentyl group, a cyclohexyl group, a cyclobutyl group, or a cyclooctyl group. As a polycyclic type, there can be the examples of a group with a carbon number of 5 or more with a bicyclo, tricyclo, or tetracyclo structure or the like, a cycloalkyl group with a carbon number of 6 to 20 is preferable, and for example, there can be the examples of an adamantyl group, a norbornyl group, a dicyclopentyl group, a tricyclodecanyl group, a tetracyclododecyl group, and the like. Here, a portion of the carbon atoms in the cycloalkyl group may have a substituent by a hetero atom such as a nitrogen atom. Particularly preferable as Q can be the examples of a norbornyl group, a tricyclodecanyl group, or a tetracyclododecyl group.

Below, specific examples of the repeating unit with a fluorine atom are shown but the present invention is not limited to these. In the specific examples, $X_1$ represents a hydrogen atom, —CH$_3$, —F, or —CF$_3$. $X_2$ represents —F or —CF$_3$.

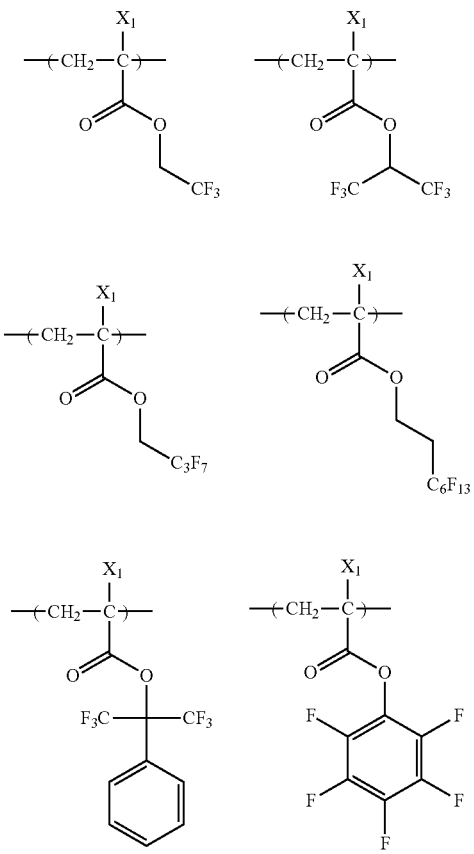

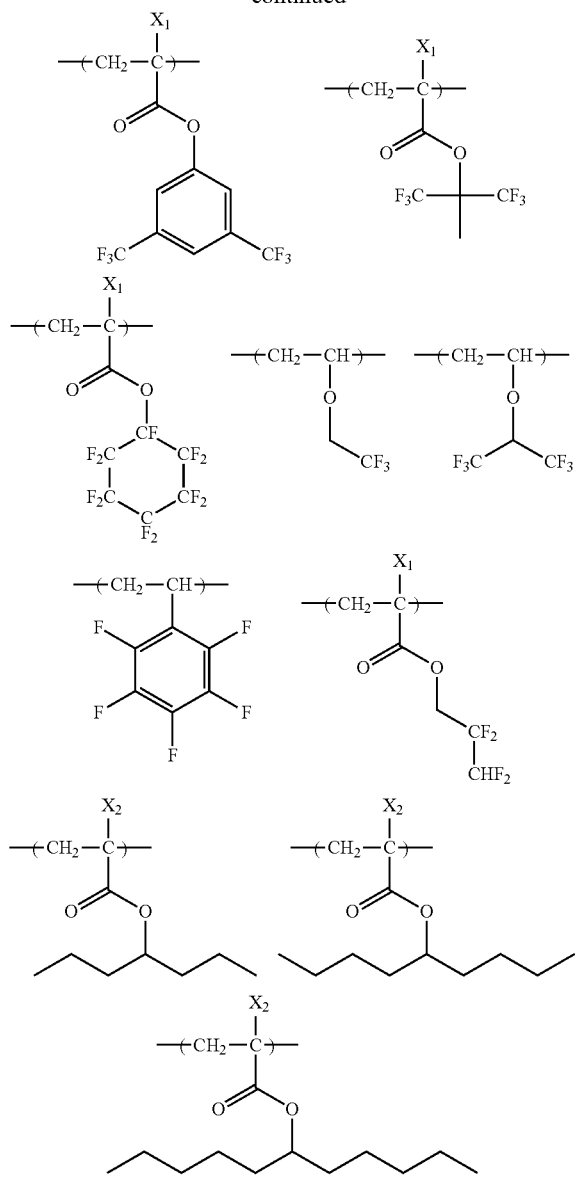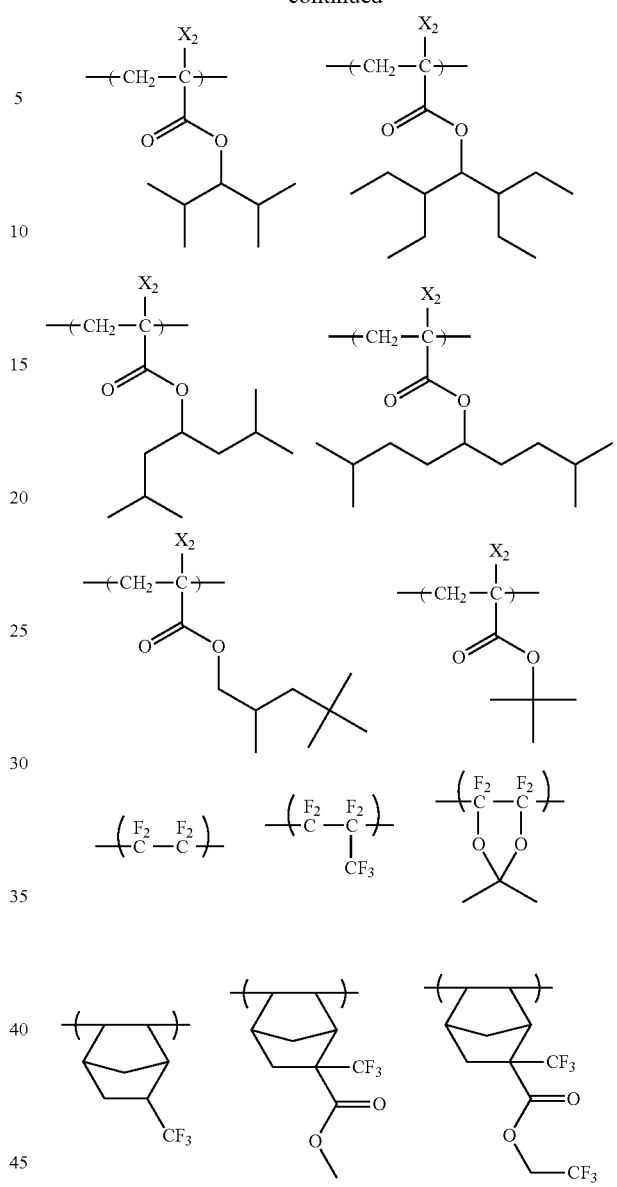

The hydrophobic resin (D) may contain a silicon resin. As a partial structure with a silicon atom, a resin with an alkylsilyl structure (preferably a trialkylsilyl group) or a cyclic siloxane structure is preferable.

As the alkylsilyl structure or the cyclic siloxane structure, specifically, there are the examples of groups which are represented by the general formulae (CS-1) to (CS-3) below.

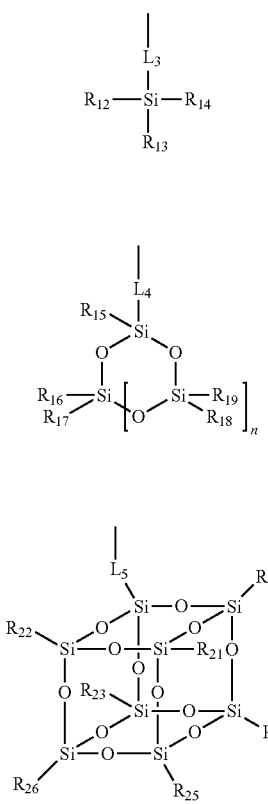 (CS-1)

(CS-2)

(CS-3)

In the general formulae (CS-1) to (CS-3),

R$_{12}$ to R$_{26}$ each independently represent a linear or branched alkyl group (preferably with a carbon number of 1 to 20) or a cycloalkyl group (preferably with a carbon number of 3 to 20).

L$_3$ to L$_5$ represent a single bond or a divalent linking group. As the divalent linking group, there are the examples of one or a combination of two or more which are selected from the group formed from an alkylene group, a phenylene group, an ether bond, a thioether bond, a carbonyl group, an ester bond, an amide bond, a urethane bond, and a urea bond.

n represents an integer of 1 to 5. n is preferably an integer of 2 to 4.

Below, there are the examples of the specific examples of the repeating unit with a group which is represented by the general formulae (CS-1) to (CS-3), but the present invention is not limited to these. Here, in the specific examples, X$_1$ represents a hydrogen atom, —CH$_3$, —F, or —CF$_3$.

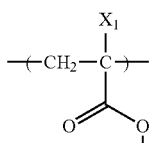
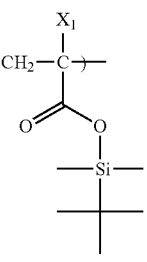
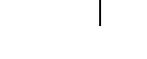
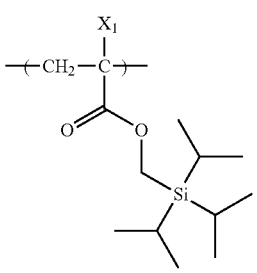
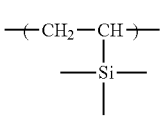
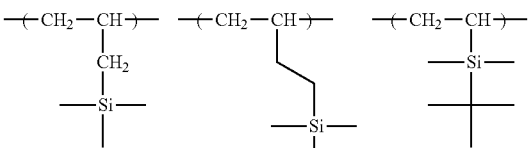
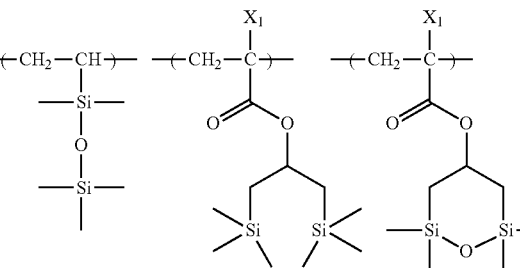
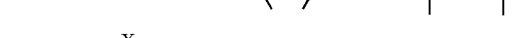
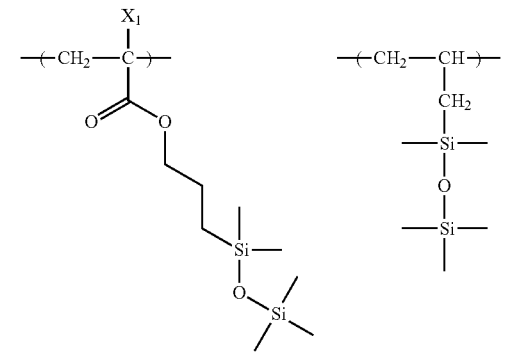
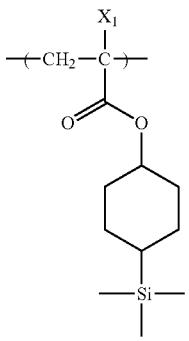
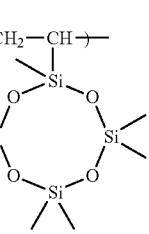
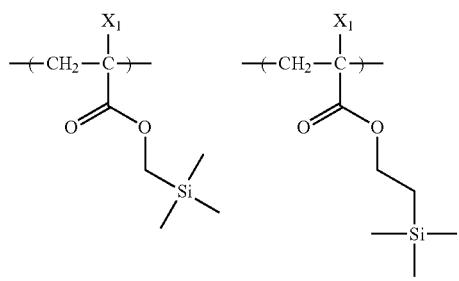

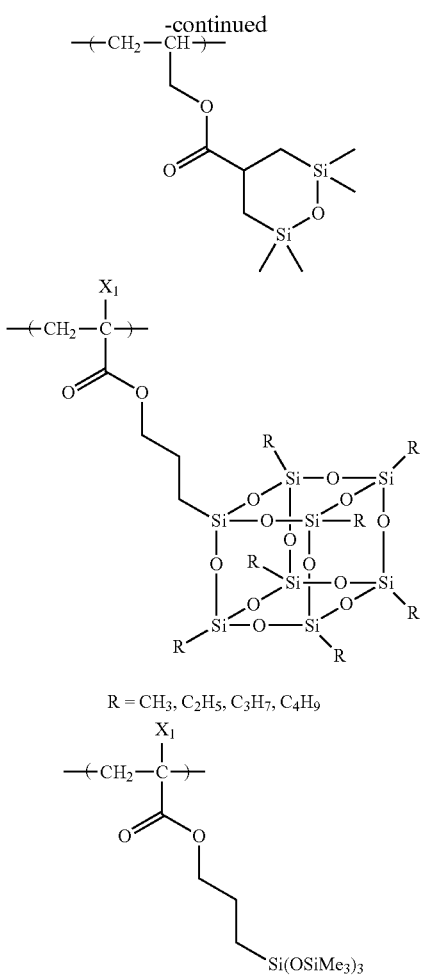

Furthermore, the hydrophobic resin (D) may have at least one group which is selected from a group of (x) to (z).

(x) an acid group
(y) a group with a lactone structure, an anhydride group, or an acid imide group
(z) a group which is decomposed by the action of an acid.

As the acid group (x), there are the examples of a phenolic hydroxyl group, a carboxylate group, a fluorinated alcohol group, a sulfonate group, a sulfonamide group, a sulfonylimide group, an (alkylsulfonyl)(alkylcarbonyl)methylene group, an (alkylsulfonyl)(alkylcarbonyl)imide group, a bis (alkylcarbonyl)methylene group, a bis(alkylcarbonyl)imide group, a bis(alkylsulfonyl)methylene group, a bis(alkylsulfonyl)imide group, a tris(alkylcarbonyl)methylene group, a tris (alkylsulfonyl)methylene group, or the like.

As a preferable acid group, there are the examples of a fluorinated alcohol group (preferably hexafluoroisopropanol), a sulfonimide group and a bis(alkylcarbonyl)methylene group.

As a repeating unit with the acid group (x), there are the examples of a repeating unit where an acid group is directly bonded to the main chain of the resin such as a repeating unit derived from an acrylic acid or a methacrylic acid, a repeating unit where an acid group is bonded to the main chain of the resin through a linking group, and the like, and furthermore, a polymerization initiator or chain transfer agent which has an acid group can be introduced to a terminal of a polymer chain by being used during polymerization, and any of these cases is preferable. The repeating unit with the acid group (x) may have at least any of a fluorine atom or a silicon atom.

The content amount of the repeating unit with the acid group (x) is preferably 1 to 50 mol %, is more preferably 3 to 35 mol %, and is even more preferably 5 to 20 mol % with regard to the total of the repeating units in the hydrophobic resin (D).

Specific examples of the repeating unit with the acid group (x) are shown below, but the present invention is not limited to these. In the general formulae, Rx represents a hydrogen atom, $CH_3$, $CF_3$, or $CH_2OH$.

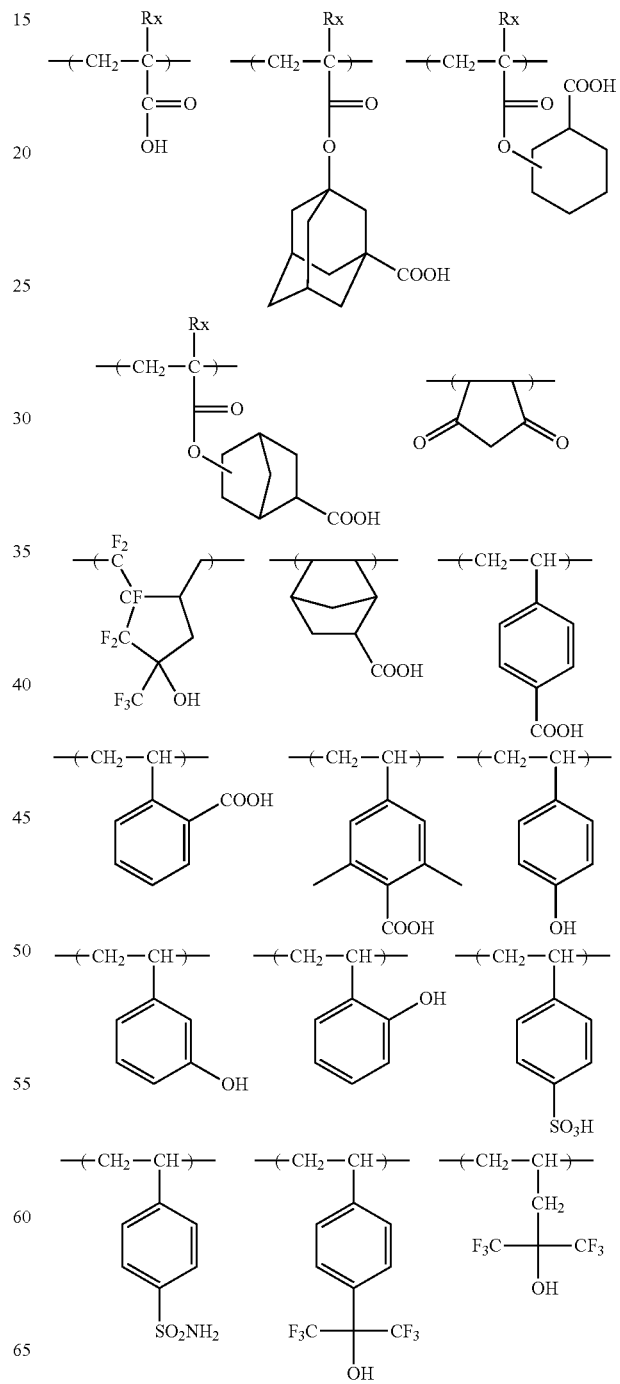

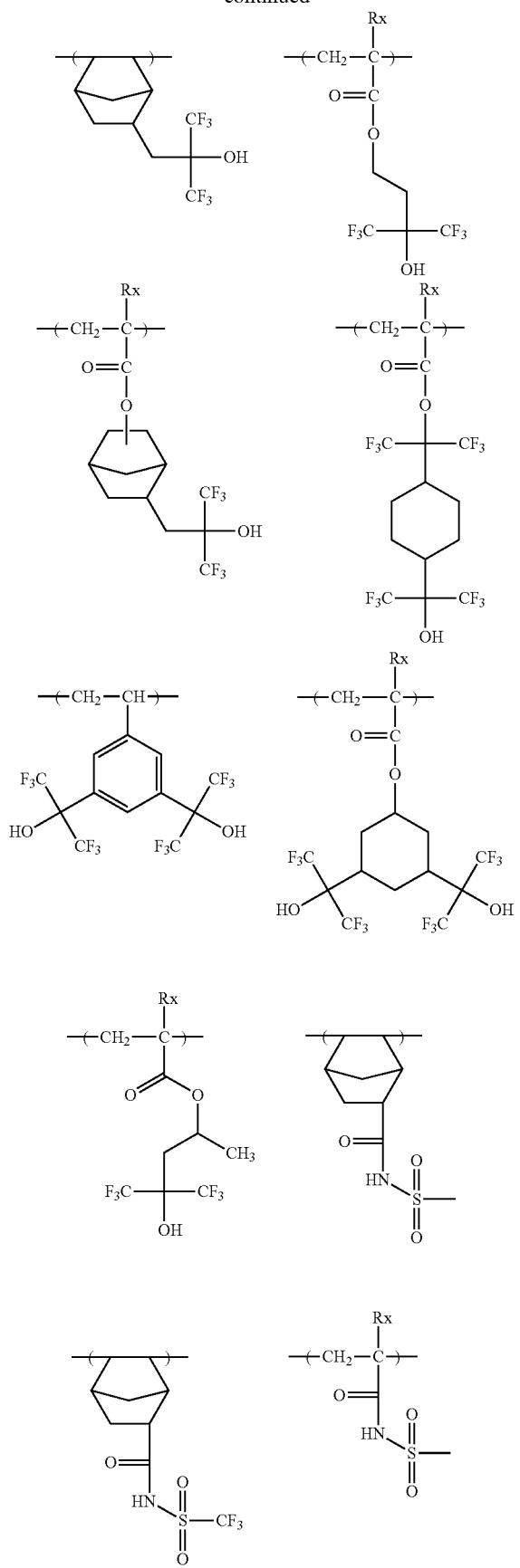
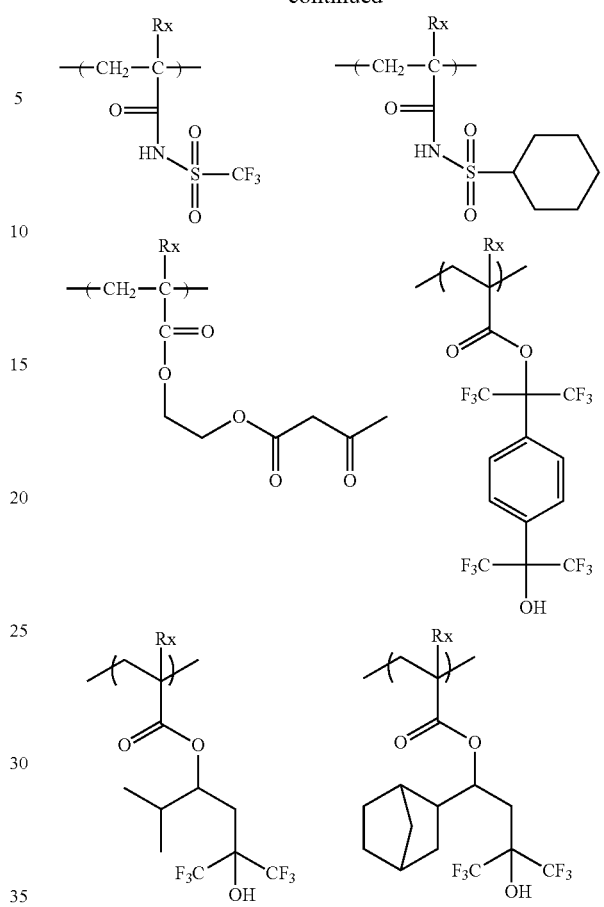

As the group with a lactone structure, an anhydride group, or an acid imide group (y), a group with a lactone structure is preferable.

The repeating unit which includes these groups is a repeating unit where the group is directly bonded to the main chain of the resin such as a repeating unit from an acrylic ester or a methacrylic ester. Alternatively, the repeating unit may be a repeating unit where the group is bonded to the main chain of the resin through a linking group. Alternatively, a polymerization initiator or chain transfer agent which have the group may be introduced to a terminal of the resin by being used during polymerization.

The content of the repeating unit with the group with a lactone structure, an acidic anhydride group, or an acidic imide group is preferably 1 to 100 mol %, is more preferably 3 to 98 mol %, and is even more preferably 5 to 95 mol % with the total of the repeating units in the hydrophobic resin as a reference.

The repeating unit with the group which is decomposed by the action of an acid (z) in the hydrophobic resin (D) is not particularly limited if a known substance. The repeating unit with the group which is decomposed by the action of an acid (z) may have at least any of a fluorine atom or a silicon atom. The content of the repeating unit with the group which is decomposed by the action of an acid (z) is preferably 1 to 80 mol %, is more preferably 10 to 80 mol %, and is even more preferably 20 to 60 mol % with regard to the total of the repeating units in the resin (D).

The hydrophobic resin (D) may further contain a repeating unit which is represented by the general formula (III) below.

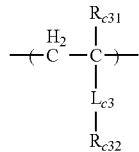
(III)

In the general formula (III), $R_{c31}$ represents a hydrogen atom, an alkyl group, (which may be substituted by a fluorine atom or the like), a cyano group, or a —$CH_2$—O-$Rac_2$ group. In the general formula, the $Rac_2$ group represents a hydrogen atom, an alkyl group, or acyl group. $R_{c31}$ is preferably a hydrogen atom, a methyl group, a hydroxymethyl group, or a trifluoromethyl group, and is particularly preferable a hydrogen atom or a methyl group.

$R_{c32}$ represents a group which has an alkyl group, a cycloalkyl group, an alkenyl group, a cycloalkenyl group, or an aryl group. These groups may be substituted with a group which includes a fluorine atom or a silicon atom.

$L_{c3}$ represents a single bond or a divalent linking group.

The alkyl group of $R_{c32}$ in the general formula (III) is preferably a linear or branched alkyl group with a carbon number of 3 to 20.

The cycloalkyl group is preferably a cycloalkyl group with a carbon number of 3 to 20.

The alkenyl group is preferably an alkenyl group with a carbon number of 3 to 20.

The cycloalkenyl group is preferably a cycloalkenyl group with a carbon number of 3 to 20.

The aryl group is preferably an aryl group with a carbon number of 6 to 20, is more preferably a phenyl group, a naphthyl group, and these may have a substituent.

$R_{c32}$ is preferably an unsubstituted alkyl group or an alkyl group which has been substituted by a fluorine atom.

The divalent linking group of $L_{c3}$ is preferably an alkylene group (preferably with a carbon number of 1 to 5), an ether bond, a phenylene group, or an ester bond (a group which is represented by —COO—).

The content amount of the repeating unit which is represented by the general formula (III) is preferably 1 to 100 mol %, is more preferably 10 to 90 mol %, and is even more preferably 30 to 70 mol % with the total of the repeating units in the hydrophobic resin as a reference.

The hydrophobic resin (D) preferably further has a repeating unit which is represented by the general formula (CII-AB) below.

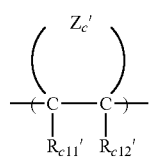
(CII-AB)

In the general formula (CII-AB), $R_{c11}'$ and $R_{c12}'$ each independently represent a hydrogen atom, a cyano group, a halogen atom or an alkyl group.

$Zc'$ represents an atomic group which contains two carbon atoms (C—C) which are bonded and which is for forming an alicyclic structure.

The content amount of the repeating unit which is represented by the general formula (CII-AB) is preferably 1 to 100 mol %, is more preferably 10 to 90 mol %, and is even more preferably 30 to 70 mol % with the total of the repeating units in the hydrophobic resin as a reference.

There are the examples of the specific examples of the repeating unit which is represented by the general formulae (III) and (CII-AB) below, but the present invention is not limited to these. In the general formulae, Ra represents H, $CH_3$, $CH_2OH$, $CF_3$ or CN.

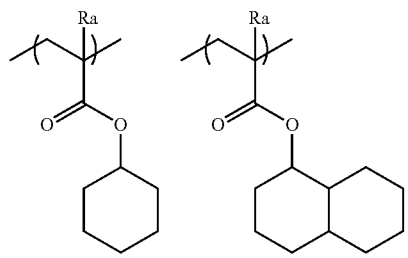

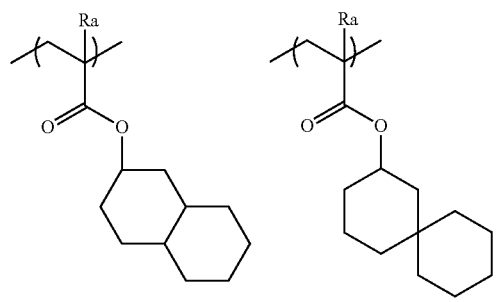

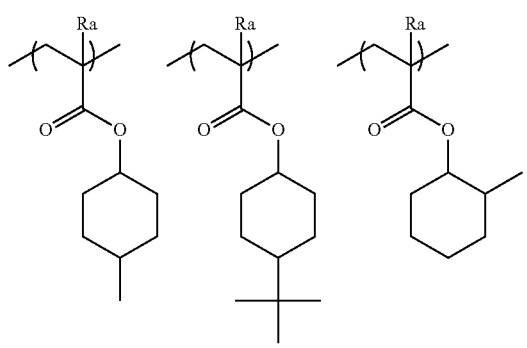

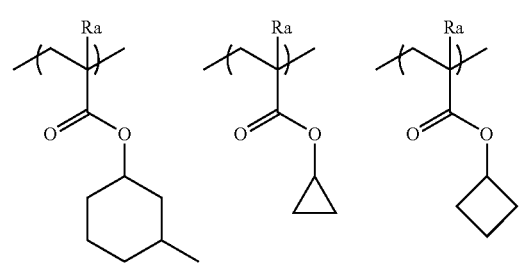

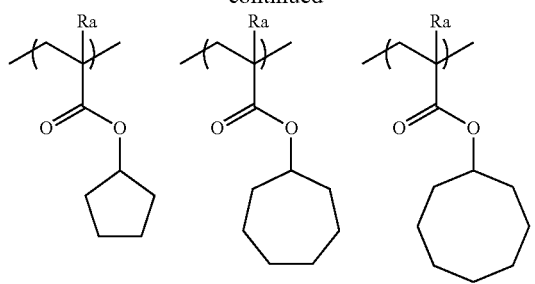
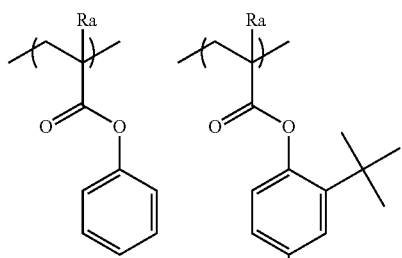
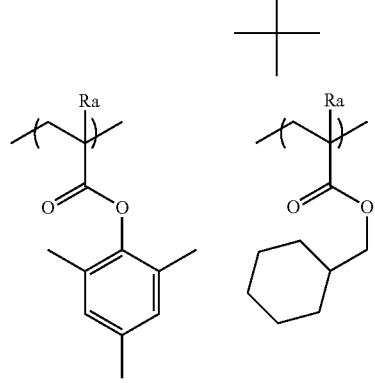
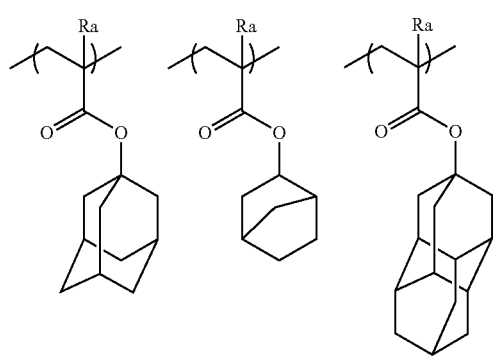
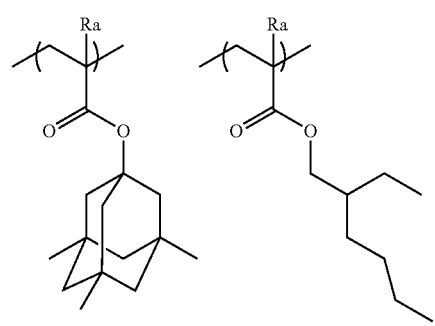
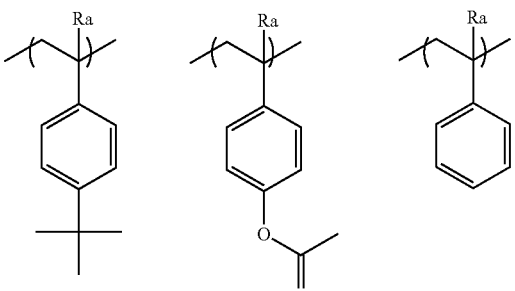
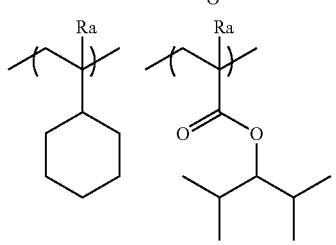
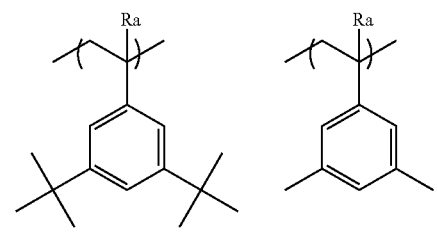
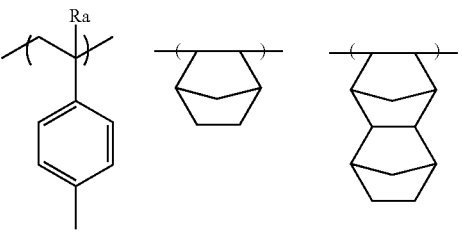
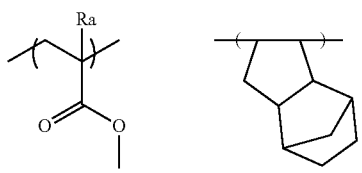
Below, specific examples of the hydrophobic resin (D) are shown. In addition, the molar ratios (which correspond to the order from the left of the respective repeating units), the weight average molecular weights, and the dispersion of the repeating units in each of the resins are shown in the tables below.
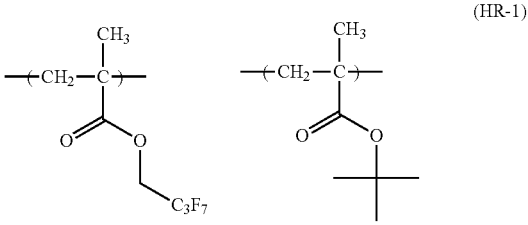
(HR-1)

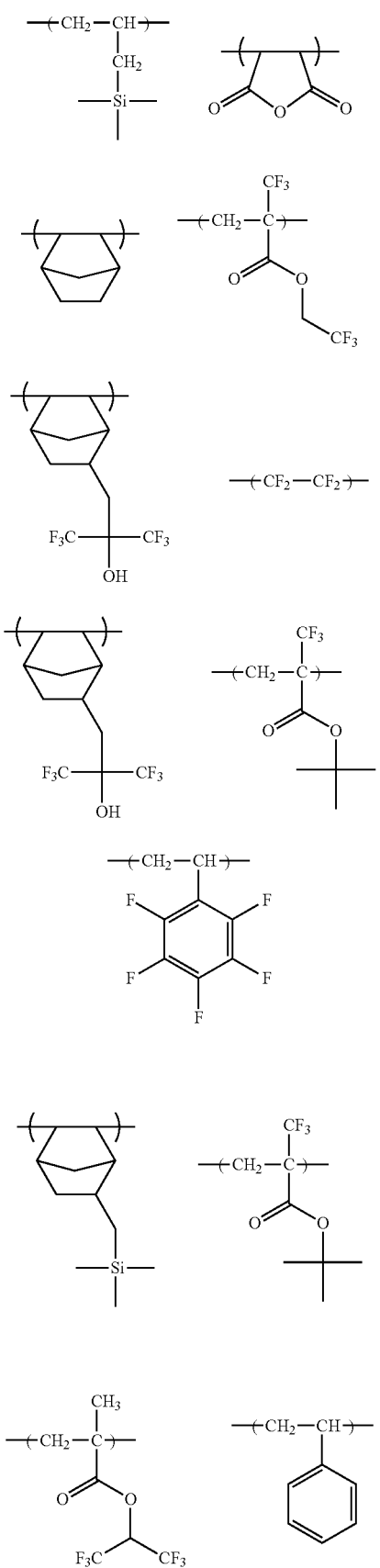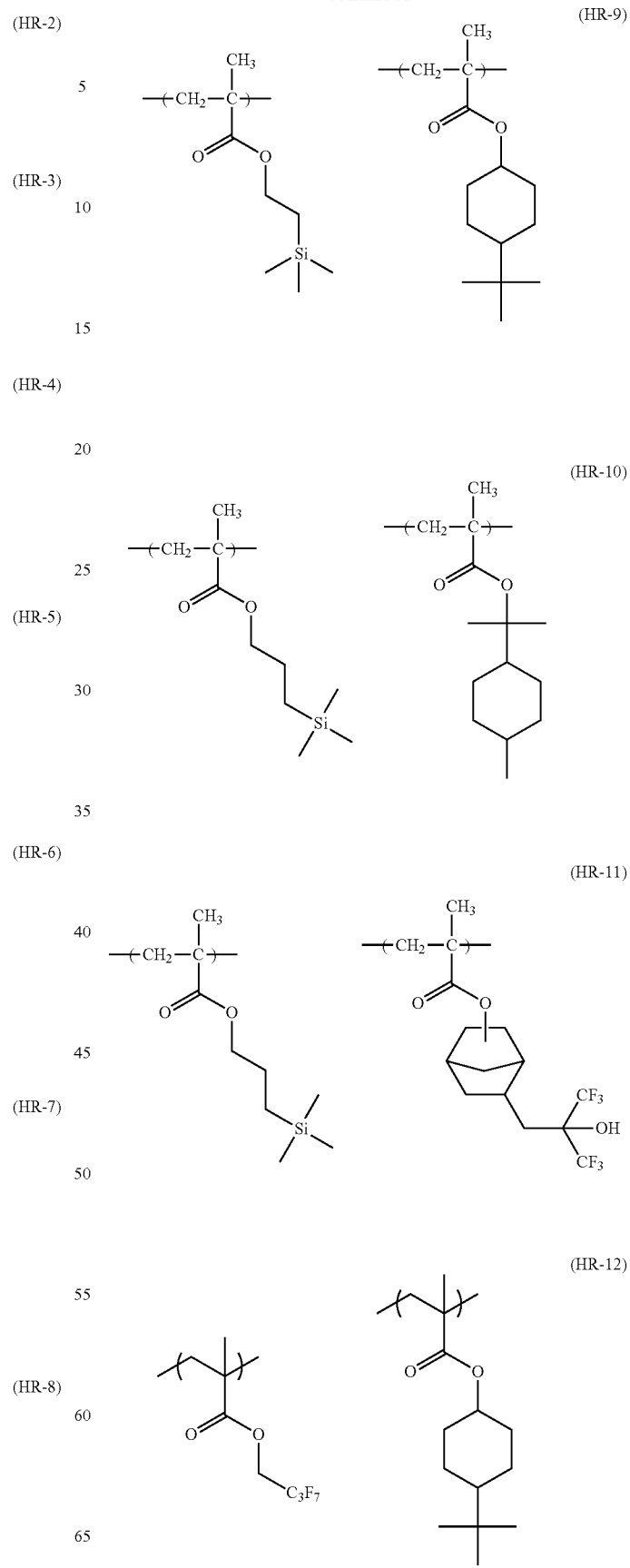

(HR-13) 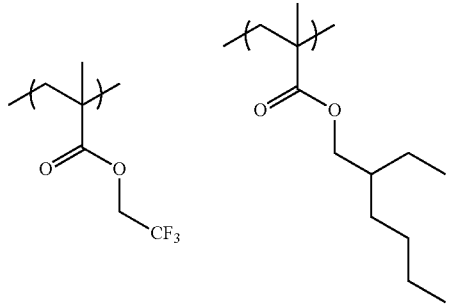
(HR-14) 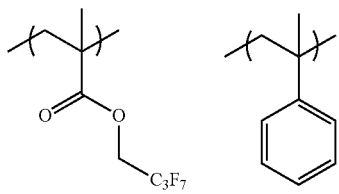
(HR-15) 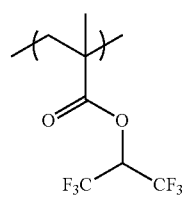
(HR-16) 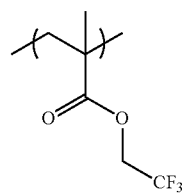
(HR-17) 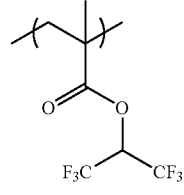
(HR-18) 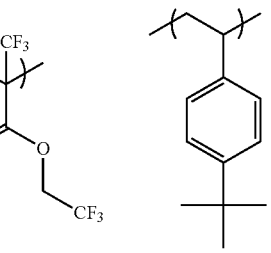
(HR-19) 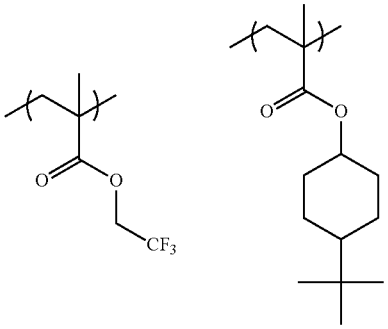
(HR-20) 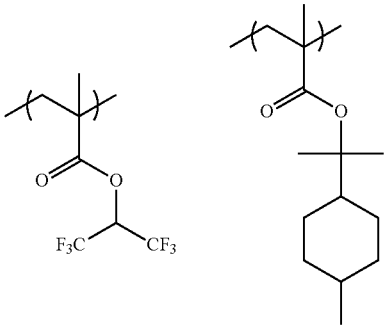
(HR-21) 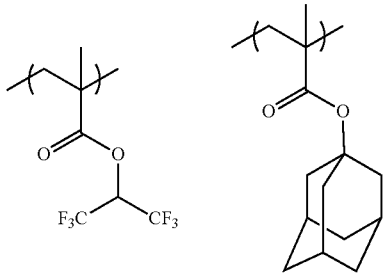
(HR-22) 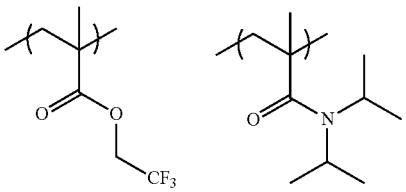
(HR-23) 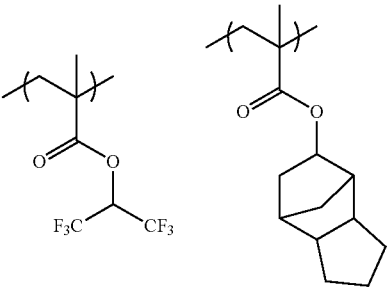

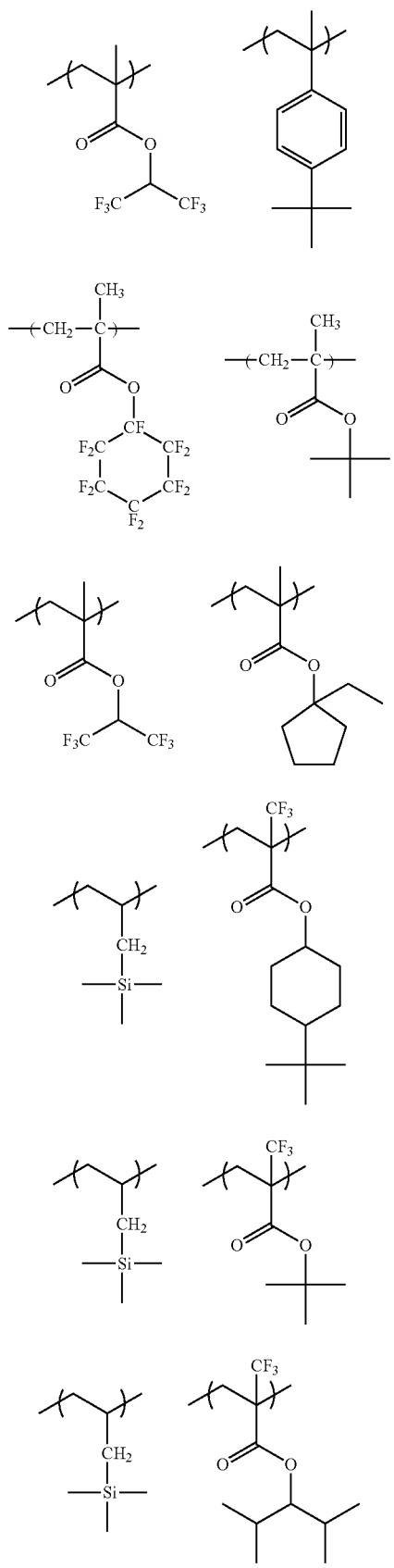
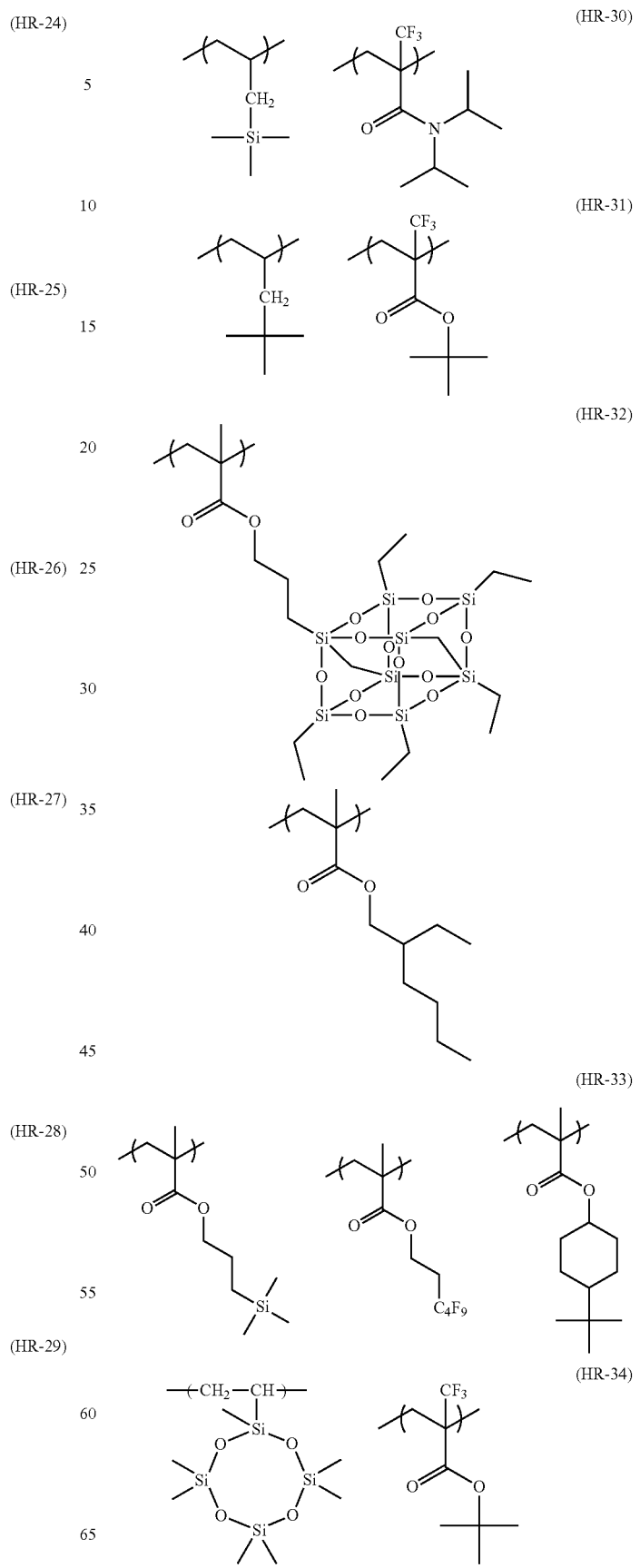

(HR-35)
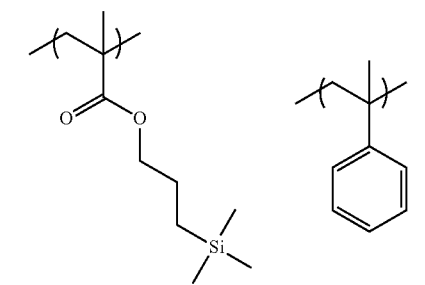
(HR-36)
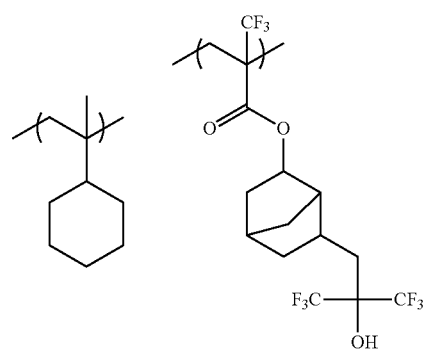
(HR-37)
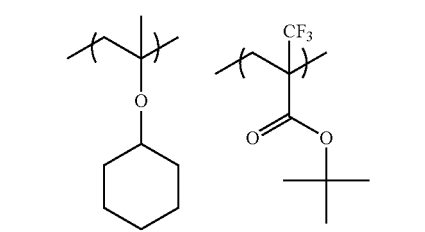
(HR-38)
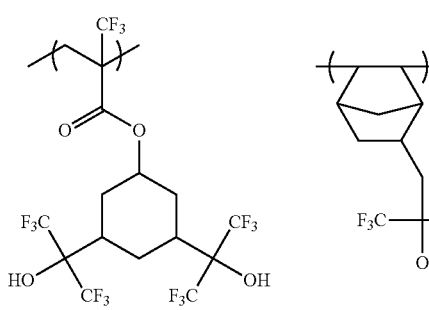
(HR-39)
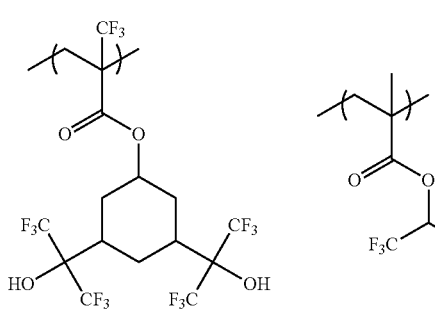
(HR-40)
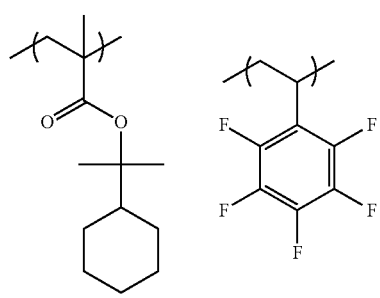
(HR-41)
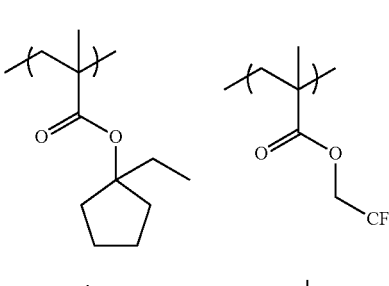
(HR-42)
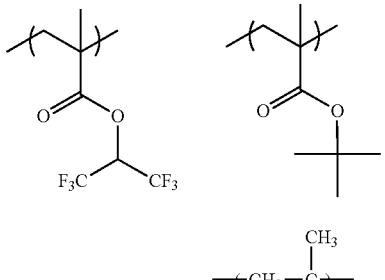
(HR-43)
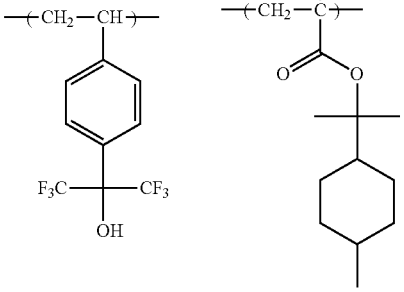
(HR-44)
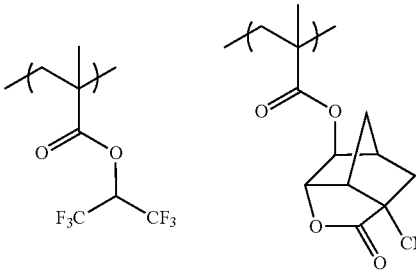
(HR-45)
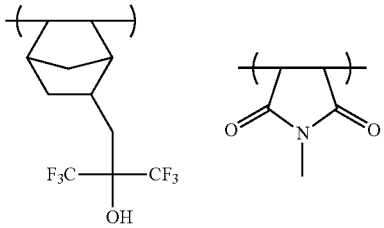

(HR-46)
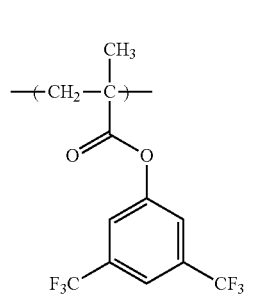 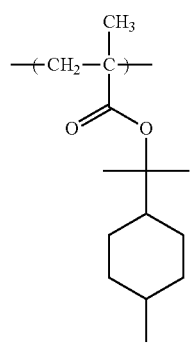
(HR-47)
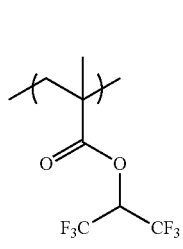 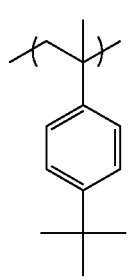 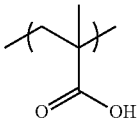
(HR-48)
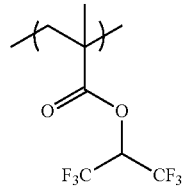 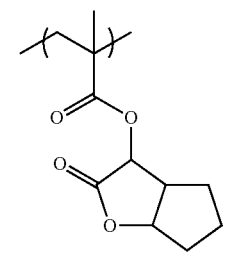
(HR-49)
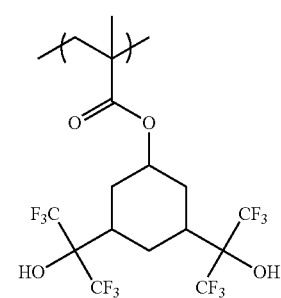
(HR-50)
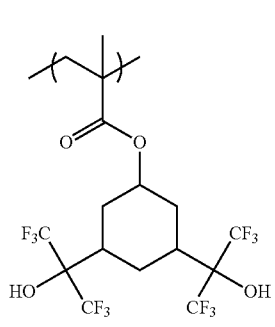 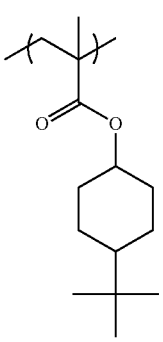
(HR-51)
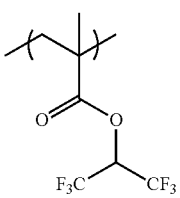 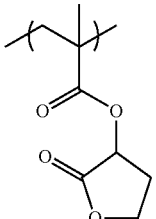 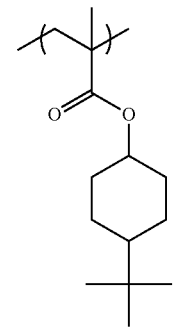
(HR-52)
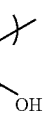
(HR-53)
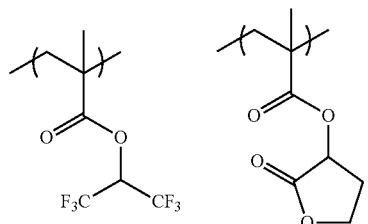 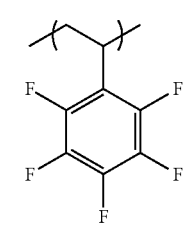
(HR-54)
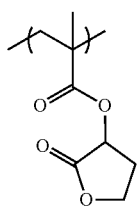 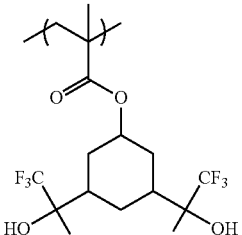
(HR-55)
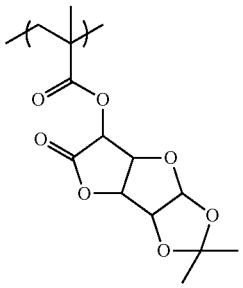 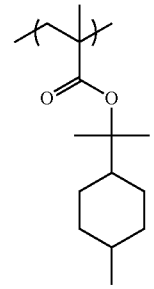

(HR-56)
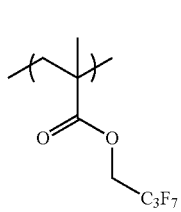 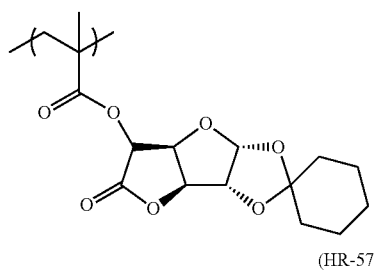
(HR-57)
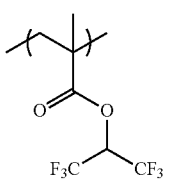 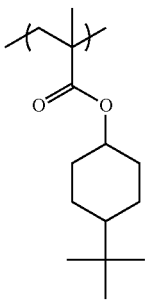
(HR-58)
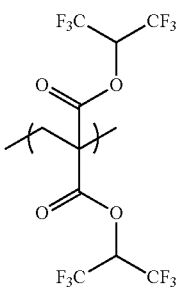 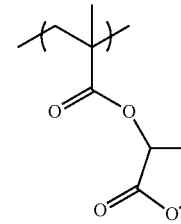
(HR-59)
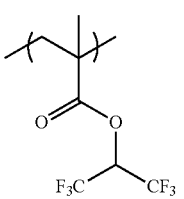 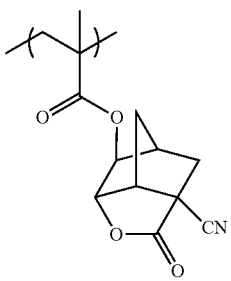
(HR-60)
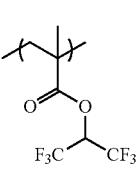 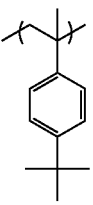 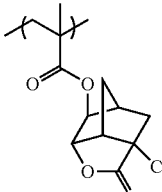 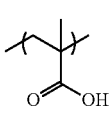
(HR-61)
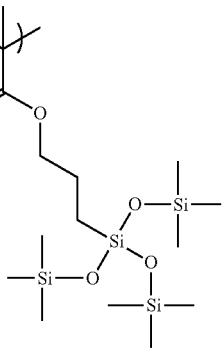 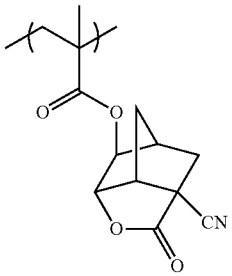
(HR-62)
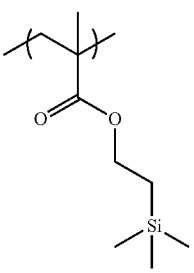 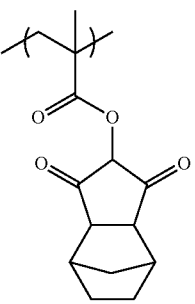
(HR-63)
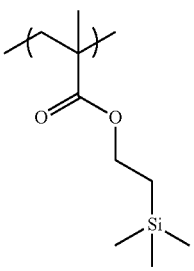 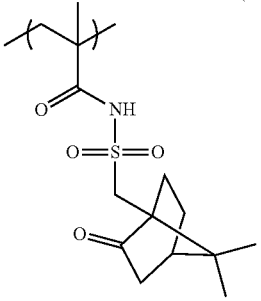
(HR-64)
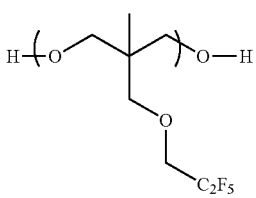
(HR-65)
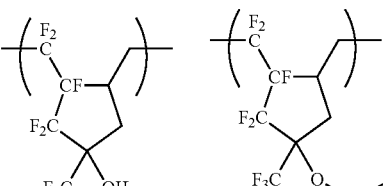 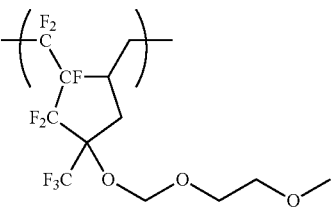

(HR-66)
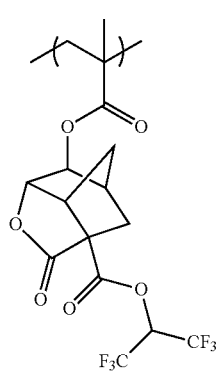
(HR-67)
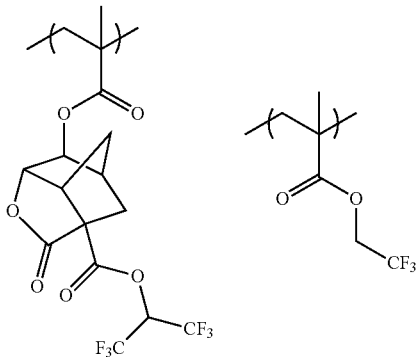
(HR-68)
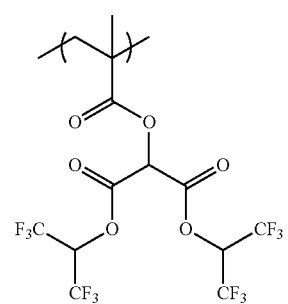
(HR-69)
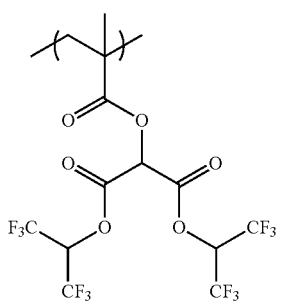 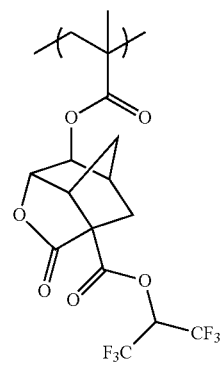
(HR-70)
(HR-71)
(HR-72)
(HR-73)
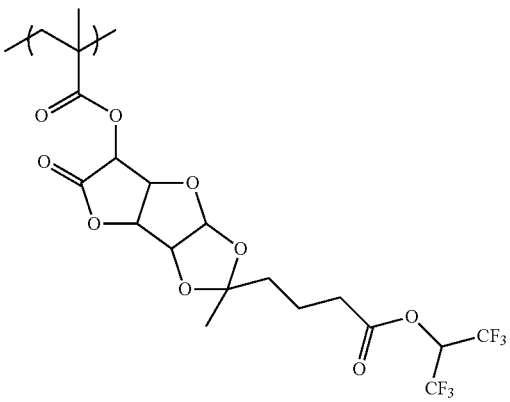

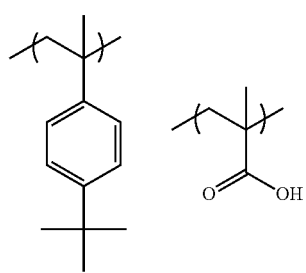
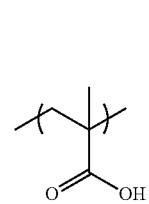
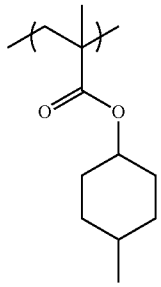
(HR-74)
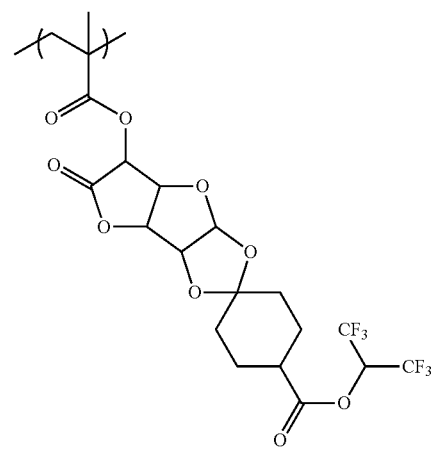
(HR-75)
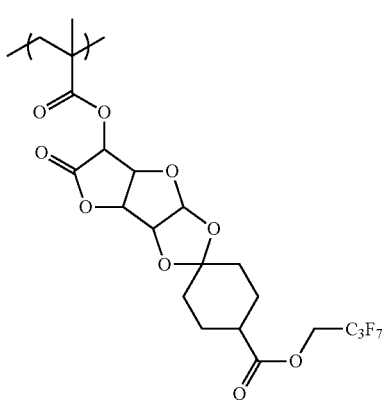
(HR-76)
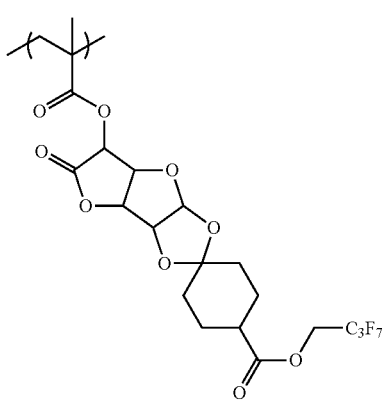
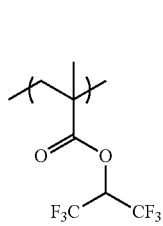
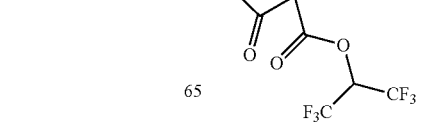
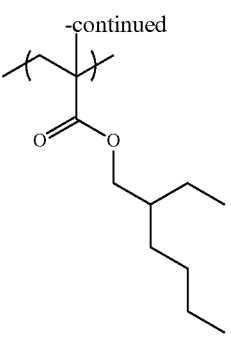
(HR-77)
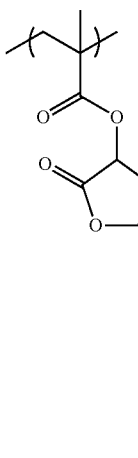
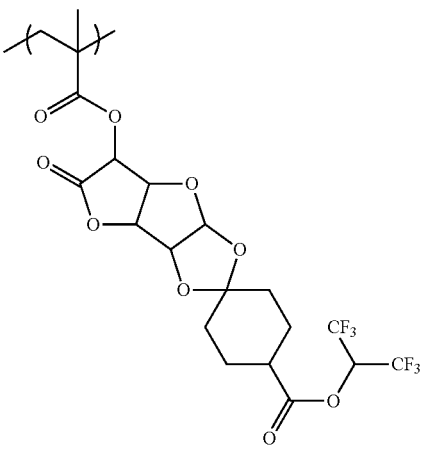
(HR-78)
(HR-79)
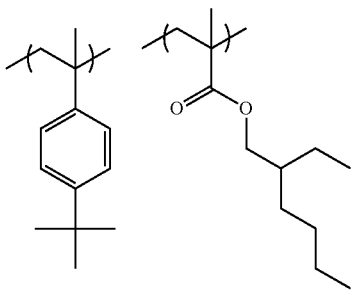

125
-continued
(HR-80)
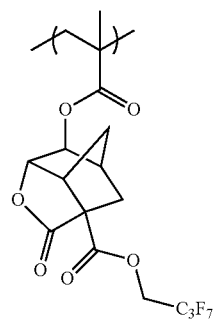 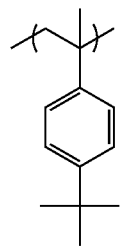 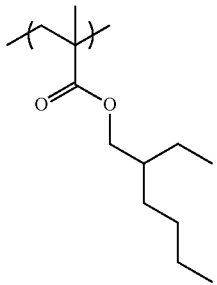
(HR-81)
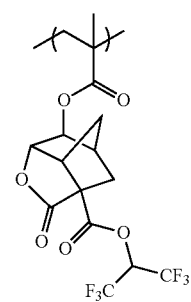 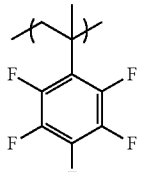 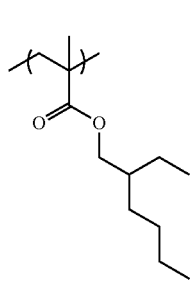
(HR-82)
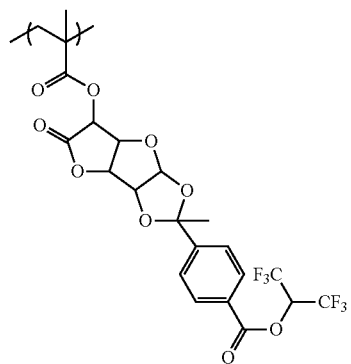 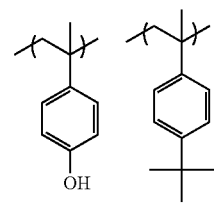
(HR-83)
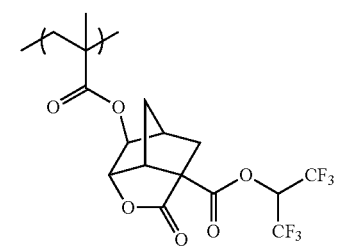 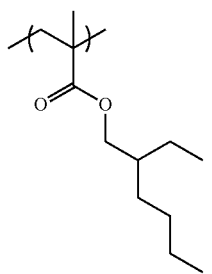
126
-continued
(HR-84)
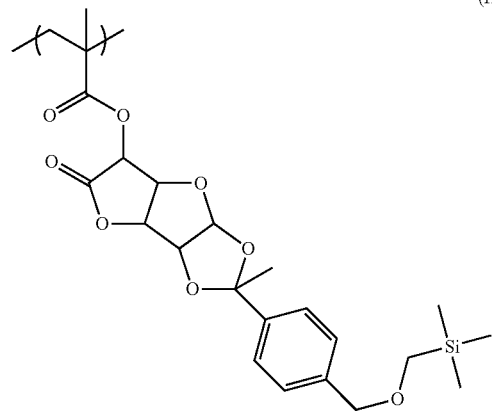
(HR-85)
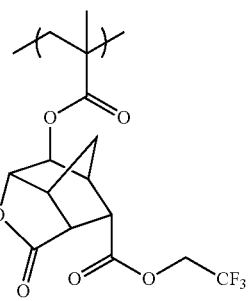 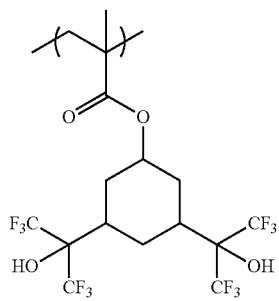
(HR-86)
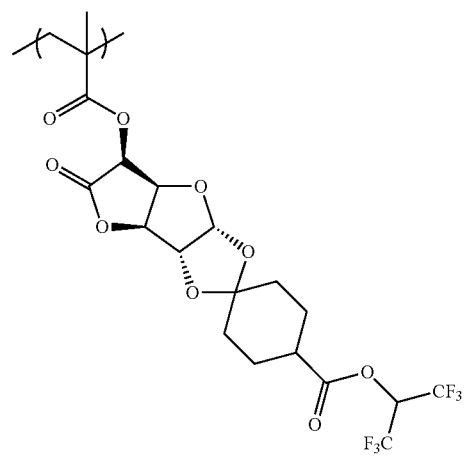
(HR-87)
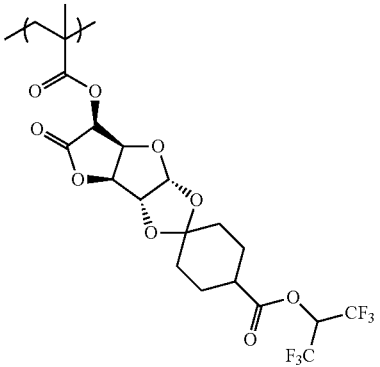 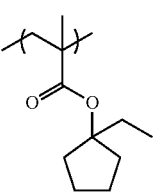

-continued

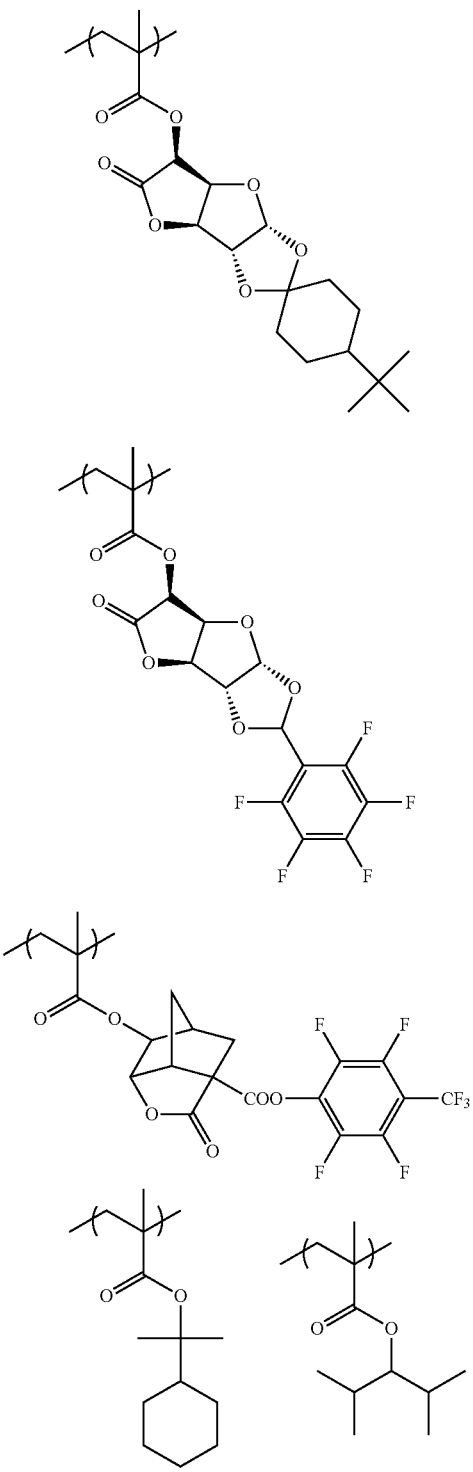

(HR-88)

(HR-89)

(HR-90)

TABLE 1

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |

TABLE 1-continued

| Resin | Composition | Mw | Mw/Mn |
|---|---|---|---|
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

TABLE 2

| Resin | Composition | Mw | Mw/Mn |
|---|---|---|---|
| HR-66 | 100 | 6000 | 1.5 |
| HR-67 | 100 | 6000 | 1.4 |
| HR-68 | 100 | 9000 | 1.5 |
| HR-69 | 60/40 | 8000 | 1.3 |
| HR-70 | 80/20 | 5000 | 1.4 |
| HR-71 | 100 | 9500 | 1.5 |
| HR-72 | 40/60 | 8000 | 1.4 |
| HR-73 | 55/30/5/10 | 8000 | 1.3 |
| HR-74 | 100 | 13000 | 1.4 |

TABLE 2-continued

| Resin | Composition | Mw | Mw/Mn |
|---|---|---|---|
| HR-75 | 70/30 | 8000 | 1.3 |
| HR-76 | 50/40/10 | 9500 | 1.5 |
| HR-77 | 100 | 9000 | 1.6 |
| HR-78 | 80/20 | 3500 | 1.4 |
| HR-79 | 90/8/2 | 13000 | 1.5 |
| HR-80 | 85/10/5 | 5000 | 1.5 |
| HR-81 | 80/18/2 | 6000 | 1.5 |
| HR-82 | 50/20/30 | 5000 | 1.3 |
| HR-83 | 90/10 | 8000 | 1.4 |
| HR-84 | 100 | 9000 | 1.6 |
| HR-85 | 80/20 | 15000 | 1.6 |
| HR-86 | 70/30 | 4000 | 1.42 |
| HR-87 | 60/40 | 8000 | 1.32 |
| HR-88 | 100 | 3800 | 1.29 |
| HR-89 | 100 | 6300 | 1.35 |
| HR-90 | 50/40/10 | 8500 | 1.51 |

In a case where the hydrophobic resin (D) has fluorine atoms, the content amount of the fluorine atoms is preferably 5 to 80 mass % and is more preferably 10 to 80 mass % with regard to the weight average molecular weight of the hydrophobic resin (D). In addition, the repeating unit which contains a fluorine atom preferably is present in an amount of 10 to 100 mass % and more preferably 30 to 100 mass % With regard to the total of the repeating units included in the hydrophobic resin (D).

In a case where the hydrophobic resin (D) has a silicon atom, the content of the silicon atoms is preferably 2 to 50 mass % and is more preferably 2 to 30 mass % with regard to the weight average molecular weight of the hydrophobic resin (D). In addition, the repeating unit which contains a silicon atom preferably is in an amount of 10 to 100 mass % and more preferably 20 to 100 mass % among the total of the repeating units in the hydrophobic resin (D).

The weight average molecular weight of the hydrophobic resin (D) in terms of a standard polystyrene conversion is preferably 1,000 to 100,000, is more preferably 1,000 to 50,000, and is still more preferably 2,000 to 15,000. In addition, the molecular weight dispersion (Mw/Mn, referred to as dispersion) is preferably in the range of 1 to 5, is more preferably 1 to 3, and is even more preferably 1 to 2 from the point of resolution, resist formation, side walls of the resist pattern, roughness, and the like.

The hydrophobic resin (D) may use one type or may use a plurality of types together.

The content of the hydrophobic resin (D) in the composition is preferably 0.01 to 10 mol %, is more preferably 0.05 to 8 mol %, and is even more preferably 0.1 to 5 mol % with regard to the total solid content of the composition of the present invention.

Solvent

The composition according to the present invention contains a solvent.

As the solvent, for example, there can be the examples of an organic solvent such as alkylene glycol monoalkyl ether carboxylate, alkylene glycol monoalkyl ether, alkyl lactate ester, alkyl alkoxypropionate, cyclic lactone (preferably having a carbon number of 4 to 10), monoketone compound (preferably having a carbon number of 4 to 10) which may contain a ring, alkylene carbonate, alkoxyalkyl acetate and alkyl pyruvate.

As the alkylene glycol monoalkyl ether carboxylate, for example, there preferably are the examples of propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

As the alkylene glycol monoalkyl ether, for example, there preferably are the examples of propylene glycol monomethyl ether, propylene glycol monoethyl ether, propylene glycol mono propyl ether, propylene glycol monobutyl ether, ethylene glycol monomethyl ether, and ethylene glycol mono ethyl ether.

As the alkyl lactate ester, for example, there preferably are the examples of methyl lactate, ethyl lactate, propyl lactate, and butyl lactate.

As the alkyl alkoxypropionate, for example, there preferably are 3-ethylethoxy propionate, 3-methylmethoxy propionate, 3-methylethoxy propionate, and 3-ethylmethoxy propionate.

As the cyclic lactone, for example, there preferably are the examples of β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolactone.

As the monoketone compound which may contain a ring, for example, there preferably are the examples of 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, and 3-methylcycloheptanone.

As the alkylene carbonate, for example, there preferably are propylene carbonate, vinylene carbonate, ethylene carbonate, and butylene carbonate.

As the alkoxyalkyl acetate, for example, there preferably are acetate 2-methoxyethyl, acetate 2-ethoxyethyl, acetate 2-(2-ethoxyethoxy)ethyl, acetate 3-methoxy-3-methylbutyl, and acetate 1-methoxy-2-propyl.

As the alkyl pyruvate, for example, there preferably are methyl pyruvate, ethyl pyruvate, and propyl pyruvate.

As the solvent which can be preferably used, there is the example of a solvent having a boiling point of 130° C. or more at room temperature and normal pressure. As specific examples, there are the examples of cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate and propylene carbonate. In the present invention, the solvent may be used singly or two or more types may be used in combination.

In the present invention, a mixed solvent where a solvent which contains a hydroxyl group in the structure and a solvent which does not contain a hydroxyl group may be used as the organic solvent.

The examples of the compound described above as a solvent which contains a hydroxyl group and a solvent which does not contain a hydroxyl group can be appropriately selected, but as the solvent containing a hydroxyl group, an alkylene glycol monoalkyl ether, an alkyl lactate, and the like are preferable and propylene glycol monomethyl ether and ethyl lactate are more preferable. In addition, as the solvent containing no hydroxyl group, an alkylene glycol monoalkyl ether acetate, an alkyl alkoxypropionate, a monoketone compound which may contain a ring, a cyclic lactone, and an alkyl acetate are preferable, and among these, propylene glycol monomethyl ether acetate, ethyl ethoxypropionate, 2-heptanone, γ-butyrolactone, cyclohexanone and butyl acetate are particularly preferable, and propylene glycol monomethyl ether acetate, ethyl ethoxypropionate and 2-heptanone are most preferable.

The mixing ratio (by mass) of the solvent which contains a hydroxyl group and the solvent which does not contain a hydroxyl group is 1/99 to 99/1, is preferably 10/90 to 90/10, and is more preferably from 20/80 to 60/40. A mixed solvent which contains the solvent which does not contain a hydroxyl group in a ratio of 50 mass % or more is particularly preferable in view of coating uniformity.

The solvent is preferably a mixed solvent of two or more types of solvents containing propylene glycol monomethyl ether acetate.

[Surfactant]

The composition of the present invention may further contain a surfactant. In a case of being contained, any of a fluorine-based and/or silicon-based surfactant (a fluorine-based surfactant, a silicon-based surfactant, or a surfactant with both fluorine atoms and silicon atoms), or two or more types is preferably contained.

Due to the composition of the present invention containing the surfactant described above, a resist pattern with excellent sensitivity and resolution and with less adherence and development defects can be provided when using an exposure light source of 250 nm or less and particularly of 220 nm or less.

As the fluorine-based and/or silicon-based surfactant, there is the example of a surfactant which is described in paragraph [0276] of US2008/0248425B, and for example, there are EFtop EF301 and EF303 (manufactured by Shin-Akita Kasei K.K.), Florad FC430, 431 and 4430 (manufactured by Sumitomo 3M Inc.), Megafac F171, F173, F176, F189, F113, F110, F177, F120 and R08 (manufactured by Dainippon Ink & Chemicals, Inc.), Surflon S-382, SC101, 102, 103, 104, 105 and 106 (manufactured by Asahi Glass Co., Ltd.), Troysol S-366 (manufactured by Troy Chemical), GF-300 and GF-150 (manufactured by Toagosei Chemical Industry Co., Ltd.), Surflon S-393 (manufactured by Seimi Chemical Co., Ltd.), EFtop EF121, EF122A, EF122B, RF122C, EF125M, EF135M, EF351, EF352, EF801, EF802 and EF601 (manufactured by JEMCO Inc.), PF636, PF656, PF6320 and PF6520 (manufactured by OMNOVA Solutions Inc.) and FTX-204G, 208G, 218G, 230G, 204D, 208D, 212D, 218D and 222D (manufactured by NEOS Co., Ltd.). In addition, polysiloxane polymer KP-341 (manufactured by Shin-Etsu Chemical Co., Ltd.) may also be used as the silicon-based surfactant.

In addition, as the surfactant, other than these known surfactants, a surfactant using a polymer with a fluoro-aliphatic group, which is derived from a fluoro-aliphatic compound manufactured by a telomerization process (also called a telomer process) or an oligomerization process (also called an oligomer process), can be used. The fluoro-aliphatic compound can be synthesized by the method described in JP-2002-90991A.

The polymer with a fluoro-aliphatic group is preferably a copolymer of a monomer with a fluoro-aliphatic group and a (poly(oxyalkylene)) acrylate and/or a (poly(oxyalkylene)) methacrylate, and the polymer may have an irregular distribution or may be a block copolymer. As the poly(oxyalkylene) group, there are the examples of a poly(oxyethylene) group, a poly(oxypropylene) group and a poly(oxybutylene) group. In addition, there may also be a unit with an alkylene with a different chain length within the same chain length such as poly(block-linking of oxyethylene, oxypropylene and oxyethylene) and poly(block-linking of oxyethylene and oxypropylene). Furthermore, the copolymer of a monomer with a fluoro-aliphatic group and a (poly(oxyalkylene)) acrylate (or methacrylate) is not limited only to a binary copolymer but may also be a ternary or greater copolymer obtained by simultaneously copolymerizing two or more different monomers with fluoro-aliphatic groups or two or more different (poly(oxyalkylene)) acrylates (or methacrylates).

For example, as the commercially available surfactant, there can be the examples of Megafac F178, F-470, F-473, F-475, F-476 and F-472 (manufactured by Dainippon Ink & Chemicals, Inc.), a copolymer of an acrylate (or methacrylate) with a $C_6F_{13}$ group and a (poly(oxyalkylene)) acrylate (or methacrylate), and a copolymer of an acrylate (or methacrylate) with a $C_3F_7$ group and a (poly(oxyethylene)) acrylate (or methacrylate) and a (poly(oxypropylene)) acrylate (or methacrylate).

In addition, in the present invention, surfactants which are described in paragraph of US2008/0248425B other than the fluorine-based and/or silicon-based surfactant can also be used.

The surfactants may be used singly or in combination of several may be used.

In a case where the surfactant is contained in the composition of the present invention, the content thereof is preferably 0.1 to 2 mass %, is more preferably 0.1 to 1.5 mass %, and is even more preferably 0.1 to 1 mass % with the total solid content of the composition as a reference.

Onium Salt Carboxylate

The composition of the present invention may contain an onium salt carboxylate. As the onium salt carboxylate, an iodonium salt or a sulfonium salt is preferable. A linear or branched, monocyclic or polycyclic alkylcarboxylate anion with a carbon number of 1 to 30 is preferable as the anion moiety. A carboxylate anion where an alkyl group is partially or entirely substituted with fluorine is preferable. The alkyl chain may contain an oxygen atom. Due to this, the transparency with regard to light at 220 nm or less is guaranteed, the sensitivity and resolution are improved, and the density bias and exposure margin are improved.

As the fluorine-substituted carboxylate anion, there are the examples of fluoroacetate, difluoroacetate, trifluoro acetate, pentafluoropropionate, heptafluorobutyrate, nonafluoropentanoate, perfluorododecanoate, perfluorotridecanoate, perfluorocyclohexanecarboxylate and 2,2-bistrifluoromethylpropionate anions.

The content of the onium salt carboxylate in the composition is typically 0.1 to 20 mass %, is more preferably 0.5 to 10 mass %, and is even more preferably 1 to 7 mass % with the total solid content of the composition as a reference.

[Dissolution Inhibiting Compound]

The composition of the present invention has a dissolution inhibiting compound which increases the solubility in an alkali developing solution by being decomposed due to the action of an acid and which has a molecular weight of 3000 or less. As the dissolution inhibiting compound, an alicyclic or aliphatic compound which contain an acid decomposable group such as a cholic acid derivative which includes an acid decomposable group which is described in the Proceeding of SPIE, 2724, 355 (1996) in order for transparency at 220 nm or less is not to be reduced. As the acid decomposable group and the alicyclic structure, there are the same examples as described with regard to the resin (A).

In the case of exposing the composition of the present invention using a KrF excimer laser or irradiating using an electron beam, the dissolution inhibiting compound contains a structure where the phenolic hydroxyl group of a phenol compound is substituted by an acid decomposable group. As the phenol compound, a compound containing from 1 to 9 phenol skeletons is preferable and more preferably from 2 to 6 phenol skeletons.

The additive amount of the dissolution inhibiting compound is preferably 3 to 50 mass % and is more preferably from 5 to 40 mass % with regard to the total solid content of the actinic ray-sensitive or radiation-sensitive resin composition.

Specific examples of the dissolution inhibiting compound are shown below, but the present invention is not limited to these.

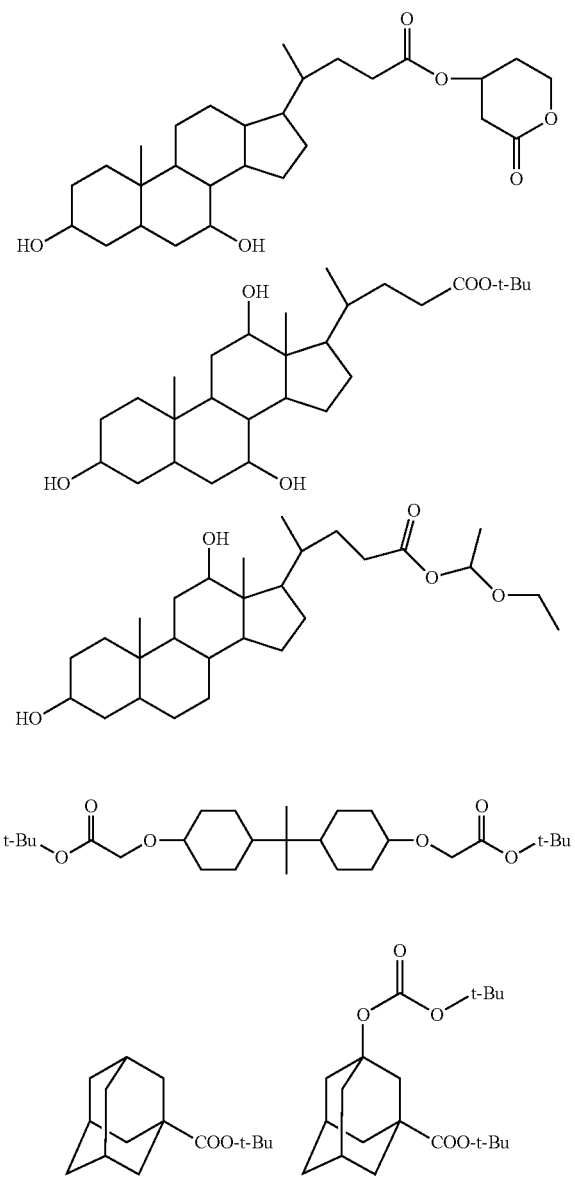

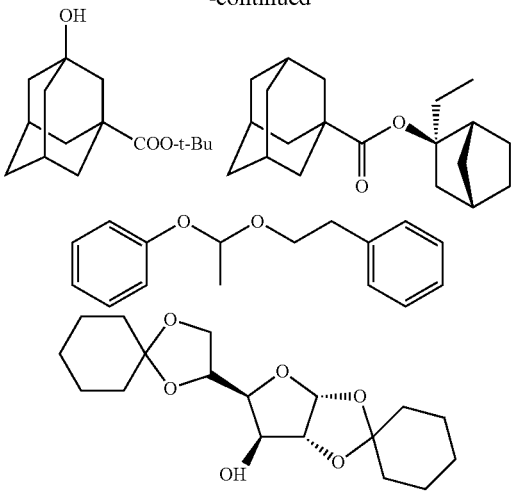

[Other Additives]

In the composition of the present invention, a dye, a plasticizer, a photosensitizer, a light absorber, a compound for accelerating dissolution in a developer (for example, a phenol compound with a molecular weight of 1000 or less or a carboxyl group-containing alicyclic or aliphatic compound) and the like as required.

The phenol compound with a molecular weight of 1000 or less can be easily synthesized by those skilled in the art by referring to the methods described, for example, in JP1992-122938A (JP-H4-122938A), JP1990-28531A (JP-H2-28531A), U.S. Pat. No. 4,916,210B, and EP219294B.

Specific examples of the carboxyl group-containing alicyclic or aliphatic compound include a carboxylic acid derivative having a steroid structure such as a cholic acid, a deoxycholic acid and a lithocholic acid, an adamantanecarboxylic acid derivative, an adamantanedicarboxylic acid, a cyclohexanecarboxylic acid, a cyclohexanedicarboxylic acid, and the like but are not limited to these.

[Pattern Forming Method]

The composition of the present invention is preferably used with a film thickness of 30 to 300 nm, is more preferably used with a film thickness of 80 to 280 nm, and is even more preferably used with a film thickness of 100 to 260 from the point of view of improving the resolution. Such a film thickness can be obtained by setting the solid content concentration in the actinic ray-sensitive or radiation-sensitive resin composition to an appropriate range to impart an appropriate viscosity and improving the coatability and film-forming properties.

The total solid content concentration of the composition of the present invention is typically 1 to 10 mass %, is preferably 3 to 9 mass %, more preferably 6 to 8 mass %.

The composition of the present invention is used by dissolving the components described above in a predetermined organic solvent, preferably in the mixed solvent described above, and, after filtering, coating on a predetermined support medium as follows. The pore size of the filter used for filtration is preferably 0.1 μm or less, is more preferably 0.05 μm or less, and is even more preferably 0.03 μm or less in a filter made of polytetrafluoroethylene, polyethylene or nylon.

For example, the actinic ray-sensitive or radiation-sensitive resin composition is coated on a substrate (for example, a bare silicon wafer, a silicon wafer with an oxide film, or the like) as used in the production of a precision integrated circuit element by an appropriate coating method such as a spinner or coater and dried to form a film.

The film is irradiated with actinic rays or radiation through a predetermined mask, preferably subjected to baking (heating), and developed and rinsed. Due to this, an excellent pattern can be obtained.

As the actinic rays or radiation, there can be the examples of infrared light, visible light, ultraviolet light, far ultraviolet light, extreme ultraviolet light, X-rays, an electron beam, or the like but far ultraviolet light at a wavelength of 250 nm or less is preferable, 220 nm or less is more preferable, a wavelength of 1 to 200 nm is still more preferable. Specific examples thereof include a KrF excimer laser (248 nm), an ArF excimer laser (193 nm), a $F_2$ excimer laser (157 nm), X-rays and an electron beam, and an ArF excimer laser, a $F_2$ excimer laser, EUV (13 nm) and an electron beam are preferable.

Before forming the film, an antireflection film may be provided in advance by coating on the substrate.

As the antireflection film used, an inorganic film type such as titanium, titanium dioxide, titanium nitride, chromium oxide, carbon and amorphous silicon, or an organic film type which is formed from a light absorber and a polymer material can be used. In addition, as the organic antireflection film, a commercially available organic antireflection film can be used such as DUV30 Series and DUV-40 Series manufactured by Brewer Science, Inc. and AR-2, AR-3 and AR-5 manufactured by Shipley Co., Ltd.

As the alkali developing solution in the development step, a quaternary ammonium salt which is typified by tetramethylammonium hydroxide is normally used, but other than this, an aqueous alkali solution such as an inorganic alkali, a primary amine, a secondary amine, a tertiary amine, an alkanolamine, a cyclic amine or the like can also be used.

Furthermore, the alkali developing solution can be used by adding alcohols and a surfactant in appropriate amounts.

The alkali concentration of the alkali developing solution is normally from 0.1 to 20 mass %.

The pH of the alkali developing solution is usually from 10.0 to 15.0.

Furthermore, the aqueous alkali solution can be used by adding alcohols and a surfactant in an appropriate amount.

As the rinsing solution, the pure water may be used after adding a surfactant in an appropriate amount.

In addition, after the development process or rinsing process, a process can be performed for removing the developing solution or the rinsing solution which has adhered on the pattern using a supercritical fluid.

With regard to the film which is formed using the composition according to the present invention, immersion exposure may be performed. That is, irradiation with actinic rays or radiation may be performed in a state where a liquid with a refractive index higher than that of air is filled between the film and a lens. Due to this, resolution can be further improved.

An immersion liquid which is used in the immersion exposure is described below.

The immersion liquid is preferably a liquid which is transparent to the exposure light wavelength and has a temperature coefficient of refractive index which is as small as possible so as to minimize the distortion of an optical image which is projected on the resist film. In particular, in a case where the exposure light source is an ArF excimer laser (wavelength; 193 nm), water is preferably used from the point of ease of availability and ease of handling in addition to the points of view described above.

Furthermore, a medium with a refractive index of 1.5 or more can also be used in order to achieve a shorter wavelength. This medium may be either an aqueous solution or an organic solvent.

In the case where water is used as the immersion liquid, in order to decrease the surface tension of water and increase the surface activity, an additive (liquid), which does not dissolve the resist layer on a wafer and has only a negligible effect on the optical coating at the lower surface of the lens element, may be added in a small ratio.

As the additive, an aliphatic-based alcohol with a refractive index which is substantially equal to that of water is preferable, and specifically, there are the examples of a methyl alcohol, an ethyl alcohol, and an isopropyl alcohol. Due to the addition of an alcohol with a refractive index substantially equal to that of water, the change in the refractive index of the entire liquid can be made to be very small even when the alcohol component in water evaporates and the content concentration thereof changes. On the other hand, since distortion of the optical image which is projected on the resist may occur in a case where a substance which is not transparent with regard to light at 193 nm or an impurity with a refractive index which is considerably different from that of water is mixed in, the water used is preferably distilled water. Furthermore, pure water where filtering is performed through an ion exchange filter or the like may also be used.

The electrical resistance of the water which is used as the immersion liquid is desired to be 18.3 MΩcm or more, TOC (organic concentration) is desired to be 20 ppb or less, and a degassing process is desired.

The lithography performance can be improved by increasing the refractive index of the immersion liquid. From this point of view, an additive for increasing the refractive index may be added to water or heavy water ($D_2O$) may be used instead of water.

As the alkali developing solution in the development step, an aqueous solution of a quaternary ammonium salt which is typified by tetramethylammonium hydroxide is normally used, but other aqueous alkali solutions such as an inorganic alkali, a primary amine, a secondary amine, a tertiary amine, an alcohol amine, a cyclic amine or the like can also be used. An appropriate amount of an alcohol and/or a surfactant may be added to the alkali developing solution.

The alkali concentration of the alkali developing solution is normally from 0.1 to 20 mass %.

The pH of the alkali developing solution is usually from 10.0 to 15.0.

As the rinsing solution, the pure water may be used after adding a surfactant in an appropriate amount. In addition, after the development process or rinsing process, a process can be performed for removing the developing solution or the rinsing solution which has adhered on the pattern using a supercritical fluid.

EXAMPLE

Below, the present invention will be described further in detail using examples, but the content of the invention is not limited to these.

Synthesis Example 1

Synthesis of Acid Decomposable Resin (A-1)

A resin (A-1) shown below was synthesised as follows.

Under a nitrogen stream, 40 g of cyclohexanone was added into a three-necked flask, and the flask was heated at 80° C. (solvent 1). Monomers which correspond to the repeating units below were dissolved in the cyclohexanone with respective molar ratios of 40/10/40/10 and a monomer solution of 20 mass % (400 g) was prepared. Furthermore, 8.0 mol % of a polymerization initiator V-601 (manufactured by Wako Pure Chemical Industries, Ltd.) with regard to the monomers was added to the monomer solution and dissolved, the solution obtained was added dropwise to the solvent 1 over 6 hours. After the completion of dropwise addition, the mixture was further reacted at 80° C. for 2 hours. The reaction solution was cooled and then poured dropwise to a mixed solution of 3600 ml of heptane and 400 ml of ethyl acetate, and when the precipitated precipitate was collected by filtration and dried to obtain the resin (A-1) of 74 g. The polymer composition ratio obtained from NMR was 40/10/40/10. The weight average molecular weight (polystyrene conversion) of the resin (A-1) which has been obtained was 6200 and the dispersion (Mw/Mn) was 1.66.

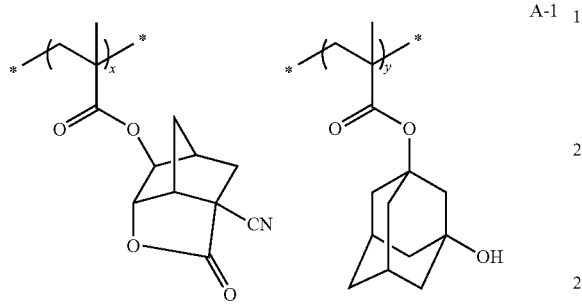

A-1

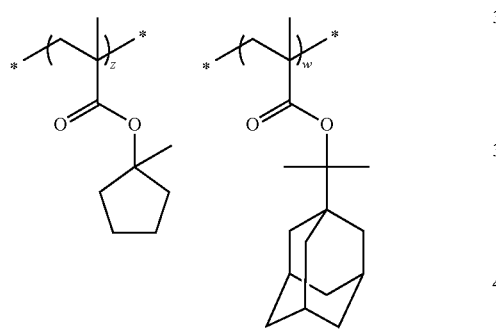

x/y/z/w = 40/10/40/10
Mw = 6200, Mw/Mn = 1.66

In the same manner, resins (A-2) to (A-12) and (CP-1) shown below were synthesised.

The molar ratios (corresponding in order from the left in structural general formulae) of the repeating units of each of the resins, the weight average molecular weights (Mw) and dispersions (Mw/Mn) are shown in the Table below.

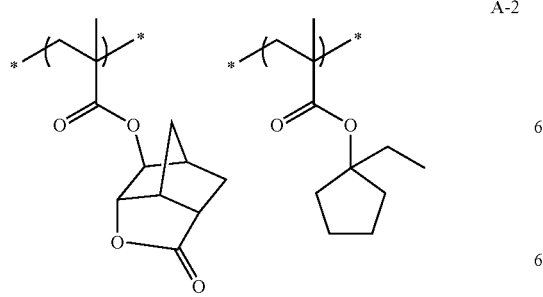

A-2

-continued

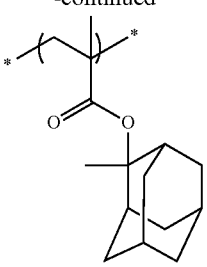

A-3

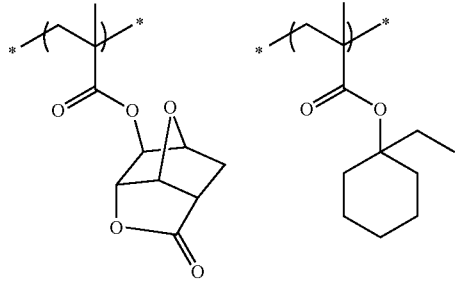

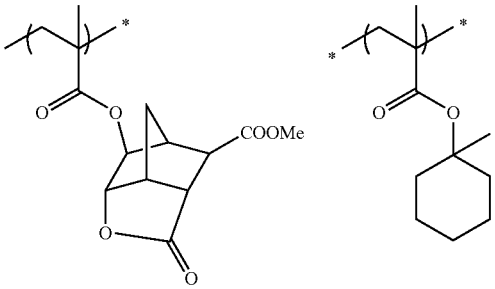

A-4

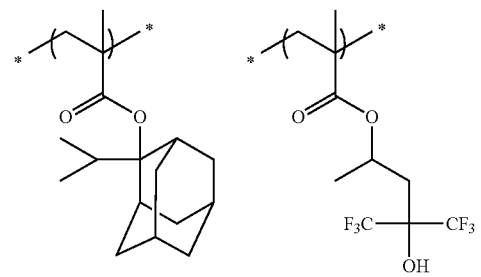

A-5

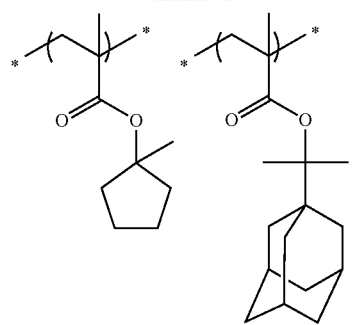
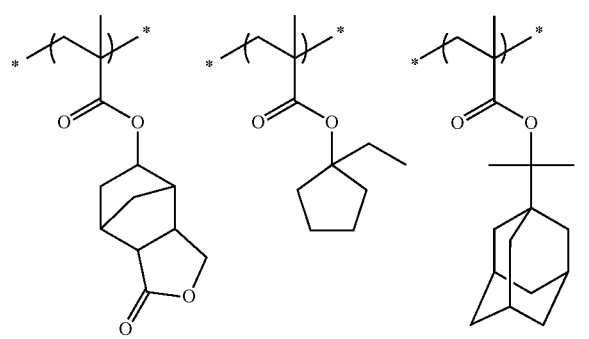
A-6
A-7
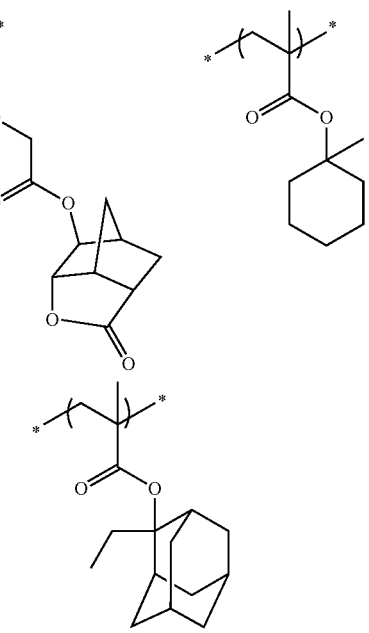
A-8
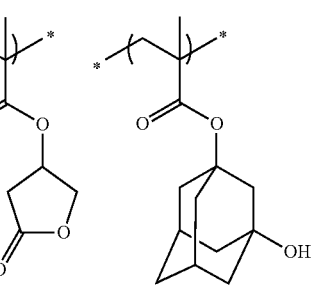
A-9
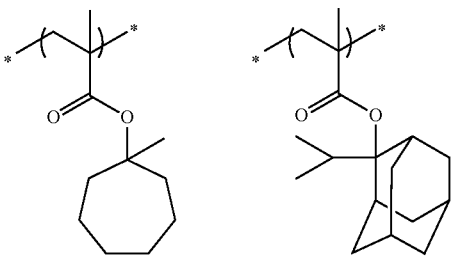
A-10
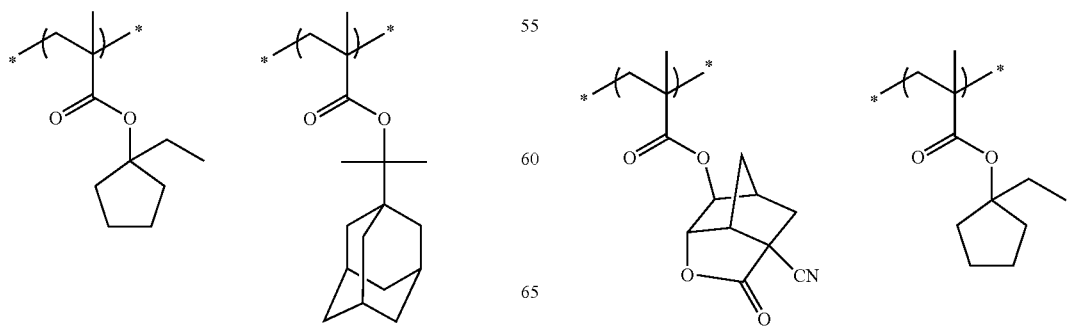

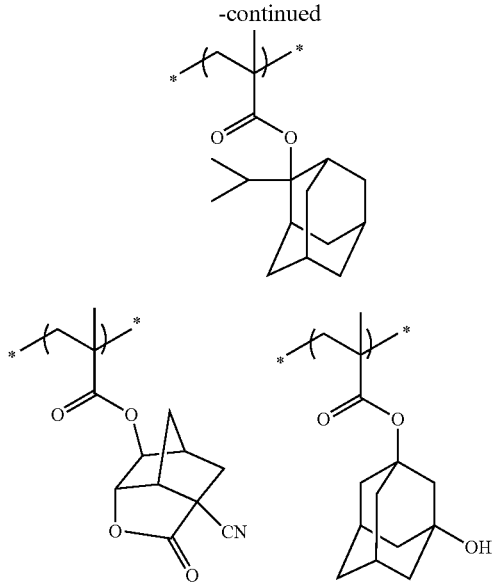
A-11
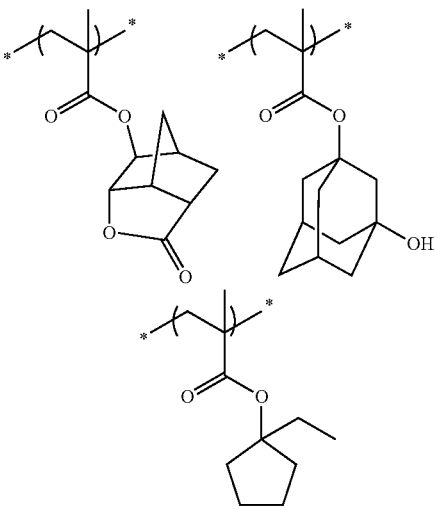
CA-1
A-12
TABLE 3
| Acid Decomposable Resin | Mw | Mw/Mn | Composition Ratios | | | |
|---|---|---|---|---|---|---|
| A-1 | 6200 | 1.66 | 40 | 10 | 40 | 10 |
| A-2 | 8100 | 1.77 | 45 | 40 | 15 | |
| A-3 | 10100 | 1.89 | 50 | 25 | 25 | |
| A-4 | 6100 | 1.49 | 40 | 20 | 30 | 10 |
| A-5 | 8500 | 1.71 | 35 | 15 | 30 | 20 |
| A-6 | 14800 | 1.56 | 40 | 50 | 10 | |
| A-7 | 11000 | 1.77 | 30 | 10 | 40 | 20 |
| A-8 | 6500 | 1.53 | 55 | 30 | 15 | |
| A-9 | 9500 | 1.88 | 40 | 10 | 30 | 20 |
| A-10 | 8600 | 1.72 | 50 | 15 | 35 | |
| A-11 | 9500 | 1.88 | 40 | 10 | 40 | 10 |
| A-12 | 8600 | 1.72 | 20 | 20 | 20 | 30 | 10 |
| CA-1 | 10500 | 1.79 | 40 | 10 | 50 | |
Photo-Acid Generator
As the photo-acid generator, compounds B1 to B12 which are represented by the following general formulae were used. The compounds are shown with the molecular amounts (Mw).
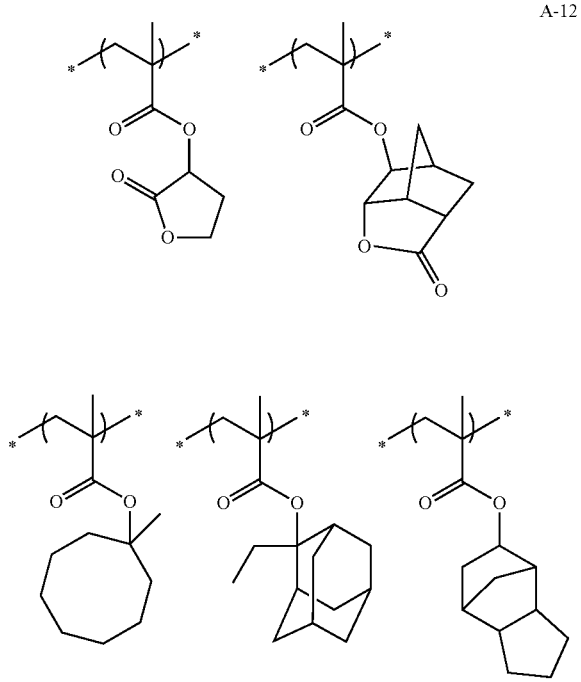
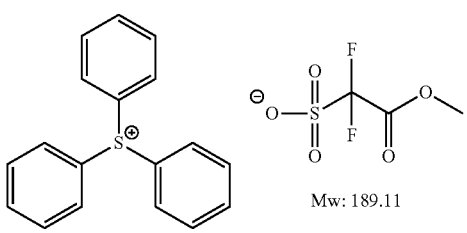
B1
Mw: 189.11
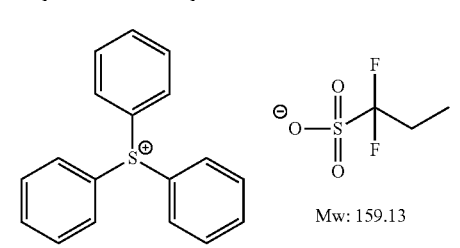
B2
Mw: 159.13

-continued
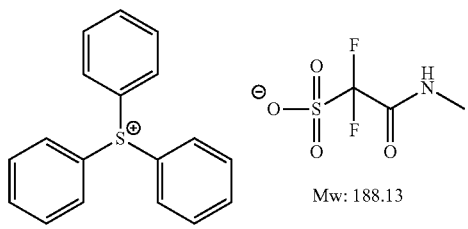
B3
Mw: 188.13
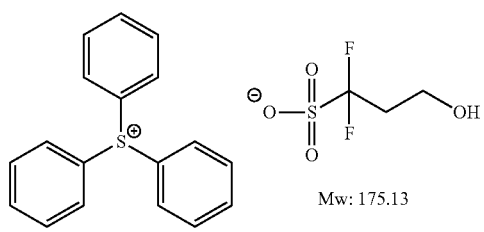
B4
Mw: 175.13
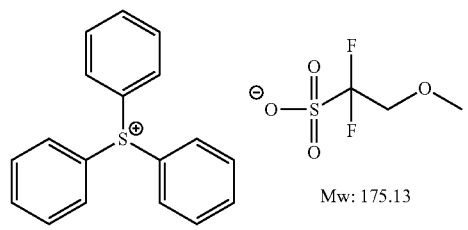
B5
Mw: 175.13
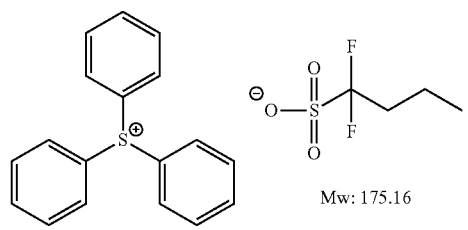
B6
Mw: 175.16
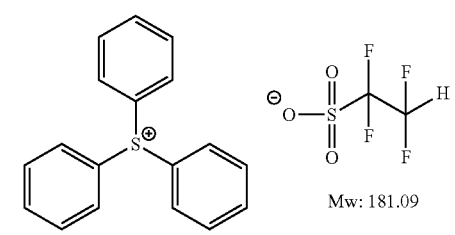
B7
Mw: 181.09
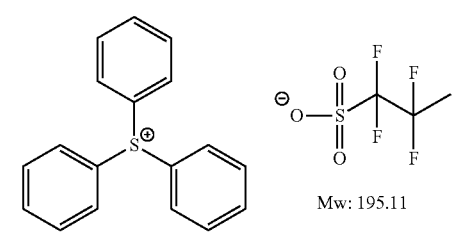
B8
Mw: 195.11
-continued
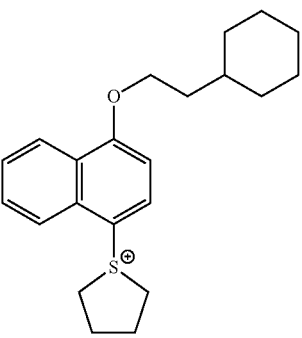
B9
Mw: 181.09
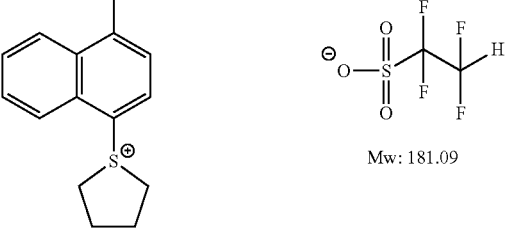
B10
Mw: 175.13
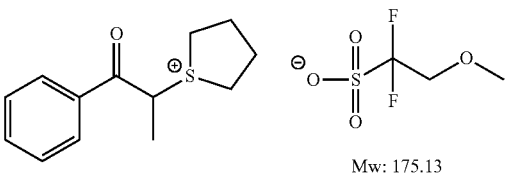
B11
Mw: 173.16
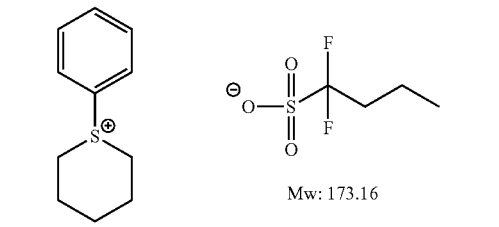
B12
Mw: 216.18
Nitrogen-Containing Compound
As the nitrogen-containing compound, compounds N1 to N6 which are represented by the following general formulae were used. The compounds are shown with the molecular weights.
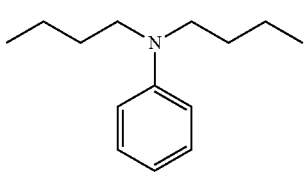
N1
Mw: 205.34

-continued

N2 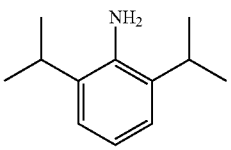
Mw: 177.29

N3 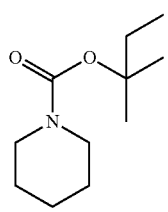
Mw: 199.29

N4 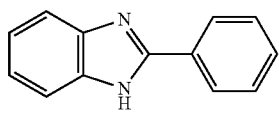
Mw: 194.23

N5 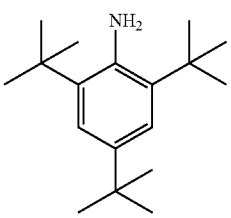
Mw: 261.45

N6 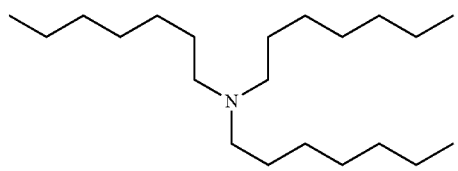
Mw: 311.59

Additive
As the additive, compounds (AD-1) and (AD-2) were used.

AD-1 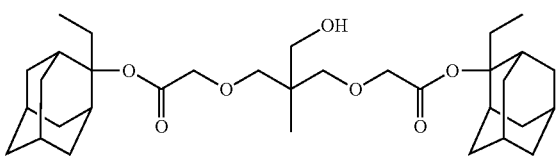

AD-2 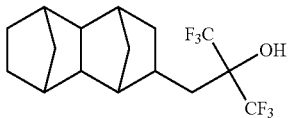

Surfactant
As the surfactant, W-1 to W-6 shown below were used.
W-1: Megafac F176 (manufactured by Dainippon Ink & Chemicals, Inc.) (fluorine-containing)
W-2: Megafac R08 (manufactured by Dainippon Ink & Chemicals, Inc.)
W-3: Polysiloxane Polymer KP-341 (manufactured by Shin-Etsu Chemical Co., Ltd.)
W-4: Troysol S-366 (manufactured by Troy Chemical Co., Ltd.)
W-5: KH-20 (manufactured by Asahi Kasei Corporation)
W-6: PolyFox (registered trademark) PF-6320 (manufactured by OMNOVA Solutions Inc.) (fluorine-based)

Solvent
As the solvent, SL-1 to SL-8 shown below were used.
(Group a)
SL-1: Propylene glycol monomethyl ether acetate
SL-2: Propylene glycol monomethyl ether propionate
SL-3: 2-heptanone
(Group b)
SL-4: Ethyl lactate
SL-5: Propylene glycol monomethyl ether
SL-6: Cyclohexanone
(Group c)
SL-7: γ-Butyrolactone
SL-8: Propylene carbonate <Preparation of Actinic Ray-Sensitive or Radiation-Sensitive Resin Composition>

The components shown in the table below were dissolved in the solvent shown in the table below, a solution with a solid content concentration of 6.6 mass % was prepared for each, these were filtered using a polyethylene filter with a pore size of 0.1 μm, and actinic ray-sensitive or radiation-sensitive resin compositions (positive type photo-sensitive resin compositions) were prepared. The prepared positive type photo-sensitive resin compositions were evaluated using the method described below and the results are shown in the same table.

Resist Evaluation

The positive type photo-sensitive resin composition which has been prepared was coated on a substrate of a silicon wafer with an oxide film coating (8 inch diameter, an $SiO_2$ film thickness of 100 nm), baking for 60 seconds at 110° C. was performed, and a resist film with a film thickness of 250 nm was formed. The obtained resist film was exposed via a 6% halftone mask with a 75 nm 1:1 line and space pattern using an ArF excimer laser scanner (PAS5500/1100 manufactured by ASML, NA 0.75). After this, heating on a hot plate for 60 seconds at 110° C. was performed. Furthermore, after developing for 60 seconds at 23° C. using an aqueous solution of tetramethylammonium hydroxide with a concentration of 2.38 mass %, rinsing with pure water for 40 seconds, and drying, a resist pattern was obtained.

Pattern Formation

A profile of a 7.5 nm 1:1 line and space pattern was observed using a cross-section SEM and a two stage evaluation which is described below was performed.

A: In the case of being a rectangle
B: In the case of being tapered or a T-Top shape

[Depth of Focus (DOF)]

With regard to the 75 nm line pattern (line:space=1:1), the permitted width of focus variation was obtained and the common focus variation width (μm) which can be permitted for all cases was obtained.

TABLE 4

| | Acid Decomposable Resin | | Acid Generator | | Nitrogen-Containing Compound | | Additive | | Surfactant | | Solvent | | Performance Evaluation | |
|---|---|---|---|---|---|---|---|---|---|---|---|---|---|---|
| | Resin | Parts by Mass | Acid Initiator | Parts by Mass | Nitrogen-Containing Compound | Parts by Mass | Additive | Parts by Mass | Surfactant | Parts by Mass | Solvent | Parts by Mass | Pattern Formation | DOF (μm) |
| Example 1 | A-1 | 96.7 | B1 | 2.5 | N1 | 0.3 | | | W-1 | 0.50 | SL-1/SL-5/SL-7 | 495/900/20 | A | 0.70 |
| Example 2 | A-2 | 94.9 | B2/B10 | 1.5/2.0 | N1/N2 | 0.4/0.2 | | | W-6 | 1.00 | SL-1/SL-5/SL-7 | 645/700/70 | A | 0.70 |
| Example 3 | A-3/CA-1 | 73.3/20.0 | B3/B11 | 1.3/4.0 | N2 | 0.4 | | | W-2 | 1.00 | SL-1/SL-6 | 815/600 | A | 0.70 |
| Example 4 | A-4 | 95.2 | B4/B9 | 1.5/1.5 | N2 | 0.3 | AD-1 | 1.0 | W-5 | 0.50 | SL-1/SL-4/SL-7 | 915/400/100 | A | 0.70 |
| Example 5 | A-5 | 96.5 | B5 | 3.0 | N3 | 0.5 | | | | | SL-1/SL-3/SL-8 | 995/400/20 | A | 0.70 |
| Example 6 | A-6 | 95.2 | B6 | 3.5 | N3/N1 | 0.2/0.1 | | | W-6 | 1.00 | SL-6/SL-1 | 765/650 | A | 0.70 |
| Example 7 | A-7 | 96.9 | B7 | 2.7 | N4 | 0.4 | | | | | SL-1/SL-4 | 915/500 | A | 0.70 |
| Example 8 | A-8 | 89.4 | B8/B11 | 1.0/7.0 | N4 | 0.6 | AD-2 | 1.0 | W-3 | 1.00 | SL-2/SL-6/SL-8 | 953/442/20 | A | 0.70 |
| Example 9 | A-9 | 92.5 | B9 | 6.5 | N5 | 1.0 | | | | | SL-1/SL-3/SL-7 | 715/600/100 | A | 0.50 |
| Example 10 | A-10 | 94.2 | B4 | 4.0 | N6 | 0.8 | | | W-4 | 1.00 | SL-1/SL-5/SL-8 | 565/800/50 | A | 0.50 |
| Example 11 | A-11/A-6 | 67.6/30.0 | B5 | 2.0 | N1/N4 | 0.2/0.2 | | | | | SL-1/SL-3/SL-7 | 715/600/100 | A | 0.70 |
| Example 12 | A-12 | 95.1 | B6/B2 | 2.0/1.5 | N2 | 0.4 | | | W-4 | 1.00 | SL-1/SL-5/SL-8 | 565/800/50 | A | 0.70 |
| Example 13 | A-1 | 96.7 | B1 | 2.5 | N5 | 0.3 | | | W-1 | 0.50 | SL-1/SL-5/SL-7 | 495/900/20 | A | 0.50 |
| Example 14 | A-1 | 96.7 | B2 | 2.5 | N1 | 0.3 | | | W-1 | 0.50 | SL-1/SL-5/SL-7 | 495/900/20 | A | 0.80 |
| Example 15 | A-6 | 95.2 | B8 | 3.5 | N3/N1 | 0.2/0.1 | | | W-6 | 1.00 | SL-6/SL-1 | 765/650 | A | 0.60 |
| Example 16 | A-6 | 95.2 | B6 | 3.5 | N6/N1 | 0.2/0.1 | | | W-6 | 1.00 | SL-6/SL-1 | 765/650 | A | 0.55 |
| Comparative Example 1 | CA-1 | 94.5 | B1 | 4.0 | N5 | 0.5 | | | W-2 | 1.00 | SL-1/SL-6 | 815/600 | B | 0.40 |
| Comparative Example 2 | A-1 | 94.0 | B12 | 5.0 | N5 | 0.5 | | | W-1 | 0.50 | SL-1/SL-5 | 1015/400 | B | 0.40 |

From the evaluation results described above, it is understood that the actinic ray-sensitive or radiation-sensitive resin composition of the present invention is superior in terms of pattern shape and DOF performance even in cases of forming a pattern where a high reflection substrate is used as it is without a reflection prevention film being used, and can be applied to implantation.

This application claims priority under 35 U.S.C. §119 of Japanese Patent application JP 2011-159325, filed on Jul. 20, 2011, the entire contents of which are hereby incorporated by reference.

What is claimed is:

1. An actinic ray-sensitive or radiation-sensitive resin composition comprising:

a resin (A) which contains at least one type of repeating unit represented by the general formula (PG1), at least one type of repeating unit selected from the repeating units which are represented by the general formula (PG2) and the general formula (PG3), and at least one type of repeating unit including a lactone structure;

a compound (B) represented by the general formula (B1) wherein the molecular weight of an anion moiety is 180 or less; and a solvent (C),

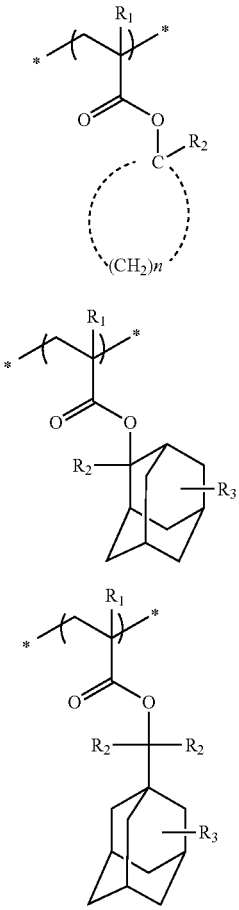

wherein, in the general formula (PG1), $R_1$ represents a hydrogen atom or an alkyl group which may have a substituent, $R_2$ represents an alkyl group, and n represents an integer of 4 to 7, in the general formula (PG2), $R_1$ represents a hydrogen atom or an alkyl group which may have a substituent, $R_2$ represents an alkyl group or a cycloalkyl group, and $R_3$ represents a hydrogen atom or an alkyl group which may have a substituent, and in the general formula (PG3), $R_1$ represents a hydrogen atom or an alkyl group which may have a substituent, $R_2$ each independently represent an alkyl group or a cycloalkyl group, and $R_3$ represents a hydrogen atom or an alkyl group which may have a substituent,

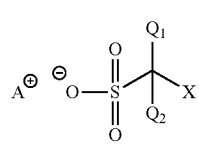

wherein, in the general formula,
$A^+$ represents a sulfonium cation or an iodonium cation,
$Q_1$ and $Q_2$ each independently represent a fluorine atom or $CF_3$, and
X represents a hydrocarbon group where the number of carbon atom is 1 to 4.

2. The composition according to claim 1, wherein the compound (B) is represented by the general formula (B2),

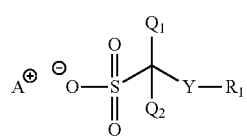

wherein,
$A^+$ represents a sulfonium cation or an iodonium cation,
$Q_1$ and $Q_2$ each independently represent a fluorine atom,
Y represents a methylene group,
$R_1$ represents a hydrogen atom or an alkyl group, and
the number of carbon atoms which are included in the group represented by $—Y—R_1$ is 1 to 2.

3. The composition according to claim 1, wherein the total solid concentration in the composition is 6 mass % or more.

4. The composition according to claim 1, wherein n in the general formula (PG1) is 4.

5. The composition according to claim 1, wherein n in the general formula (PG1) is 5.

6. The composition according to claim 1, wherein the repeating unit including a lactone structure, which is contained in the resin (A), is represented by the general formula (III):

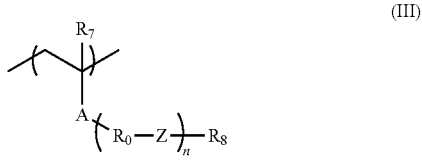

wherein, in general formula (III), A represents an ester bond (a group represented by —COO—) or an amide bond (a group represented by —CONH—),
$R_0$ represents an alkylene group, a cycloalkylene group, or a combination thereof, in a case of a plurality thereof, $R_0$ each independently represent an alkylene group, a cycloalkylene group, or a combination thereof,
Z represents an ether bond, an ester bond, an amide bond, a urethane bond, or a urea bond, in a case of a plurality thereof, Z each independently represent an ether bond, an ester bond, an amide bond, a urethane bond, or a urea bond,
$R_8$ represents a monovalent organic group with a lactone structure,
n represents an integer of 1 to 5 which is the number of repeating structures represented by $—R_0—Z—$, and
$R_7$ represents a hydrogen atom, a halogen atom, or an alkyl group.

7. The composition according to claim 1, further comprising:
a low-molecular-weight compound which has a structure represented by the general formula (A), has a group which is desorbed due to the action of an acid, and where the basicity increases due to the desorption,

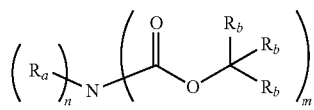

wherein, in the general formula (A), Ra represents a hydrogen atom, an alkyl group, a cycloalkyl group, an aryl group, or an aralkyl group, in a case of a plurality thereof, Ra each independently represent a hydrogen atom, an alkyl group, cycloalkyl group, aryl group, or an aralkyl group, Rb each independently represent a hydrogen atom, an alkyl group, a cycloalkyl group, an aryl group, an aralkyl group, or an alkoxyalkyl group, and, in —C(Rb)(Rb)(Rb), when one or more Rb is a hydrogen atom, at least one of the remaining Rb is a cyclopropyl group, a 1-alkoxyalkyl group, or an aryl group, n represents an integer of 0 to 2, m represents an integer of 1 to 3, and n+m=3.

8. The composition according to claim 1, further comprising:
2 or more types of the compound (B).

9. The composition according to claim 1, further comprising:
an acid generator other than the compound (B).

10. The composition according to claim 1, further comprising:
0.01 to 10 mass % of a hydrophobic resin having at least any of a fluorine atom and a silicon atom in terms of solid content of the composition.

11. The composition according to claim 10, wherein the hydrophobic resin has an acid group.

12. The composition according to claim 10, wherein the hydrophobic resin has at least one selected from the group consisting of a group with a lactone structure, an acid anhydride group, and an acid imide group.

13. The composition according to claim 10, wherein the hydrophobic resin has a group which can be decomposed due to the action of an acid.

14. An actinic ray-sensitive or radiation-sensitive film which is formed using the composition according to claim 1.

15. The composition according to claim 1, wherein the anion moiety of the compound (B) represented by the general formula (B1) is at least one of the following structures

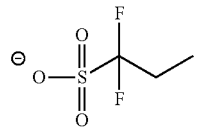 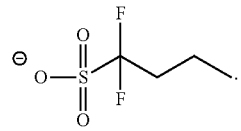

16. The composition according to claim 1, wherein the content of the repeating unit which is represented by the general formula (PG1) included in the resin (A) is 30 to 60 mol %, and the total content of the repeating units which are represented by the general formula (PG2) and the general formula (PG3) included in the resin (A) is 10 to 30 mol %.

17. A pattern forming method, comprising:
forming a film comprising the composition according to claim 1;
exposing the film, and
developing the exposed film.

18. The pattern forming method according to claim 17, wherein the exposing is immersion exposure.

19. The pattern forming method according to claim 17, wherein the film has a thickness of 100 to 260 nm.

* * * * *